US011081810B2

(12) United States Patent
Misaki

(10) Patent No.: US 11,081,810 B2
(45) Date of Patent: Aug. 3, 2021

(54) TFT SUBSTRATE AND SCANNED ANTENNA HAVING TFT SUBSTRATE

(71) Applicant: SHARP KABUSHIKI KAISHA, Sakai (JP)

(72) Inventor: Katsunori Misaki, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 286 days.

(21) Appl. No.: 16/145,125

(22) Filed: Sep. 27, 2018

(65) Prior Publication Data

US 2019/0123455 A1 Apr. 25, 2019

(30) Foreign Application Priority Data

Sep. 27, 2017 (JP) .............................. JP2017-186095

(51) Int. Cl.
| | |
|---|---|
| H01L 23/66 | (2006.01) |
| H01Q 21/22 | (2006.01) |
| H01P 1/18 | (2006.01) |
| H01Q 3/36 | (2006.01) |
| H01Q 1/38 | (2006.01) |
| H01L 27/13 | (2006.01) |
| H01Q 21/06 | (2006.01) |
| H01L 27/12 | (2006.01) |

(52) U.S. Cl.
CPC .............. *H01Q 21/22* (2013.01); *H01L 23/66* (2013.01); *H01L 27/1248* (2013.01); *H01L 27/13* (2013.01); *H01P 1/181* (2013.01); *H01Q 1/38* (2013.01); *H01Q 3/36* (2013.01); *H01Q 21/064* (2013.01); *H01L 2223/6677* (2013.01)

(58) Field of Classification Search
CPC ............ H01Q 1/22; H01Q 3/44; H01Q 13/22; H01Q 15/14; H01Q 19/06–19/10; H01Q 21/0087; H01Q 21/06; H01L 27/124; H01L 2223/6677; H01L 23/66; H01L 29/786; H01L 27/13; G02F 1/1339–1343
See application file for complete search history.

(56) References Cited

U.S. PATENT DOCUMENTS

| | | |
|---|---|---|
| 7,466,269 B2 | 12/2008 | Haziza |
| 7,847,894 B2 | 12/2010 | Rho |
| (Continued) | | |

FOREIGN PATENT DOCUMENTS

| | | |
|---|---|---|
| CN | 101583901 A | 11/2009 |
| CN | 104252072 A | 12/2014 |
| (Continued) | | |

OTHER PUBLICATIONS

Co-pending letter regarding a related co-pending U.S. Appl. No. 16/323,395, filed Feb. 5, 2019.

(Continued)

*Primary Examiner* — Hasan Islam
(74) *Attorney, Agent, or Firm* — ScienBiziP, P.C.

(57) ABSTRACT

A TFT substrate includes a dielectric substrate, a plurality of antenna element regions provided on the dielectric substrate, each antenna element region including a TFT and a patch electrode electrically connected to a drain electrode of the TFT, and a flattening layer provided on the dielectric substrate, located above a layer including the patch electrode, and formed of a resin.

18 Claims, 35 Drawing Sheets

(56) References Cited

U.S. PATENT DOCUMENTS

| | | | |
|---|---|---|---|
| 2005/0184927 A1* | 8/2005 | Kwak | H01L 27/3276 345/45 |
| 2008/0224140 A1* | 9/2008 | Tokunaga | H01L 27/1214 257/57 |
| 2010/0097553 A1 | 4/2010 | Shoraku et al. | |
| 2012/0092577 A1 | 4/2012 | Shi et al. | |
| 2012/0138922 A1 | 6/2012 | Yamazaki et al. | |
| 2012/0194399 A1 | 8/2012 | Bily et al. | |
| 2013/0320334 A1 | 12/2013 | Yamazaki et al. | |
| 2014/0286076 A1 | 9/2014 | Aoki et al. | |
| 2015/0002798 A1 | 1/2015 | Miyakawa et al. | |
| 2016/0029502 A1* | 1/2016 | Lee | H01L 51/5246 361/748 |
| 2018/0337446 A1 | 11/2018 | Nakazawa et al. | |

FOREIGN PATENT DOCUMENTS

| | | |
|---|---|---|
| CN | 107210534 A | 9/2017 |
| JP | 2002-217640 A | 8/2002 |
| JP | 2007-116573 A | 5/2007 |
| JP | 2007-295044 A | 11/2007 |
| JP | 2009-538565 A | 11/2009 |
| JP | 2012-134475 A | 7/2012 |
| JP | 2013-539949 A | 10/2013 |
| JP | 2014-007399 A | 1/2014 |
| JP | 2014-209727 A | 11/2014 |
| WO | 2007/139736 A2 | 12/2007 |
| WO | 2012/050614 A1 | 4/2012 |
| WO | 2014/149341 A1 | 9/2014 |
| WO | 2015/126550 A1 | 8/2015 |
| WO | 2015/126578 A1 | 8/2015 |
| WO | 2016/057539 A1 | 4/2016 |
| WO | 2016/130383 A1 | 8/2016 |
| WO | 2016/141340 A1 | 9/2016 |
| WO | 2016/141342 A1 | 9/2016 |
| WO | 2017/061527 A1 | 4/2017 |

OTHER PUBLICATIONS

R. A. Stevenson et al., "Rethinking Wireless Communications: Advanced Antenna Design using LCD Technology", SID 2015 Digest, pp. 827-830.

M. Ando et al., "A Radial Line Slot Antenna for 12GHz Satellite TV Reception", IEEE Transactions on Antennas and Propagation, vol. AP-33, No. 12, pp. 1347-1353 (1985).

M. Wittek et al., "Liquid Crystals for Smart Antennas and Other Microwave Applications", SID 2015 Digestpp. 824-826.

Kuki, "New Functional Element Using Liquid Crystal" Polymer, vol. 55, August issue, pp. 599-602 (2006) (A concise explanation of the relevance can be found in paragraph [0076] of the specification of the subject application).

Co-pending letter regarding a related co-pending U.S. Appl. No. 15/542,488, filed Jul. 10, 2017.

* cited by examiner

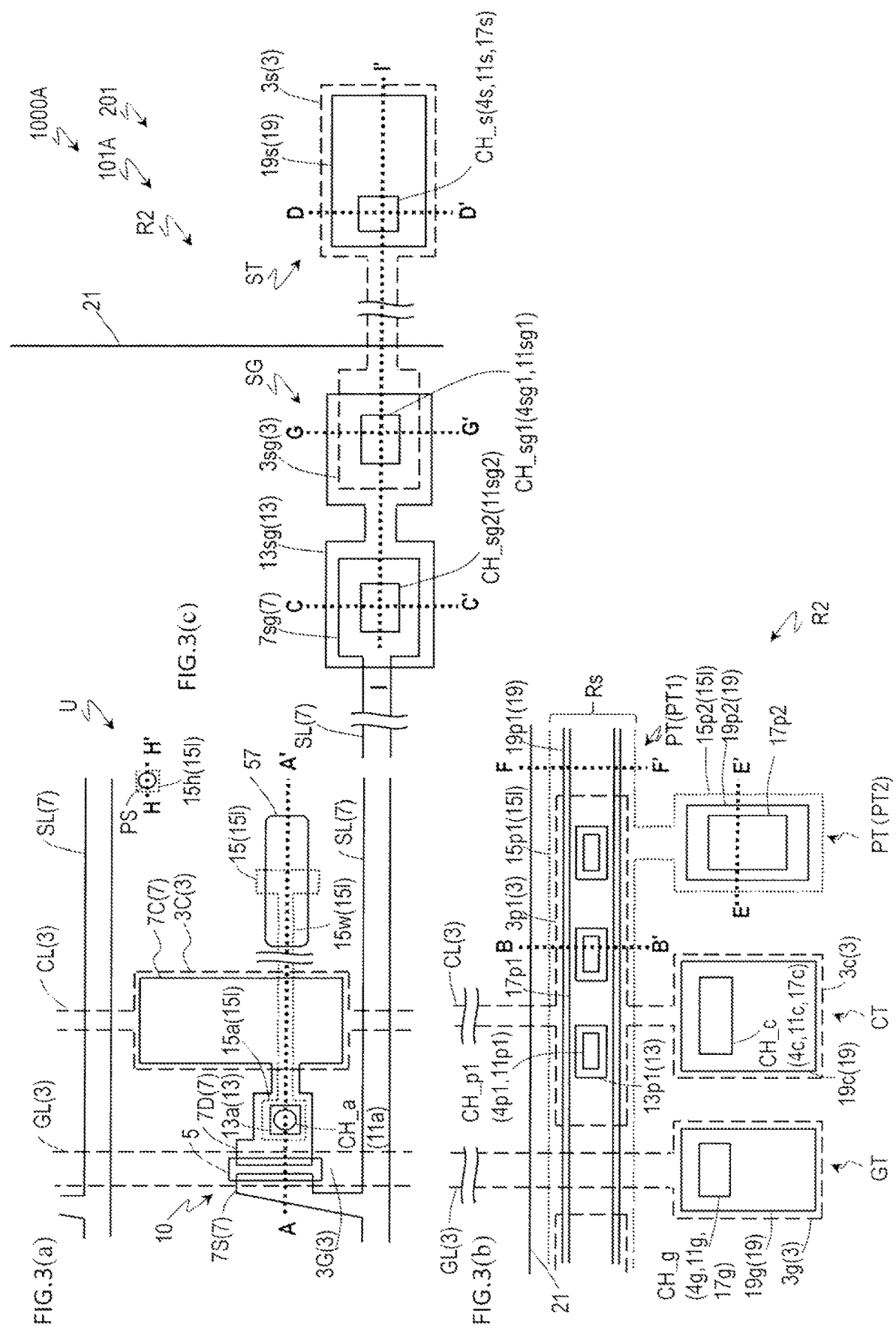

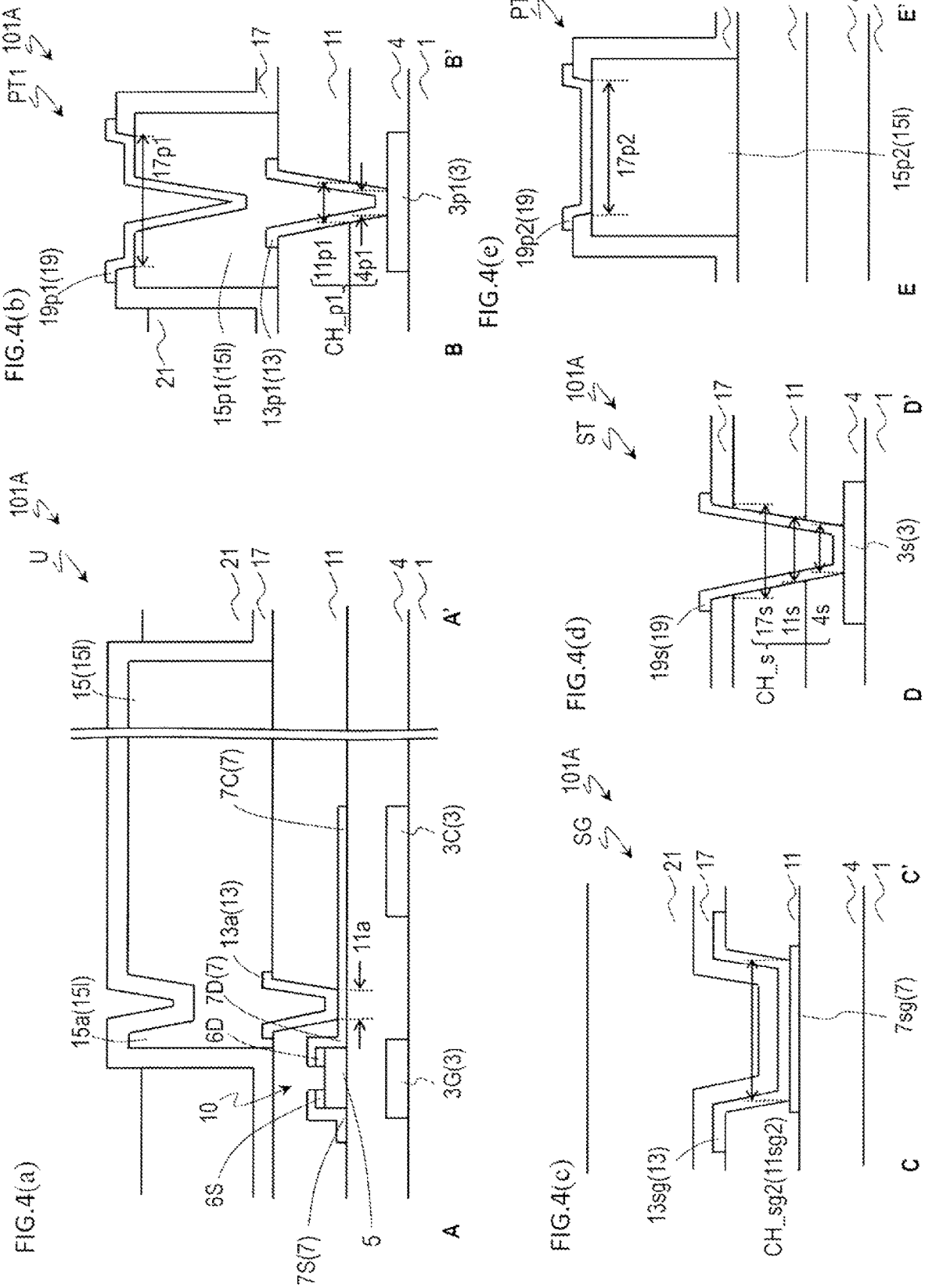

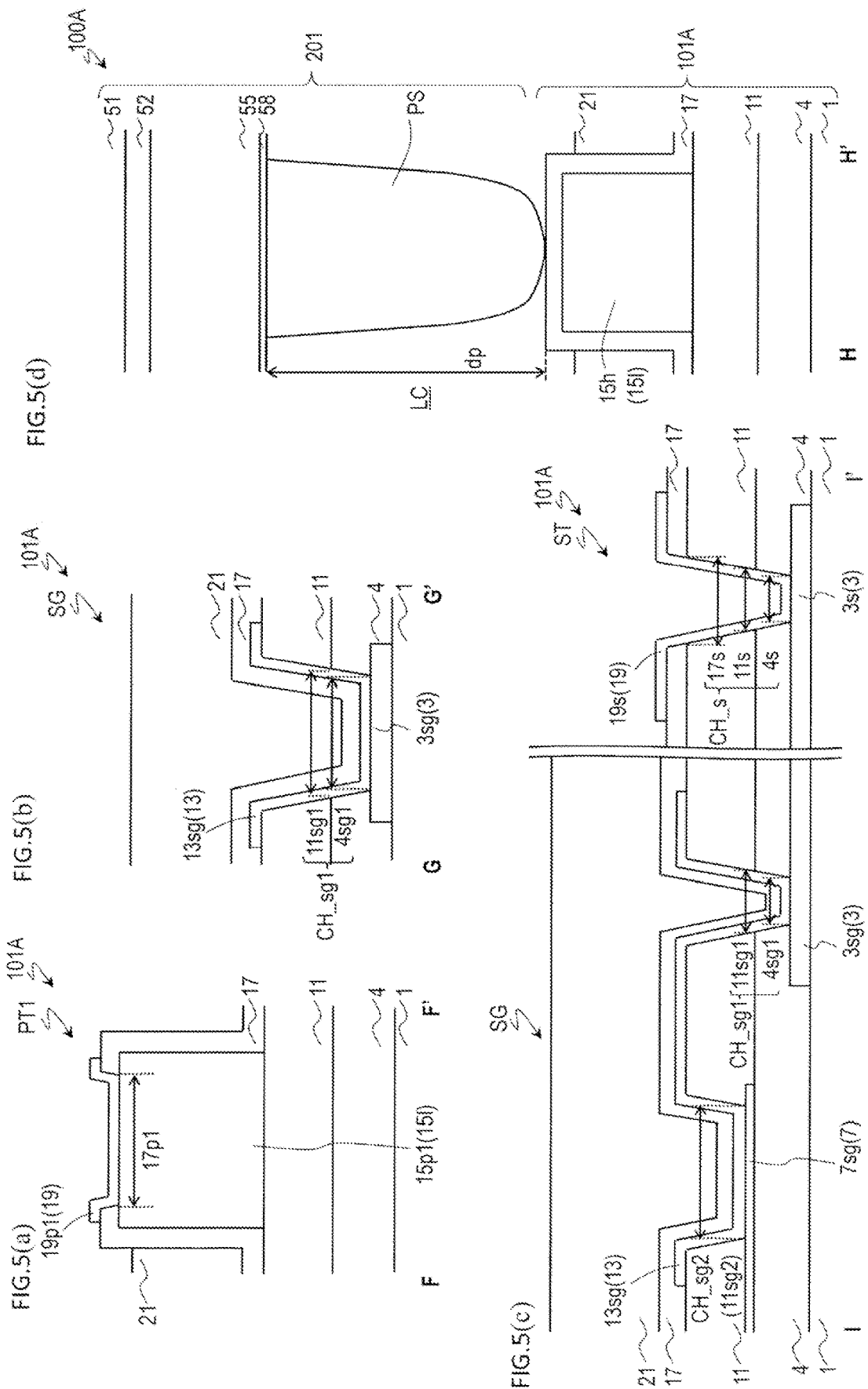

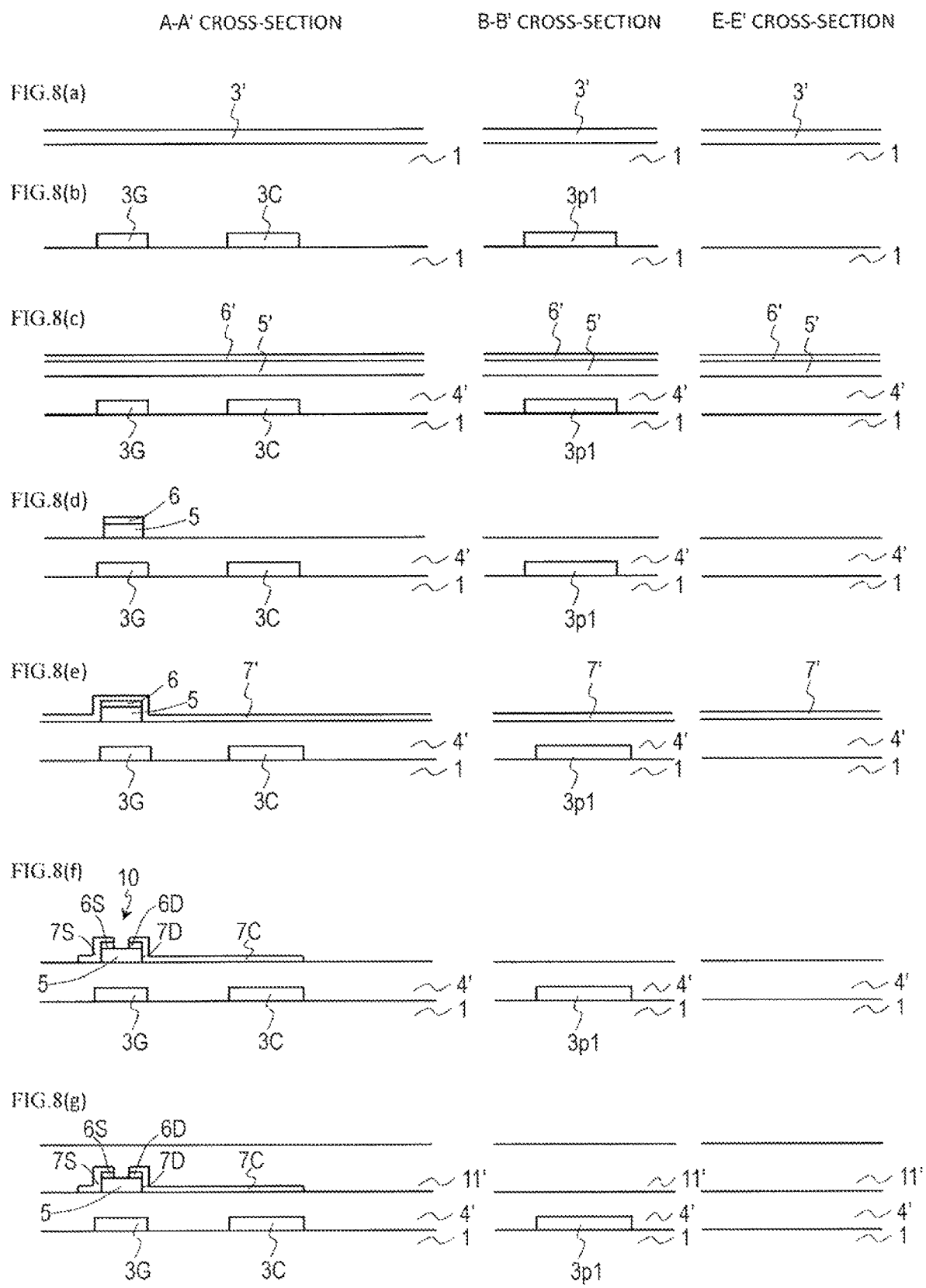

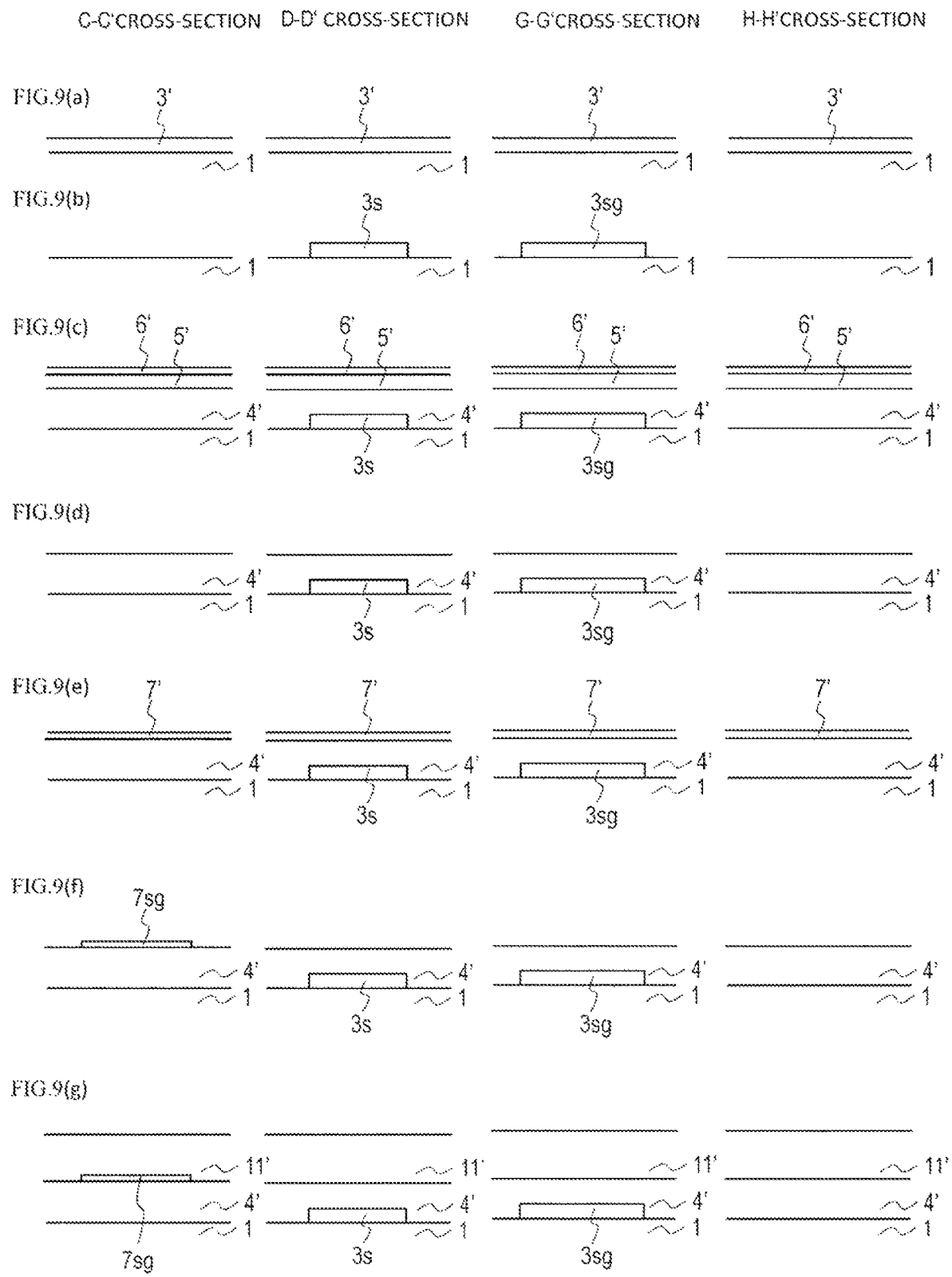

A-A'CROSS-SECTION  B-B'CROSS-SECTION  E-E'CROSS-SECTION
FIG.10(a)
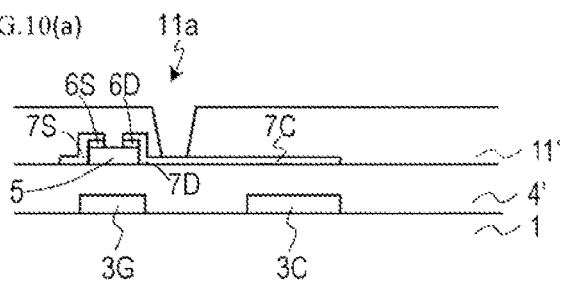 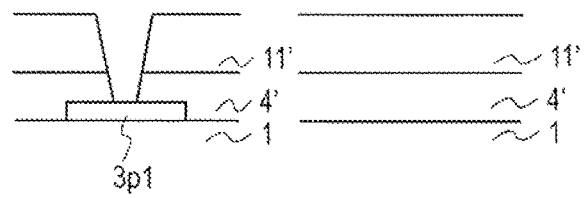
FIG.10(b)
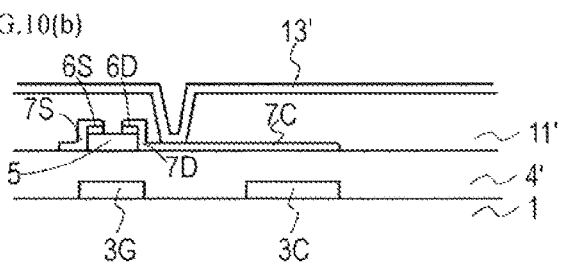 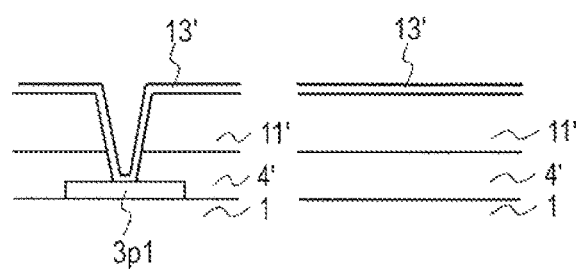
FIG.10(c)
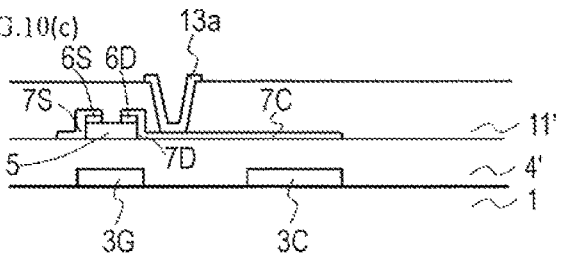 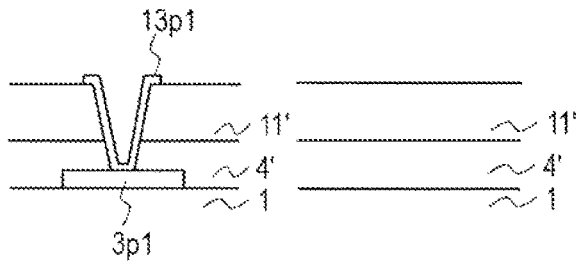
FIG.10(d)
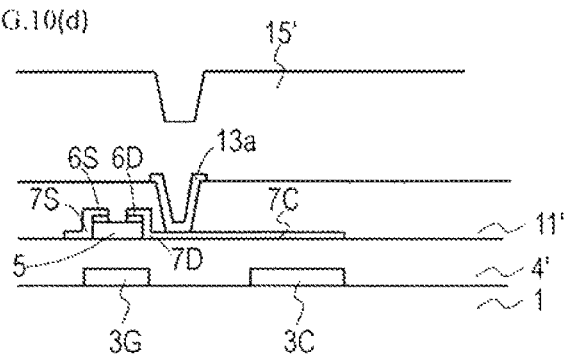 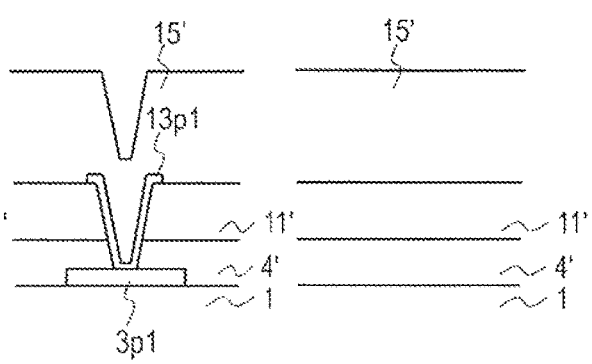

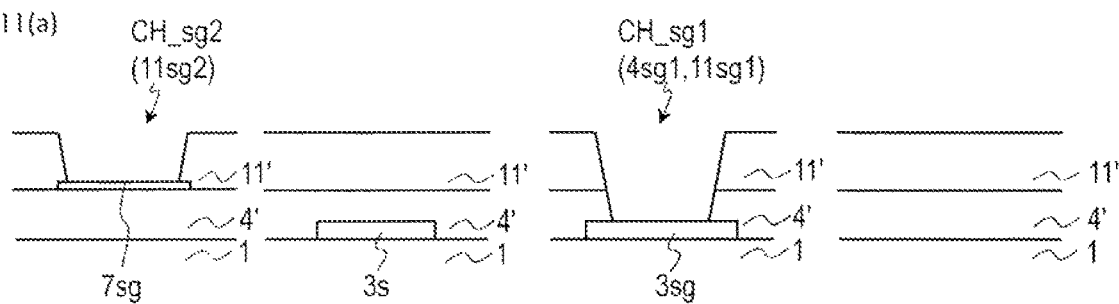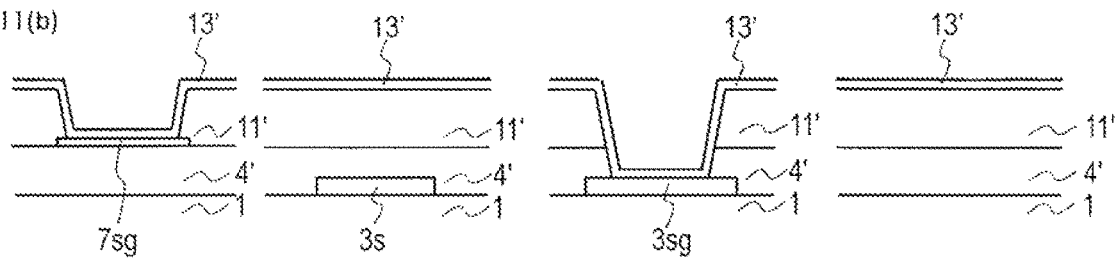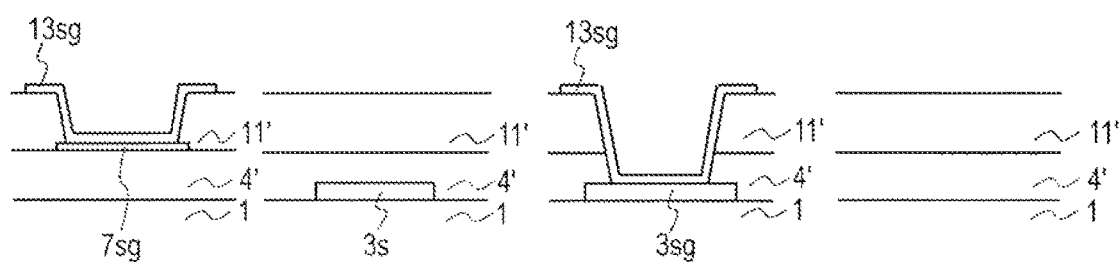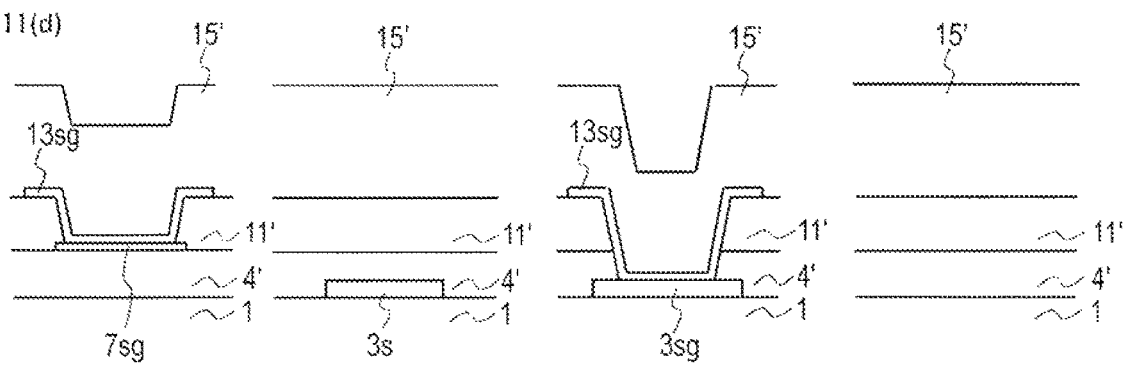

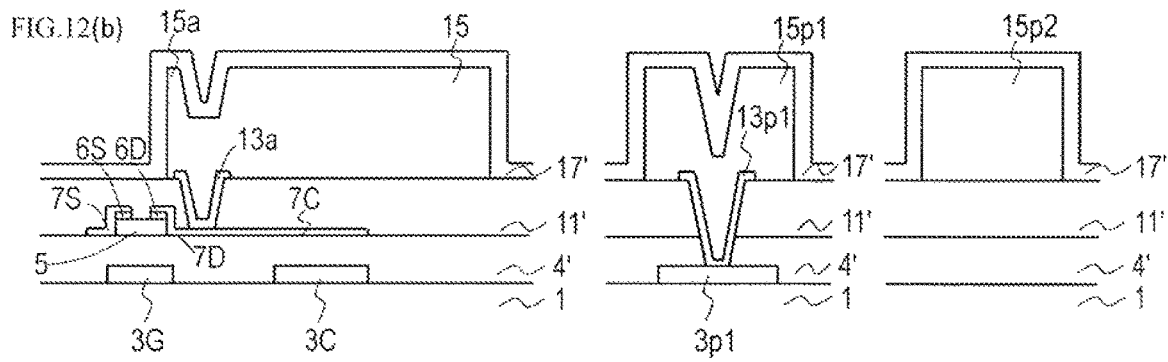
FIG.12(a)
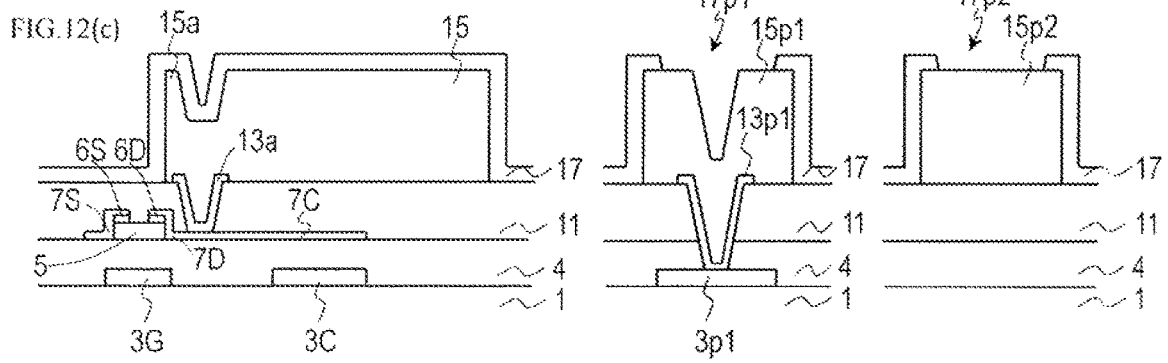
FIG.12(b)
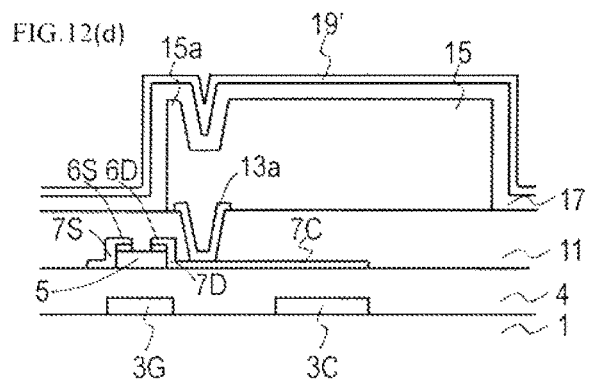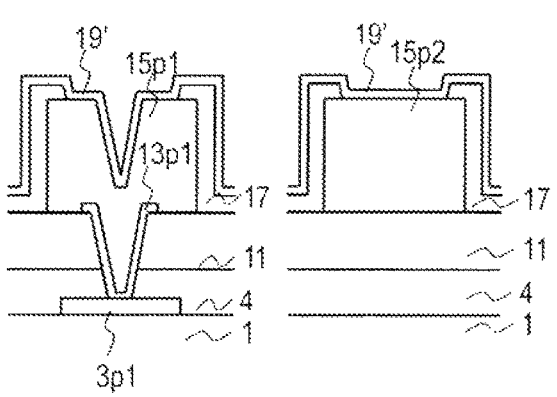
FIG.12(c)
FIG.12(d)

| C-C' CROSS-SECTION | D-D' CROSS-SECTION | G-G' CROSS-SECTION | H-H' CROSS-SECTION |

A-A'CROSS-SECTION    B-B'CROSS-SECTION    E-E'CROSS-SECTION
FIG.14(a)
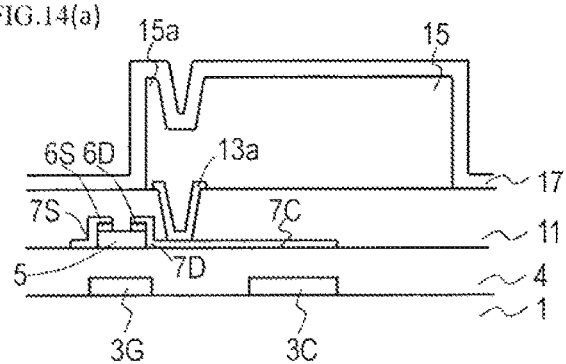 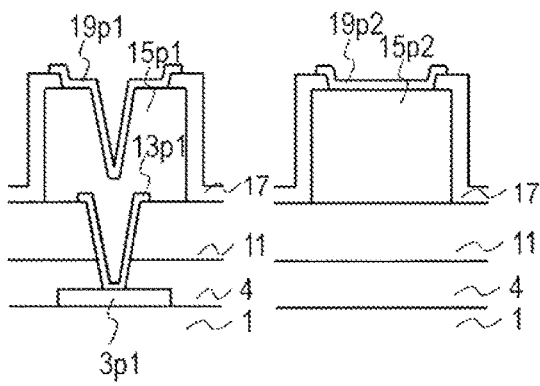
FIG.14(b)
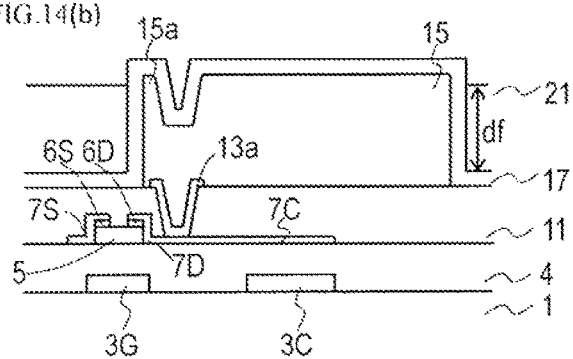 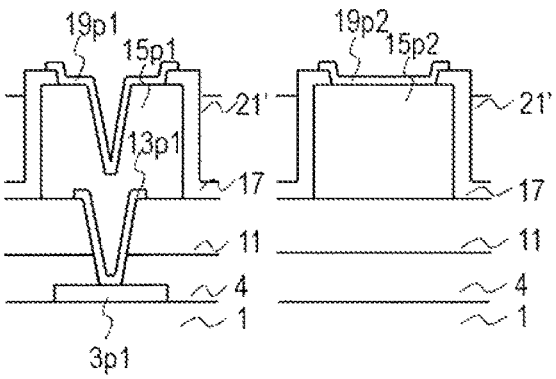
FIG.14(c)
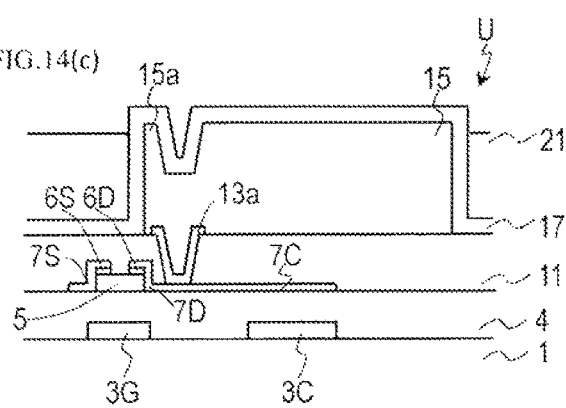 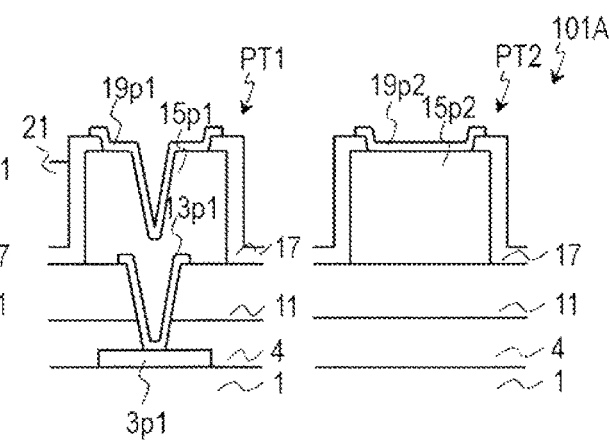

A-A'CROSS-SECTION　　B-B'CROSS-SECTION　　E-E'CROSS-SECTION

| C-C'CROSS-SECTION | D-D'CROSS-SECTION | G-G'CROSS-SECTION | H-H'CROSS-SECTION |

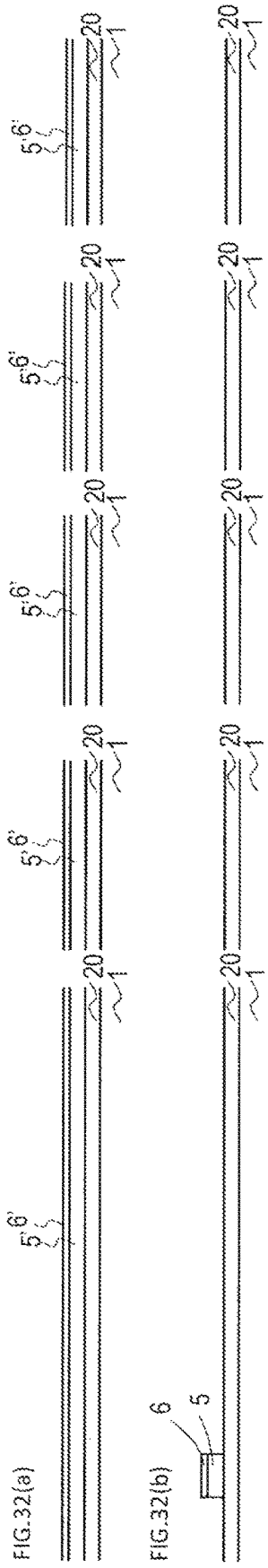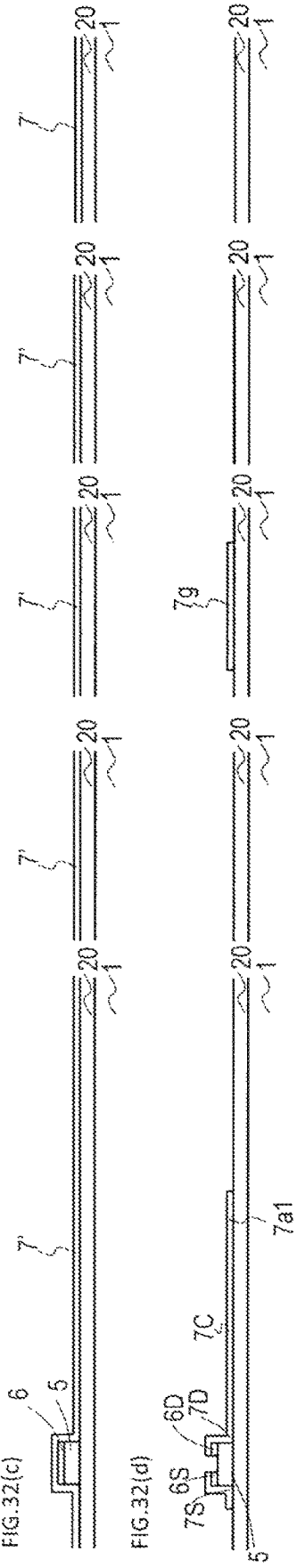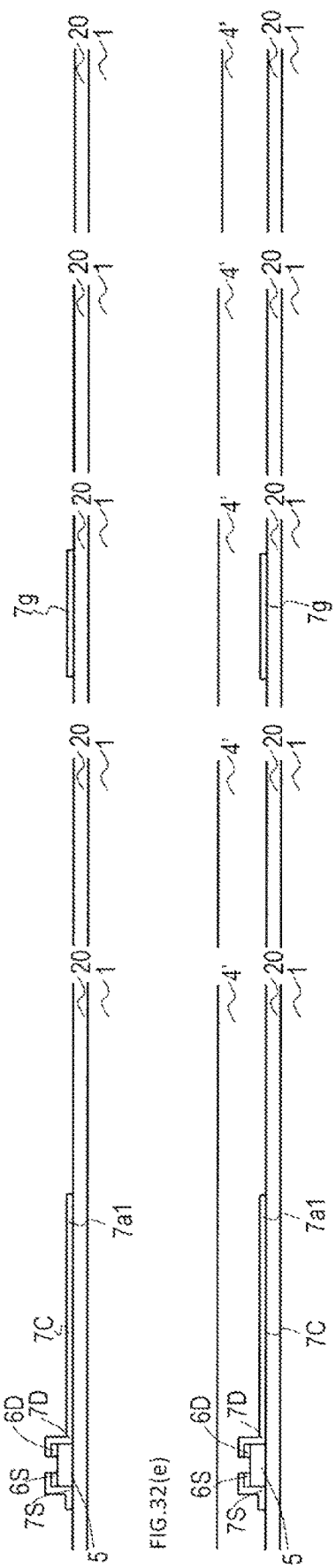

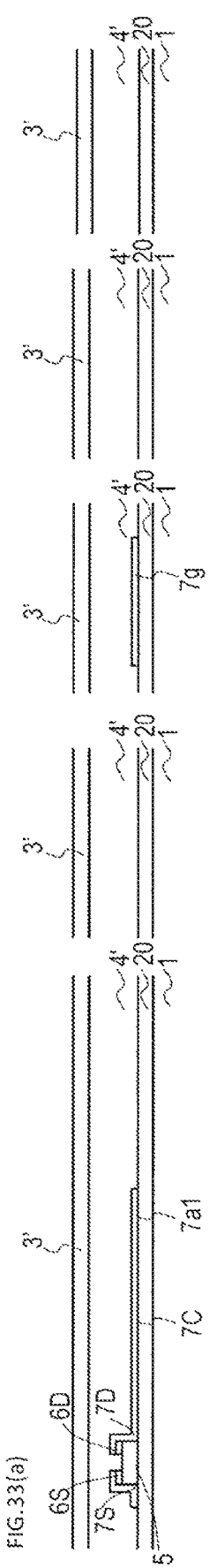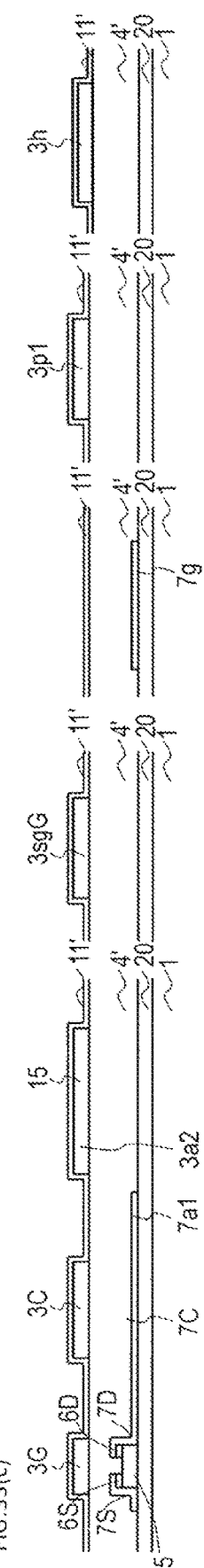
FIG.33

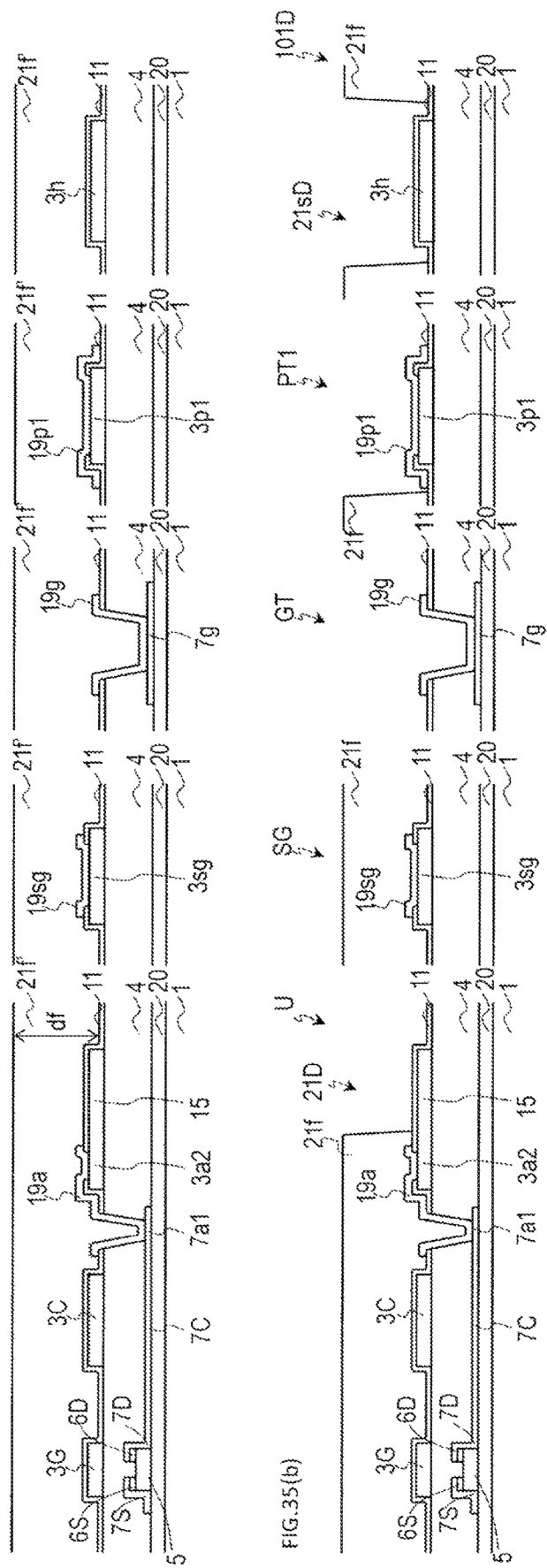

TFT SUBSTRATE AND SCANNED ANTENNA HAVING TFT SUBSTRATE

BACKGROUND

1. Technical Field

The present invention relates to scanned antennas. More specifically, the present invention relates to a scanned antenna that includes antenna elements (also referred to as "element antennas") each including a liquid crystal capacitor (such a scanned antenna is also referred to as a "liquid crystal array antenna"), and a TFT substrate for use in such a scanned antenna.

2. Description of the Related Art

Antennas for mobile communication and satellite broadcasting need to have the capability to change the direction of a beam (called "beam scanning" or "beam steering"). As am antenna having such a capability (hereinafter referred to as a "scanned antenna"), a phased array antenna, which includes antenna elements, is known in the art. However, conventional phased array antennas cost much, which is an obstacle to their widespread application to consumer products. In particular, the cost increases significantly with an increase in the number of antenna elements.

In view of this, scanned antennas have been proposed in the art that utilize the high dielectric anisotropy (birefringence) of liquid crystal materials (including nematic liquid crystals and polymer-dispersed liquid crystals) (Patent Document Nos. 1 to 5 (Japanese Laid-Open Patent Publication No. 2007-116573, Japanese Laid-Open Patent Publication No. 2007-295044, Japanese National Phase PCT Laid-open Publication No. 2009-538565, Japanese National Phase PCT Laid-Open Publication No. 2013-539949, and International Publication WO2015/126550) and Non-Patent Document No. 1 (R. A. Stevenson et al., "Rethinking Wireless Communications: Advanced Antenna Design using LCD Technology," SID 2015 DIGEST, pp. 827-830)). The dielectric constant of the liquid crystal material has a frequency dispersion, and therefore, the dielectric constant of the liquid crystal material in the microwave frequency band (also referred to as a "dielectric constant for microwaves") is particularly denoted by a "dielectric constant M ($\varepsilon_M$)" herein.

Patent Document No. 3 and Non-Patent Document No. 1 each state that a low-cost scanned antenna can be obtained by utilizing technologies for liquid crystal display devices (hereinafter referred to as "LCDs").

The present applicant has developed scanned antennas that can be mass-produced by utilizing conventional LCD manufacturing techniques. Patent Document No. 6 (International Publication WO2017/061527) of the present applicant describes a scanned antenna that can be mass-produced by utilizing conventional LCD manufacturing techniques, a TFT substrate for use in such a scanned antenna, and a production method and drive method for such a scanned antenna. The entire disclosure of Patent Document No. 6 is incorporated by reference herein.

SUMMARY

The present inventor has studied various structures in order to reduce the cost of the scanned antenna of Patent Document No. 6 without a reduction in the antenna performance. It is an object of the present invention to reduce the cost of a scanned antenna while preventing or reducing a deterioration in the antenna performance, and to provide a TFT substrate that allows a reduction in the cost of a scanned antenna while preventing or reducing a deterioration in the antenna performance.

A TFT substrate according to an embodiment of the present invention includes a dielectric substrate, a plurality of antenna element regions provided on the dielectric substrate, each antenna element region including a TFT and a patch electrode electrically connected to a drain electrode of the TFT, and a flattening layer provided over the dielectric substrate, located above a layer including the patch electrode, and formed of a resin.

In one embodiment, an upper surface of the flattening layer is lower than or as high as an upper surface of the patch electrode.

In one embodiment, the flattening layer does not overlap with the patch electrode as viewed in a direction normal to the dielectric substrate.

In one embodiment, the patch electrode has a thickness of 2000 nm or less.

In one embodiment, an upper surface of the flattening layer is higher than an upper surface of the patch electrode.

In one embodiment, the flattening layer has an opening in each of the plurality of antenna element regions, the opening overlapping with at least a portion of the patch electrode as viewed in a direction normal to the dielectric substrate.

In one embodiment, the opening has a side surface having a taper angle of 70° or less.

In one embodiment, the opening has a circular or elliptical shape as viewed from above.

In one embodiment, a difference in height between an upper surface of the flattening layer and an upper surface of the patch electrode is 500 nm or less.

A scanned antenna according to an embodiment of the present invention includes any of the above TFT substrates, a slot substrate disposed so as to oppose the TFT substrate, a liquid crystal layer provided between the TFT substrate and the slot substrate, and a reflective conductive plate disposed so as to oppose an opposite surface of the slot substrate from the liquid crystal layer with a dielectric layer interposed between the reflective conductive plate and the slot substrate. The TFT substrate includes a first alignment film that is in contact with the flattening layer and the liquid crystal layer. The slot substrate includes an additional dielectric substrate, a slot electrode provided on a surface of the additional dielectric substrate closer to the liquid crystal layer, and a second alignment film that covers the slot electrode and is in contact with the liquid crystal layer. The slot electrode includes a plurality of slots, and each of the plurality of slots is disposed, corresponding to the patch electrode of the TFT substrate in the corresponding one of the plurality of antenna element regions.

In one embodiment, a difference in height between an upper surface of the flattening layer and an upper surface of the patch electrode is 23% or less of a thickness of the liquid crystal layer between the patch electrode and the slot electrode.

In one embodiment, the flattening layer does not overlap with the patch electrode or the plurality of slots as viewed in a direction normal to the dielectric substrate.

In one embodiment, one of the TFT substrate or the slot substrate further includes a plurality of columnar spacers.

In one embodiment, the flattening layer does not overlap with the plurality of columnar spacers as viewed in a direction normal to the dielectric substrate.

In one embodiment, the flattening layer overlaps with the plurality of columnar spacers as viewed in a direction normal to the dielectric substrate.

In one embodiment, the TFT substrate includes protruding portions overlapping with corresponding ones of the plurality of columnar spacers as viewed in a direction normal to the dielectric substrate.

In one embodiment, the protruding portion includes a metal layer.

In one embodiment, the protruding portion and the patch electrode are formed of the same layer.

According to an embodiment of the present invention, it is possible to reduce the cost of a scanned antenna while preventing or reducing a deterioration in the antenna performance, and it is possible to provide a TFT substrate that allows a reduction in the cost of a scanned antenna while preventing or reducing a deterioration in the antenna performance.

BRIEF DESCRIPTION OF THE DRAWINGS

FIG. 2 includes FIGS. 2(a) and 2(b).

FIG. 3 includes FIGS. 3(a), 3(b), and 3(c). FIG. 3(a) is a schematic plan view of an antenna element region U in a transmitting/receiving region R1 of the scanned antenna 1000A. FIGS. 3(b) and 3(c) are schematic plan views of a non-transmitting/receiving region R2 of the scanned antenna 1000A.

FIG. 4 includes FIGS. 4(a), 4(b), 4(c), 4(d), and 4(e). FIGS. 4(a)-4(e) are schematic cross-sectional views of the TFT substrate 101A.

FIG. 5 includes FIGS. 5(a), 5(b), 5(c), and 5(d). FIGS. 5(a)-5(c) are schematic cross-sectional views of the TFT substrate 101A. FIG. 5(d) is a schematic cross-sectional view of a liquid crystal panel 100A included in the scanned antenna 1000A.

FIG. 7 includes FIGS. 7(a) and 7(b).

FIG. 8 includes FIGS. 8(a), 8(b), 8(c), 8(d), 8(e), 8(f), and 8(g). FIGS. 8(a)-8(g) are schematic cross-sectional views for describing a method for manufacturing the TFT substrate 101A.

FIG. 9 includes FIGS. 9(a), 9(b), 9(c), 9(d), 9(e), 9(f), and 9(g). FIGS. 9(a)-9(g) are schematic cross-sectional views for describing a method for manufacturing the TFT substrate 101A.

FIG. 10 includes FIGS. 10(a), 10(b), 10(c), and 10(d). FIGS. 10(a) 10(d) are schematic cross-sectional views for describing a method for manufacturing the TFT substrate 101A.

FIG. 11 includes FIGS. 11(a), 11(b), 11(c), and 11(d). FIGS. 11(a)-11(d) are schematic cross-sectional views for describing a method for manufacturing the TFT substrate 101A.

FIG. 12 includes FIGS. 12(a), 12(b), 12(c), and 12(d). FIGS. 12(a) 12(d) are schematic cross-sectional views for describing a method for manufacturing the TFT substrate 101A.

FIG. 13 includes FIGS. 13(a), 13(b), 13(c), and 13(d).

FIG. 14 includes FIGS. 14(a), 14(b), and 14(c). FIGS. 14(a)-14(c) are schematic cross-sectional views for describing a method for manufacturing the TFT substrate 101A.

FIG. 15 includes FIGS. 15(a), 15(b), and 15(c).

FIG. 16 includes FIGS. 16(a) and 16(b).

FIG. 17 includes FIGS. 17(a) and 17(b).

FIG. 19 includes FIGS. 19(a), 19(b), 19(c), and 19(d).

FIG. 21 includes FIGS. 21(a) and 21(b).

FIG. 22 includes FIGS. 22(a) and 22(b).

FIG. 23 includes FIGS. 23(a) and 23(b).

FIG. 25 includes FIGS. 25(a) and 25(b).

FIG. 27 includes FIGS. 27(a) and 27(b).

FIG. 28 includes FIGS. 28(a) and 28(b).

FIG. 30 includes FIGS. 30(a), 30(b), 30(c), 30(d), and 30(e).

FIG. 31 includes FIGS. 31(a), 31(b), 31(c), and 31(d).

FIG. 32 includes FIGS. 32(a), 32(b), 32(c), 32(d), and 32(e). FIGS. 32(a)-32(e) are schematic cross-sectional views for describing a method for manufacturing the TFT substrate 101D.

FIG. 33 includes FIGS. 33(a), 33(b), and 33(c). FIGS. 33(a)-33(c) are schematic cross-sectional views for describing a method for manufacturing the TFT substrate 101D.

FIG. 34 includes FIGS. 34(a), 34(b), and 34(c).

FIG. 35 includes FIGS. 35(a) and 35(b). FIGS. 35(a) and 35(b) are schematic cross-sectional views for describing a method for manufacturing the TFT substrate 101D.

DETAILED DESCRIPTION

Figure 1:
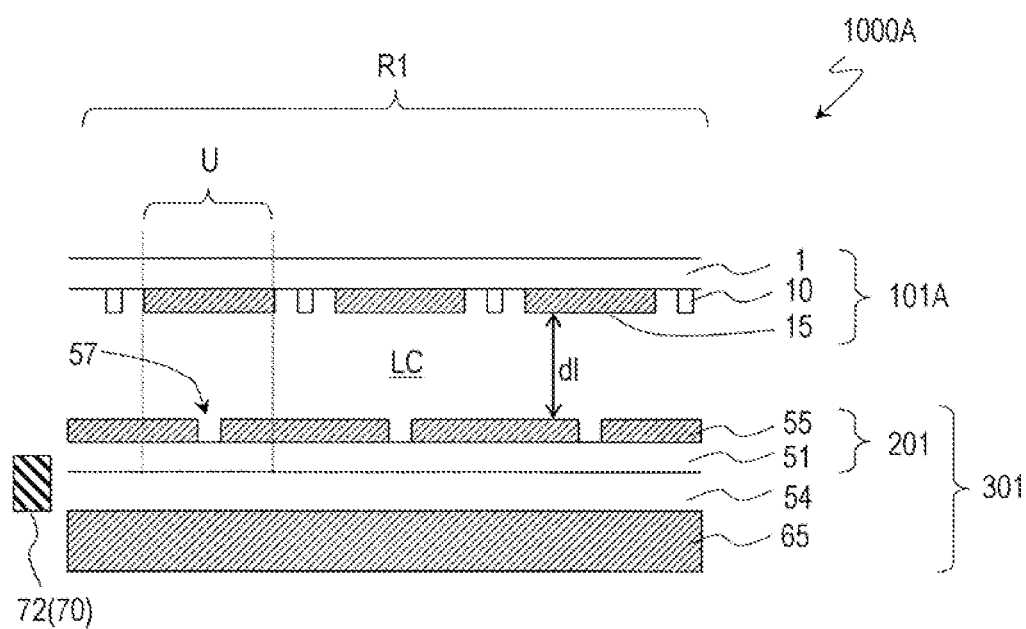
FIG. 1 is a cross-sectional view schematically showing a portion of a scanned antenna 1000A according to a first embodiment of the present invention.

A scanned antenna according to an embodiment of the present invention, a production method for the scanned antenna, and a TFT substrate for use in the scanned antenna will now be described with reference to the accompanying drawings. Note that the present invention is in no way limited to embodiments described below. Embodiments of the present invention are not limited by the drawings. For example, the thicknesses of layers in cross-sectional views, and the sizes of conductive portions and openings in plan views, etc., are merely illustrative.

(Basic Structure of Scanned Antenna)

In a scanned antenna that includes antenna elements which utilize the high anisotropy (birefringence) of the dielectric constant $M(\varepsilon_M)$ of the liquid crystal material, the effective dielectric constant $M$ ($\varepsilon_M$) of a liquid crystal layer of each antenna element corresponding to a pixel of an LCD panel is changed by controlling a voltage applied across the liquid crystal layer such that the antenna elements, which have different capacitances, form, a two-dimensional pattern (corresponding to an image displayed by an LCD). Electromagnetic waves (e.g., microwaves) emitted or received by the antenna are caused to have phase differences depending on the different capacitances of the antenna elements, and have a strong directivity in a specific direction, depending on the two-dimensional pattern formed by the antenna elements (beam scanning). For example, electromagnetic waves emitted by the antenna are calculated by integrating spherical waves that are obtained by inputting electromagnetic waves to the antenna elements, which then scatter the input electromagnetic waves, taking into account phase differences given by the antenna elements. It can be considered that each antenna element functions as a "phase shifter." For the basic structure and principle of operation of a scanned antenna employing a liquid crystal material, see Patent Document Nos. 1 to 4 and Non-Patent Document Nos. 1 and 2. Non-Patent Document No. 2 (M, ANDO et al., "A Radial Line Slot Antenna for 12 GHz Satellite TV Reception," IEEE Transactions of Antennas and Propagation, Vol. AP-33, No. 12, pp. 1347-1353 (1985)) describes the basic structure of a scanned antenna having slots arranged in a spiral. The entire disclosures of Patent Document Nos. 1 to 4 and Non-Patent Document Nos. 1 and 2 are incorporated by reference herein.

Although the antenna element in the scanned antenna according to each embodiment of the present invention is similar to the pixel of an LCD panel, the antenna element has a structure different from that of the pixel of an LCD panel, and the arrangement pattern of a plurality of antenna elements is different from the arrangement pattern of pixels in an LCD panel. A basic structure of a scanned antenna according to an embodiment of the present invention will be described with reference to FIG. 1 that shows a scanned antenna 1000A according to a first embodiment described below. The scanned antenna 1000A is a radial inline slot antenna having slots arranged in concentric circles. The scanned antenna according to the embodiment of the present invention is not limited to this, and slots may be arranged in various patterns known in the art. In particular, concerning the arrangement patterns of slots and/or antenna elements, the entire disclosure of Patent Document No. 5 is incorporated by reference herein.

Figure 2A:
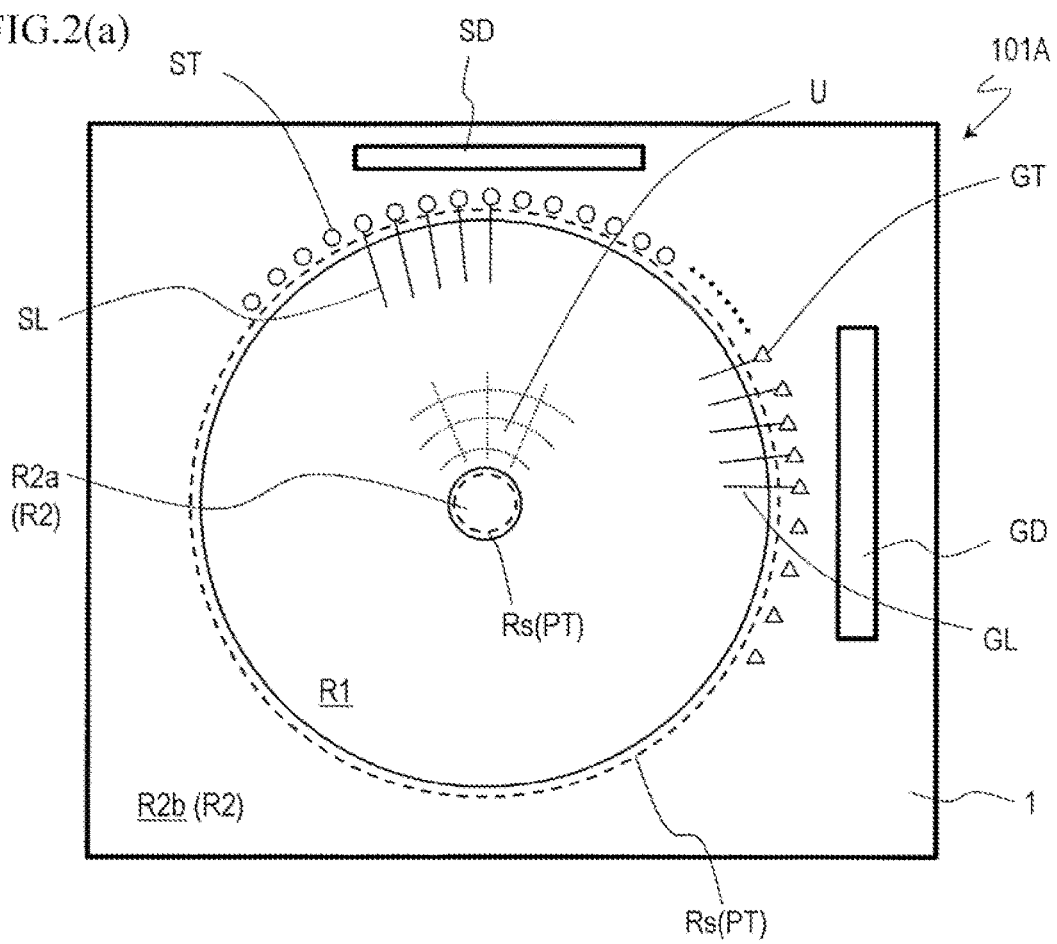
FIGS. 2(a) and 2(b) are schematic plan views showing a TFT substrate 101A and a slot substrate 201, respectively, of the scanned antenna 1000A. A lower-case alphabetical letter in the parentheses after any FIG. number indicates a portion thereof.
Figure 2B:
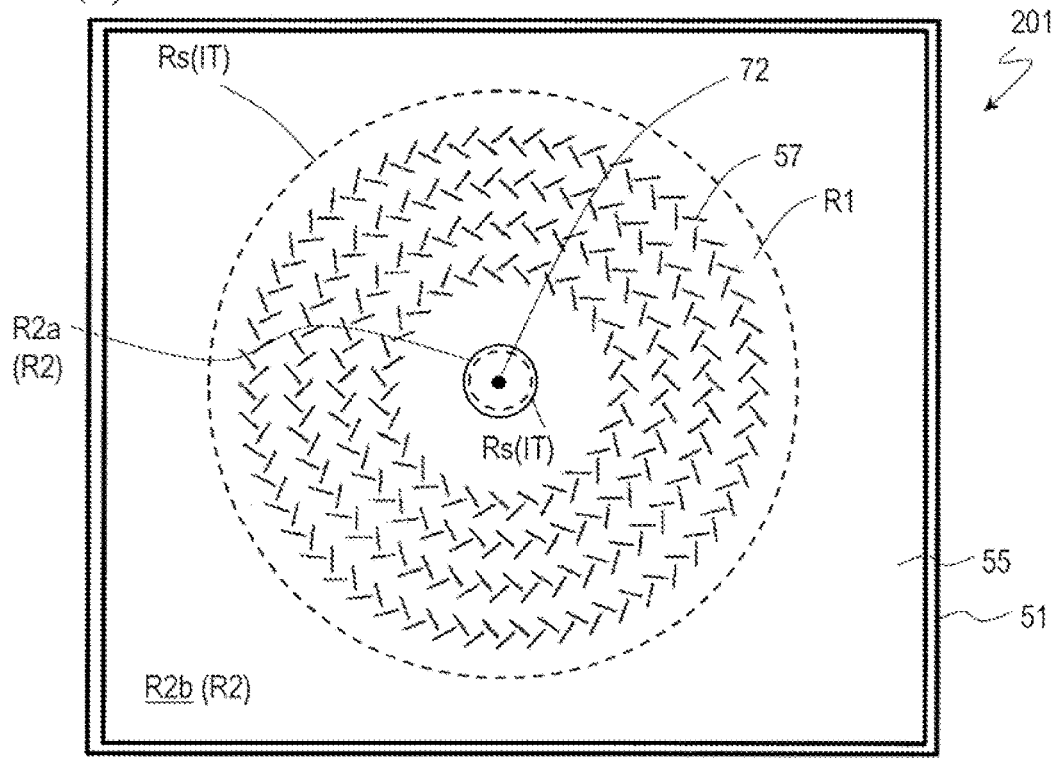

FIG. 1 is a cross-sectional view schematically showing a portion of the scanned antenna 1000A of this embodiment, schematically showing a portion of a cross-section extending in the radial direction from, a power feed pin 72 (see FIG. 2(b)) provided at substantially the center of concentric circles formed by slots.

The scanned antenna 1000A includes a TFT substrate 101A, a slot substrate 201, a liquid crystal layer LC disposed therebetween, and a reflective conductive plate 65 disposed so as to oppose the slot substrate 201 with an air layer 54 interposed therebetween. The scanned antenna 1000A transmits and receives microwaves on a side thereof on which the TFT substrate 101A is disposed.

The TFT substrate 101A includes a dielectric substrate 1, such as a glass substrate, and a plurality of patch electrodes 15 and a plurality of TFTs 10 provided on the dielectric substrate 1. The patch electrodes 15 are connected to the respective corresponding TFTs 10. Each TFT 10 is connected to a gate bus line and a source bus line.

The slot substrate 201 includes a dielectric substrate 51, such as a glass substrate, and a slot electrode 55 provided on a surface of the dielectric substrate 51 closer to the liquid crystal layer LC. The slot electrode 55 includes a plurality of slots 57.

The reflective conductive plate 65 is disposed so as to oppose the slot substrate 201 with the air layer 54 interposed therebetween. A layer formed of a dielectric material (e.g., a fluoropolymer resin such as PTFE) having a small dielectric constant M for microwaves can be used instead of the air layer 54. The slot electrode 55, the reflective conductive plate 65, and the dielectric substrate 51 and the air layer 54 therebetween together function as a waveguide 301.

A patch electrode 15, a portion of the slot electrode 55 including a slot 57, and the liquid crystal layer LC therebetween together form an antenna element U. In each antenna element U, the patch electrode 15 opposes a portion of the slot electrode 55 including the slot 57 with the liquid crystal layer LC interposed therebetween, whereby a liquid crystal capacitor is formed. Each antenna element U includes a storage capacitor (see FIG. 3) electrically connected in parallel to the liquid crystal capacitor. The antenna element U of the scanned antenna 1000A has a similar structure to that of the pixel of an LCD panel. However, the scanned antenna 1000A has many differences from an LCD panel.

Firstly, the performance required for the dielectric substrates 1 and 51 of the scanned antenna 1000A is different from, that required for the substrates of an LCD panel.

A typical LCD panel includes substrates that are transparent to visible light, e.g., a glass substrate or a plastic substrate. In a reflective LCD panel, the substrate on the back side does not need to be transparent, and therefore, may be a semiconductor substrate. In contrast, the dielectric substrates 1 and 51 of the antenna preferably have a small dielectric loss for microwaves (the dielectric loss tangent for microwaves is hereinafter denoted by "$\tan \delta_M$"). The $\tan \delta_M$ of the dielectric substrates 1 and 51 is preferably about 0.03 or less, more preferably 0.01 or less. Specifically, the dielectric substrates 1 and 51 may be a glass substrate or a plastic substrate. A glass substrate has better dimensional stability and heat resistance than those of a plastic substrate, and is suitable for formation of circuit elements, such as TFTs, interconnect wirings, and electrodes, using LCD technologies. For example, in the case where the waveguide is formed of air and glass, the thickness of the glass substrate is preferably 400 µm or less, more preferably 300 µm or less, because glass has a greater dielectric loss and therefore thinner glass has a smaller waveguide loss. There is not a particular lower limit to the thickness of the glass substrate. In any case, the glass substrate has such a thickness that the glass substrate can be handled without being broken during the manufacturing process.

Antennas and LCD panels have different conductive materials for electrodes. An ITO film is often used as a transparent conductive film for the pixel electrode and the counter electrode of an LCD panel. However, ITO has a great $\tan \delta_M$ for microwaves, and therefore, cannot be used as a conductive layer in an antenna. The slot electrode 55 functions as a wall of the waveguide 301, together with the reflective conductive plate 65. Therefore, in order to prevent or reduce the transmission of microwaves through the wall of the waveguide 301, the thickness of the wall of the waveguide 301, i.e., the thickness of the metal layer (a Cu layer or an Al layer), is preferably great. It is known in the art that electromagnetic waves are attenuated by a factor of 20 (−26 dB) in the case where the thickness of the metal layer is three times the skin depth, and by a factor of 150 (−43 dB) in the case where the thickness of the metal layer is five times the skin depth. Therefore, it is possible to reduce the transmittance of the metal layer for electromagnetic waves to 1% in the case where the thickness of the metal layer is five times the skin depth. For example, 10-GHz microwaves can be reduced by a factor of 150 using a Cu layer having a thickness of 3.3 µm or more and an Al layer having a thickness of 4.0 µm or more. For example, 30-GHz microwaves cam be reduced by a factor of 150 using a Cu layer having a thickness of 1.9 µm or more and an Al layer having a thickness of 2.3 µm or more. Thus, the slot electrode 55 is preferably formed of a relatively thick Cu or Al layer. There is not a particular upper limit to the thickness of the Cu or Al layer, and the thickness of the Cu or Al layer may be appropriately determined, taking into account the deposition time and cost. The Cu layer can advantageously be made thinner than the Al layer. For the formation of a relatively thick Cu or Al layer, it is possible to employ not only a thin film deposition technique used in an LCD manufacturing process, but also other methods, such as attaching Cu or Al foil to a substrate. The thickness of the metal layer is, for example, 2 µm or more and 30 µm or less. When the metal layer is formed using a thin film deposition technique, the thickness of the metal layer is preferably 5 µm or less. Note that the reflective conductive plate 65 may be an aluminum plate, a copper plate, or the like that has a thickness of, for example, several millimeters.

The patch electrode 15 is not included in the waveguide 301, which includes the slot electrode 55. Therefore, the patch electrode 15 can be formed of a Cu or Al layer having a smaller thickness than that of the slot electrode 55. Note that in order to avoid or reduce a loss caused by transformation into heat that occurs when the oscillation of free electrons near the slot 57 of the slot electrode 55 induces the oscillation of free electrons in the patch electrode 15, it is preferable that the patch electrode 15 should have a low resistance. An Al layer is more preferable than a Cu layer in terms of mass production. The thickness of the Al layer is preferably, for example, 0.3 µm or more and 2 µm or less.

The array pitch of the antenna elements U is significantly different from that of the pixel pitch. For example, for an antenna for 12-GHz (Ku-band) microwaves, the wavelength $\lambda$ is, for example, 25 mm. In this case, as described in Patent Document No. 4, the pitch of the antenna elements U is $\lambda/4$ or less and/or $\lambda/5$ or less, i.e., 6.25 mm or less and/or 5 mm or less. This is 10 times or more the pixel pitch of an LCD panel. Thus, the length and width of each antenna element U are about 10 times the length and width of each pixel of an LCD panel.

It is understood that the arrangement pattern of the antenna elements U may be different from, the arrangement pattern of pixels in an LCD panel. In this example, the antenna elements U are arranged in concentric circles (see, for example, Japanese Laid-open Patent Publication No. 2002-217640). The arrangement pattern of the antenna elements U is not limited to this, and may, for example, nave a spiral pattern as described in Non-Patent Document No. 2, or alternatively, a matrix pattern as described in Patent Document No. 4.

Characteristics required for the liquid crystal material of the liquid crystal layer LC of the scanned antenna 1000A are different from those required for the liquid crystal material of an LCD panel. An LCD panel displays an image by changing the refractive index of the liquid crystal layer of each pixel so that the polarization of visible light (wavelength: 380 nm to 830 nm) is given a phase difference and is thereby changed (e.g., the polarization axis direction of linearly-polarized light is rotated, or the degree of circular polarization of circularly-polarized light is changed). In contrast, the scanned antenna 1000A of the embodiment changes the phase of microwaves to be driven (re-radiated) from each patch electrode by changing the capacitance value of the liquid crystal capacitor of the corresponding antenna element U. Therefore, the liquid, crystal layer preferably has a high anisotropy ($\Delta\varepsilon_M$) of the dielectric constant $M(\varepsilon_M)$ and a small $\tan \delta_M$ for microwaves. For example, a liquid crystal material whose $\Delta\varepsilon_M$ is 4 or more and whose $\tan \delta_M$ is 0.02 or less (each for 19 Gz) as described in M. Wittek et al., SID 2015 DIGEST, pp. 824-826 can suitably be used. In addition, a liquid crystal material whose $\Delta\varepsilon_M$ is 0.4 or more and whose $\tan \delta_M$ is 0.04 or less as described in Kuki, Polymer, vol. 55, August issue, pp. 599-602 (2006) can be used.

The dielectric constant of a liquid crystal material typically has a frequency dispersion, and the dielectric: anisotropy $\Delta\varepsilon_M$ for microwaves has a positive correlation with the refractive index anisotropy $\Delta n$ for visible light. Therefore, it can be said that a liquid crystal material having a high refractive index anisotropy $\Delta n$ for visible light is suitable for an antenna element for microwaves. The refractive index anisotropy $\Delta n$ of a liquid crystal material for an LCD is evaluated in terms of refractive index anisotropy for 550-nm light. Here, in the case where $\Delta n$ (birefringence) for 550-nm light is used as an index, a nematic liquid crystal whose Δn is 0.3 or more, preferably 0.4 or more, can be used for an antenna element for microwaves. There is not a particular upper limit to Δn. Note, however, that a liquid crystal material having a great Δn tends to have a strong polarity, and may lower the reliability. Δn is preferably 0.4 or less in terms of reliability. The thickness of the liquid crystal layer is, for example, 1 μm to 500 μm.

A structure of a scanned antenna according to an embodiment of the present invention and a method for manufacturing the same will now be described in detail.

First Embodiment

Firstly, refer to FIGS. 1 and 2. FIG. 1 is a schematic partial cross-sectional view of a portion around the center of the scanned antenna 1000A as described in detail above, FIGS. 2(a) and 2(b) are schematic plan views showing the TFT substrate 101A and the slot substrate 201, respectively, of the scanned antenna 1000A.

The scanned antenna 1000A includes a plurality of antenna elements U arranged in a two-dimensional pattern. In the scanned antenna 1000A illustrated herein includes, the antenna elements are arranged in concentric circles. In the description that follows, a region of the TFT substrate 101A and a region of the slot substrate 201 that correspond to an antenna element U are each referred to as an "antenna element region" and are denoted by the same reference sign U as that for the antenna element. As shown in FIGS. 2(a) and 2(b), in the TFT substrate 101A and the slot substrate 201, a region defined by a plurality of antenna element regions arranged in a two-dimensional pattern is referred to as a "transmitting/receiving region R1," and regions other than the transmitting/receiving region R1 are referred to as "non-transmitting/receiving region R2." A terminal portion, a drive circuit, etc., are provided in the non-transmitting/receiving region R2.

FIG. 2(a) is a schematic plan view showing the TFT substrate 101A of the scanned antenna 1000A.

In the illustrated example, the transmitting/receiving region R1 is donut-shaped as viewed in the direction normal to the TFT substrate 101A. The non-transmitting/receiving region R2 include a first non-transmitting/receiving region R2a located at a central portion of the transmitting/receiving region R1 and a second non-transmitting/receiving region R2b located at a peripheral portion of the transmitting/receiving region R1. The transmitting/receiving region R1 has an outer diameter of, for example, 200 mm to 1500 mm, which may be determined based on the amount of data that is transmitted or received, etc.

The transmitting/receiving region R1 of the TFT substrate 101A includes a plurality of gate bus lines GL and a plurality of source bus lines SL supported on the dielectric substrate 1, which define the antenna element regions U. The antenna element regions U are arranged in, for example, concentric circles in the transmitting/receiving region R1. Each antenna element region U includes a TFT, and a patch electrode electrically connected to the TFT. The source and gate electrodes of the TFT are electrically connected to the corresponding source bus line SL and gate bus line GL, respectively. The drain electrode of the TFT is electrically connected to the corresponding patch electrode.

A seal region Rs is disposed for each non-transmitting/receiving region R2 (R2a and R2b) so as to surround the transmitting/receiving region R1. A sealant (not shown) is provided in the seal regions Rs. The sealant bonds the TFT substrate 101A and the slot substrate 201 together, and also seals liquid crystal between these substrates 101 and 201.

Gate terminal portions GT, a gate driver GD, source terminal portions ST, and a source driver SD are provided in the non-transmitting/receiving region R2 outside the seal region Rs. The gate bus lines GL are connected to the gate driver GD via the respective gate terminal portions GT. The source bus lines SL are connected to the source driver SD via the respective source terminal portions ST. Although the source driver SD and the gate driver GD are provided on the dielectric substrate 1 in this example, one or both of these drivers may be provided on another dielectric substrate.

A plurality of transfer terminal portions PT are also provided in the non-transmitting/receiving region R2, The transfer terminal portions PT are electrically connected to the slot electrode 55 of the slot substrate 201 (FIG. 2(b)). A connection portion between a transfer terminal portion PT and a slot electrode 55 is herein referred to as a "transfer portion." As illustrated, the transfer terminal portions PT (transfer portions) may be disposed in the seal region Rs. In this case, a resin containing conductive particles may be used as the sealant. Thus, it is possible to seal liquid crystal between the TFT substrate 101A and the slot substrate 201, and at the same time, ensure electrical connection between the transfer terminal portions PT and the slot electrode 55 of the slot substrate 201. Although the transfer terminal portions PT are provided in both of the first and second non-transmitting/receiving regions R2a and R2b in this example, the transfer terminal portions PT may be provided in only one of these regions R2a and R2b.

Note that the transfer terminal portions PT (transfer portions) may not be disposed in the seal region Rs. For example, the transfer terminal portions PT may be disposed in the non-transmitting/receiving region R2 outside the seal region Rs.

FIG. 2(b) is a schematic, plan, view illustrating the slot substrate 201 of the scanned antenna 1000A, showing a surface of the slot substrate 201 on which the liquid crystal layer LC is provided.

In the slot substrate 201, the slot electrode 55 is provided on the dielectric substrate 51 throughout the transmitting/receiving region R1 and the non-transmitting/receiving region R2.

The plurality of slots 57 are provided in the slot electrode 55 in the transmitting/receiving region R1 of the slot substrate 201. The slots 57 are disposed so as to correspond to the antenna element regions U of the TFT substrate 101A. In the illustrated example, pairs of slots 57 are arranged in concentric circles, each pair including slots 57 extending in directions substantially orthogonal to each other, so as to form a radial inline slot antenna. By means of the slots substantially orthogonal to each other, the scanned antenna 1000A can transmit and receive circularly-polarized waves.

A plurality of terminal portions IT of the slot electrode 55 are provided in the non-transmitting/receiving region R2. The terminal portions IT are electrically connected to the transfer terminal portions FT of the TFT substrate 101A (FIG. 2(a)). In this example, the terminal portions IT are disposed in the seal region Rs, and are electrically connected to the corresponding transfer terminal portions PT by the sealant containing conductive particles.

In the first non-transmitting/receiving region R2a, the power feed pin 72 is disposed on the back side of the slot substrate 201. Microwaves are fed through the power feed pin 72 into the waveguide 301 formed by the slot electrode 55, the reflective conductive plate 65, and the dielectric substrate 51. The power feed pin 72 is connected to a power feed device 70. The power is fed from the center of the concentric circles in which the slots 57 are arranged. The power may be fed by either direct power feeding or electromagnetic coupling, using a power feed structure known in the art.

FIGS. 2(a) and 2(b) show an example in which the seal region Rs is disposed so as to surround relatively narrow region including the transmitting/receiving region R1. The present invention is not limited to this. In particular, the seal region Rs disposed outside the transmitting/receiving region R1 may, for example, be provided at or near the edges of the dielectric substrate 1 and/or the dielectric substrate 51 so that the seal region Rs is located at at least a predetermined distance from the transmitting/receiving region R1. It is understood that the terminal portions, the drive circuit, etc., that are provided in the non-transmitting/receiving region R2, may be provided outside the seal region Rs (i.e., a region where the liquid crystal layer is not provided). If the seal region Rs is provided at at least a predetermined distance from the transmitting/receiving region R1, a reduction in characteristics of the antenna due to an influence of impurities (particularly, ionic impurities) contained in the sealant (particularly, a curable resin) can be prevented or reduced.

A structure of the scanned antenna 1000A will now be more specifically described.

(Antenna Element Region U)

A structure of the antenna element region U in the transmitting/receiving region R1 of the scanned antenna 1000A of this embodiment will be described with reference to FIGS. 3(a), 4(a), and 5(d).

FIG. 3(a) is a schematic plan view of the antenna element region U in the transmitting/receiving region R1 of the scanned antenna 1000A, FIG. 4(a) is a schematic cross-sectional view of the TFT substrate 101A of the scanned antenna 1000A taken along line A-A' of FIG. 3(a). FIG. 5(d) is a schematic cross-sectional view of a liquid crystal panel 100A included in the scanned antenna 1000A, that is taken along line H-H' of FIG. 3(a). The liquid crystal panel 100A includes the TFT substrate 101A, the slot substrate 201, and the liquid crystal layer LC interposed therebetween.

As shown in FIGS. 3(a), 4(a), and 5(d), the TFT substrate 101A includes: the dielectric substrate 1; the antenna element regions U that are provided on the dielectric substrate 1, and each include a TFT 10, and a patch electrode 15 electrically connected to a drain electrode 7D of the TFT 10; and a flattening layer 21 formed of a resin that is provided above a layer (in this example, a patch metal layer 151) including the patch electrode 15, over the dielectric substrate 1.

As described above, the scanned antenna of the embodiment of the present invention includes a nematic liquid crystal material that has a high dielectric anisotropy $\Delta\varepsilon_M$ for microwaves (birefringence $\Delta n$ for visible light). A liquid crystal material having a high dielectric anisotropy $\Delta\varepsilon_M$ for the microwave region typically costs much compared to a liquid crystal material currently used in an LCD. A liquid crystal material having a high dielectric anisotropy $\Delta\varepsilon_M$ for the microwave region contains, for example, an isothiocyanate group (—NCS) or a thiocyanate group (—SCN). Note that a liquid crystal material is typically a mixture of a plurality of types of liquid crystal molecules (liquid crystal compounds), and therefore, not all liquid crystal molecules contained in the liquid crystal material need to have an isothiocyanate group or a thiocyanate group.

In this embodiment, because the TFT substrate 101A includes the flattening layer 21, the volume of the liquid crystal layer LC of the scanned antenna 1000A including the TFT substrate 101A can be reduced. The reduction of the liquid crystal material can lead to a reduction in the cost of the scanned antenna 1000A.

The liquid crystal layer LC is enclosed between the TFT substrate 101A and the slot substrate 201 by the seal portion. The region surrounded by the seal portion may include the entire transmitting/receiving region R1 and a portion of the non-transmitting/receiving region R2. By providing the flattening layer 21 in the region surrounded by the seal portion, the volume of the liquid crystal layer LC can be reduced. In addition, it is preferable that the flattening layer 21 should not be provided on the terminal portions of the non-transmitting/receiving region R2. In any case, an upper connection portion of each terminal portion is exposed from the flattening layer 21. It is preferable, in terms of antenna performance, that at least a portion of the patch electrode 15 does not overlap with the flattening layer 21 as viewed in the direction normal to the dielectric substrate 1. This is because the flattening layer 21 has insulating properties and therefore the thickness of the insulating layer covering the patch electrode 15 is preferably small in terms of antenna performance. More preferably, the flattening layer 21 does not overlap with the patch electrode 15 as viewed in the direction normal to the dielectric substrate 1, in terms of antenna performance. More preferably, the flattening layer 21 does not overlap with the patch electrode 15 or the slot 57.

The flattening layer 21 is formed of, for example, an acrylic resin, a polyimide resin, or a silicone resin. The flattening layer 21 may be an organic insulating layer. The flattening layer 21 is preferably formed of, for example, a photosensitive resin (e.g., an acrylic resin). The photosensitive resin may be either positive or negative. In the case where the flattening layer 21 is formed of a photosensitive resin, it is not necessary to additionally provide a photoresist layer for patterning the flattening layer 21 (e.g., forming an opening), resulting in a reduction in manufacturing process and manufacturing cost. The flattening layer 21 is obtained by providing (applying or printing) a solution (precursor solution) containing a photosensitive resin onto a substrate, performing pre-baking (removing the solvent by heating), performing exposure; using a photomask with a predetermined pattern, and performing development. After the development, post-baking may optionally be performed.

In the case where the flattening layer 21 is formed using a non-photosensitive resin (e.g., a thermosetting resin), the flattening layer 21 may be formed by forming a photoresist layer having a predetermined pattern on a temporarily-formed thermosetting resin film, and etching the thermosetting resin film using the photoresist layer as an etch mask.

In the TFT substrate 101A, an upper surface of the flattening layer 21 is lower than an upper surface of the patch electrode 15. In this example, the upper surface of the flattening layer 21 and the upper surface of the patch electrode 15 refer to a surface of the flattening layer 21 closer to the liquid crystal layer LC and a surface of the patch electrode 15 closer to the liquid crystal layer LC, respectively. For example, even in the case where a contact hole is provided below the patch electrode 15, and the surfaces of the patch electrode 15 have a recessed portion due to the contact hole, it is assumed that the recessed portion does not affect a "height of the upper surface of the patch electrode 15." Such an assumption is true of upper surfaces of other conductive portions (e.g., electrodes) and insulating layers of the TFT substrate unless otherwise specified. The patch electrode 15 may have a thickness of, for example, 2000 nm or less.

In the TFT substrate 101A, the upper surface of the flattening layer 21 is lower than the upper surface of the patch electrode 15, and therefore, the flattening layer 21 does not overlap with the patch electrode 15 as viewed in the direction normal to the dielectric substrate 1. Therefore, in the scanned antenna 1000A including the TFT substrate 101A, the reduction in antenna performance due to the presence of the flattening layer 21 is prevented or reduced, and at the same time, the cost is reduced.

In a step of forming the flattening layer 21 having an upper surface lower than that of the patch electrode 15, ashing may be performed on the resin film after the resin film is formed or after the resin film is patterned. A method for manufacturing the TFT substrate 101A will be described below.

The present invention is not limited to the illustrated example. The upper surface of the flattening layer 21 may have the same height as that of the patch electrode 15. In this case, a similar effect can be obtained.

Figure 6:
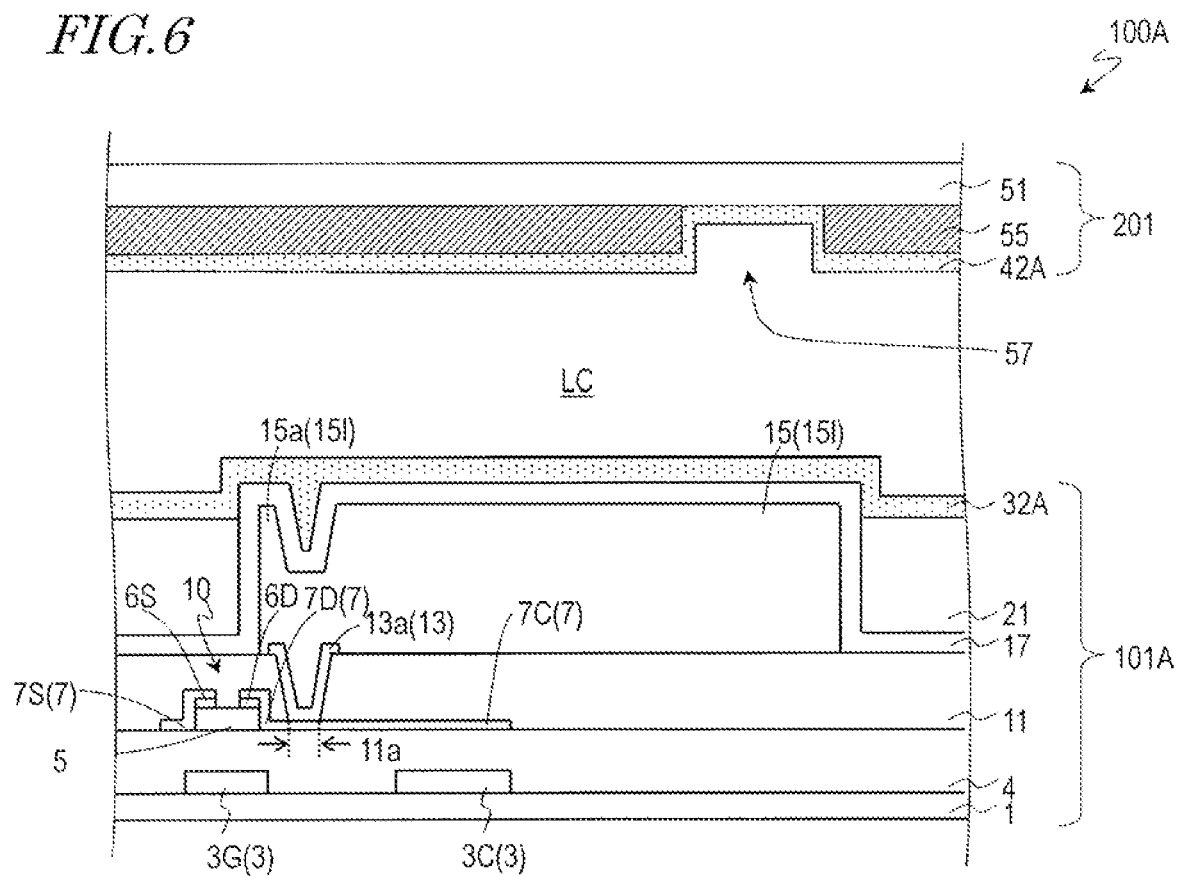
FIG. 6 is a cross-sectional view showing a structure of the liquid crystal panel 100A of the scanned antenna 1000A.

FIG. 6 is a cross-sectional view showing a structure of the liquid crystal panel 100A of the scanned antenna 1000A. As shown in FIG. 6, the TFT substrate 101A includes a first alignment film 32A that covers a surface of the TFT substrate 101A closer to the liquid crystal layer LC. The first alignment film 32A is in contact with the flattening layer 21 and the liquid crystal layer LC. The slot substrate 201, which is disposed so as to oppose the TFT substrate 101A, includes a second alignment film 42A that covers the slot electrode 55 and is in contact with the liquid crystal layer LC.

As described below, it is preferable, in terms of antenna performance, that a height difference (step) of a surface of the TFT substrate closer to the liquid crystal layer should be small. A difference in height between the upper surface of the flattening layer 21 and the upper surface of the patch electrode 15 is preferably, for example, 500 nm or less. The difference in height between the upper surface of the flattening layer 21 and the upper surface of the patch electrode 15 is preferably, for example, 23% or less of a thickness d1 (see FIG. 1) of the liquid crystal layer LC between the patch electrode 15 and the slot electrode 55. Note that, in general, the height difference (step) of the surface of the TFT substrate closer to the liquid crystal layer tends to decrease clue to the formation of the first alignment film 32A.

Note that for the sake of simplicity, in the cross-sectional view, the gate insulating layer 4, the first insulating layer 11, and the second insulating layer 17 may be illustrated like a flattening layer. However, in general, a layer formed by thin-film deposition (e.g., CVD, sputtering, or a vacuum vapor deposition) has a surface that is affected by an underlying height difference (step), i.e., the shape of a surface reflects the shape of an underlying layer.

<Structure (Antenna Element Region U) of TFT Substrate 101A>

A structure of the antenna element region U of the TFT substrate 101A will be described in greater detail. Note that the structure of the TFT substrate of the embodiment of the present invention is not limited to the illustrated examples.

As shown in FIG. 3(a), the TFT substrate 101A includes a gate metal layer 3 supported by the dielectric substrate 1, a semiconductor layer 5 provided on the gate metal layer 3, a gate insulating layer 4 provided between the gate metal layer 3 and the semiconductor layer 5, a source metal layer 7 provided on the gate insulating layer 4, a first insulating layer 11 provided on the source metal layer 7, a patch metal layer 151 provided on the first insulating layer 11, a second insulating layer 17 provided on the patch metal layer 151, and a flattening layer 21 provided on the second insulating layer 17. The TFT substrate 101A further includes a lower conductive layer 13 provided between the first insulating layer 11 and the patch metal layer 151. The TFT substrate 101A further includes an upper conductive layer 19 provided on the second insulating layer 17.

The TFT 10 included in each antenna element region U includes a gate electrode 3G, an island-shaped semiconductor layer 5, contact layers 6S and 6D, a gate insulating layer 4 provided between the gate electrode 3G and the semiconductor layer 5, and a source electrode 7S and a drain electrode 7D. In this example, the TFT 10 is a channel-etch TFT having a bottom-gate structure.

The gate electrode 3G is electrically connected to the gate bus line GL, and receives a scanning signal voltage supplied from the gate bus line GL. The source electrode 7S is electrically connected to the source bus line SL, and receives a data signal voltage supplied from the source bus line SL. The gate electrode 3G and the gate bus line GL may be formed of the same conductive film (gate conductive film). In this example, the source electrode 7S, the drain electrode 7D, and the source bus line SL are formed of the same conductive film (source conductive film). The gate conductive film and the source conductive film are, for example, a metal film.

The semiconductor layer 5 is disposed so as to be laid over the gate electrode 3 with the gate insulating layer 4 interposed therebetween. In the illustrated example, the source contact layer 6S and the drain contact layer 6D are provided on the semiconductor layer 5. The source contact layer 6S and the drain contact layer 6D are disposed on opposite sides of a region (channel region) of the semiconductor layer 5 in which a channel is formed. The semiconductor layer 5 may be an intrinsic amorphous silicon (i-a-Si) layer, and the source contact layer 6S and the drain contact layer 6D may be am n$^+$-type amorphous silicon (n$^+$-a-Si) layer.

The source electrode 7S is disposed in contact with the source contact layer 6S, and is connected to the semiconductor layer 5 via the source contact layer 6S. The drain electrode 7D is disposed in contact with the drain contact layer 6D, and is connected to the semiconductor layer 5 via the drain contact layer 6D.

In this example, each antenna element region U includes a storage capacitor electrically connected in parallel to the liquid crystal capacitor. In this example, the storage capacitor is formed by a storage capacitor electrode 7C electrically connected to the drain electrode 7D, the gate insulating layer 4, and a storage capacitor counter electrode 3C opposing the storage capacitor electrode 7C with the gate insulating layer 4 interposed therebetween. The storage capacitor counter electrode 3C is included in the gate metal layer 3, and the storage capacitor electrode 7C is included in the source metal layer 7. The gate metal layer 3 further includes a CS bus line (storage capacitor line) CL connected to the storage capacitor counter electrode 3C. The CS bus line CL extends generally parallel to the gate bus line GL, for example. In this example, the storage capacitor counter electrode 30 is integrally formed with the CS bus line CL. The storage capacitor counter electrode 3C may have a greater width than that of the CS bus line CL. In this example, the storage capacitor electrode 7C is extended from the drain electrode 7D. The storage capacitor electrode 7C may have a greater width than that of a portion extended from the drain electrode 7D other than the storage capacitor electrode 7C. Note that the positional relationship between the storage capacitor and the patch electrode 15 is not limited to the illustrated example.

The gate metal layer 3 includes the gate electrode 3G of the TFT 10, the gate bus line GL, the storage capacitor counter electrode 3C, and the CS bus line CL.

The source metal layer 7 includes the source electrode 7S and the drain electrode 7D of the TFT 10, the source bus line SL, and the storage capacitor electrode 7C.

The first insulating layer 11 is formed so as to cover the TFT 10. The first insulating layer 11 includes an opening 11a that reaches the drain electrode 7D or a portion extended from the drain electrode 7D. The opening 11a is also referred to as a "contact hole CH_a."

The lower conductive layer 13 includes a connection portion 13a provided on the first insulating layer 11 and in the opening 11a. In the opening 11a, the connection portion 13a is connected to the drain electrode 7D or a portion extended from the drain electrode 7D. In this example, the connection portion 13a is in contact with a portion extended from, the drain electrode 7D in the opening 11a.

The lower conductive layer 13 includes, for example, a transparent conductive layer (e.g., an ITO layer).

The patch metal layer 151 includes the patch electrode 15, and a connection portion 15a. The connection, portion 15a is provided on the connection portion 13a, and is electrically connected to the connection portion 13a. In this example, the connection portion 15a is formed so as to be in contact with the connection portion 13a. In this example, the connection portion 15a is integrally formed with an interconnect 15w extended from the patch electrode 15. In this example, the patch electrode 15 and the drain electrode 7D are electrically connected to each other via the connection portion 13a, the connection portion 15a, and the interconnect 15w.

The patch metal layer 151 includes a metal layer. The patch metal layer 151 may include only a metal layer(s). For example, the patch metal layer 151 has a layered structure including a low-resistance metal layer, and a high, melting point metal-containing layer provided below the low-resistance metal layer. The layered structure may further include a high melting point metal-containing layer provided above the low-resistance metal layer. The "high melting point metal-containing layer" contains at least one element selected from the group consisting of titanium (Ti), tungsten (W), molybdenum (Mo), tantalum (Ta), and niobium (Nb). The "high melting point metal-containing layer" may have a layered structure. For example, the high melting point metal-containing layer refers to a layer formed of any of Ti, W, Mo, Ta, Nb, alloys thereof, and nitrides thereof, and solid solutions of the metals or alloys and the nitrides. The "low-resistance metal layer" may contain at least one element selected from the group consisting of copper (Cu), aluminum (Al), silver (Ag), and gold (Au). The "low-resistance metal layer" may have a layered structure. The low-resistance metal layer of the patch metal layer 151 is also referred to as a "main layer," and the high melting point metal-containing layers below and above the low-resistance metal layer are also referred to as a "lower layer" and an "upper layer," respectively.

The patch metal layer 151 includes, for example, a Cu layer or an Al layer as the main layer. In other words, the patch electrode 15 includes, for example, a Cu layer or an Al layer as the main layer. The performance of the scanned antenna has a correlation with the electrical resistance of the patch electrode 15, and the main layer is formed so as to have such a thickness that it has a desired resistance. In view of its electrical resistance, a Cu layer may be used to reduce the thickness of the patch electrode 15 compared to an Al layer. The metal layer included in the patch metal layer 151 (i.e., the metal layer included in the patch electrode 15) is, for example, formed so as to have a thickness greater than those of the source electrode 7S and the drain electrode 7D. In the case where the metal layer of the patch electrode 15 is an Al layer, the metal layer has a thickness of, for example, 0.3 μm or more.

The second insulating layer 17 is disposed on the patch metal layer 151, covering the patch electrode 15, the connection portion 15a, and the interconnect 15w.

Note that the embodiment of the present invention is not limited to the illustrated example. For example, the structure of the TFT is not limited to the illustrated example. The positional relationship between the gate metal layer 3 and the source metal layer 7 may be reversed. The patch electrode 15 may be included in the gate metal layer 3 or the source metal layer 7.

<Spacer Structure>

The scanned antenna 1000A includes a spacer for controlling the thickness of the liquid crystal layer LC.

As shown in FIGS. 3(a) and 5(d), the scanned antenna 1000A includes a columnar spacer PS for controlling the thickness of the liquid crystal layer LC, which is provided for each antenna element region U. In this example, the slot substrate 201 has the columnar spacers PS. The columnar spacer is formed by a photolithographic process using a photosensitive resin, such as a UV curable resin, and is also called a "photospacer." Note that a spacer contained in a sealant (also called a "particulate spacer") may be used in combination with the columnar spacer. The number and arrangement of spacers are not specifically shown in the drawings and are not particularly limited. A plurality of columnar spacers PS may be provided in each antenna element region U. A spacer may also be provided in the non-transmitting/receiving region R2.

The TFT substrate 101A includes, in each antenna element region U, a protruding portion 15h that overlaps the columnar spacer PS as viewed in the direction normal to the dielectric substrates 1 and 51. In this example, the protruding portion 15h is included in the patch metal layer 151. In other words, the protruding portion 15h and the patch electrode 15 are formed of the same layer. The protruding portion 15h typically includes a metal layer. The protruding portion overlapping with the columnar spacer PS, which is included in the TFT substrate 101A, is not limited to the illustrated example. For example, the protruding portion may include at least one conductive layer of the gate metal layer 3, the source metal layer 7, and the patch metal layer 151.

The TFT substrate 101A, which has the protruding portion 15h, has the following effect. If the liquid crystal layer LC has a great thickness, it is difficult to form a high columnar spacer (e.g., a columnar spacer having a height of more than 5 μm) using a photosensitive resin. In such a case, if the columnar spacer PS is provided on the protruding portion 15h included in the TFT substrate 101A, the height of the columnar spacer PS can be reduced. Note that the height of the columnar spacer PS is equal to a thickness dp of the liquid crystal layer LC defined by the columnar spacer PS (see FIG. 5(d)).

In this example, the flattening layer 21 is formed so as not to overlap with the columnar spacer PS as viewed in the direction normal to the dielectric substrates 1 and 51, in each antenna element region U. This is because the upper surface of the protruding portion 15h is higher than the upper surface of the flattening layer 21. In this example, the conductive layers included in the TFT substrate 101A other than the patch metal layer 151 are formed so as not to overlap with the patch electrode 15 as viewed in the direction normal to the dielectric substrate 1. Therefore, the height of the upper surface of the patch electrode 15 is substantially equal to the height of the upper surface of the protruding portion 15*h* included in the patch metal layer 151.

The height of the columnar spacer PS may be appropriately adjusted, taking into account the configuration of the conductive layers included in the protruding portion 15*h*, the thickness of the liquid crystal layer LC, etc.

In this example, the slot substrate 201 has the columnar spacer PS. Alternatively, in the scanned antenna of the embodiment of the present invention, the TFT substrate may have a columnar spacer. In the case where the TFT substrate has a columnar spacer, the problem that the columnar spacer is misaligned with the protruding portion 15*h* included in the TFT substrate advantageously does not occur. Furthermore, because the TFT substrate includes the flattening layer 21, the amount of a photosensitive resin for forming the columnar spacer on the TFT substrate can advantageously be reduced.

<Structure (Antenna Element Region U) of Slot Substrate 201>

The structure of the slot substrate 201 included in the scanned antenna 1000A will be described in greater detail with reference to FIG. 5(*d*).

The slot substrate 201 includes the dielectric substrate 51 having a front surface and a back surface, a third insulating layer 52 provided on the front surface of the dielectric substrate 51, the slot electrode 55 provided on the third insulating layer 52, and a fourth insulating layer 58 covering the slot electrode 55. The reflective conductive plate 65 is disposed so as to oppose the back surface of the dielectric substrate 51 with the dielectric layer (air layer) 54 interposed therebetween. The slot electrode 55 and the reflective conductive plate 65 each function as a wall of the waveguide 301.

In the transmitting/receiving region R1, the plurality of slots 57 are provided in the slot electrode 55. The slots 57 are an opening that penetrates through the slot electrode 55. In this example, a slot 57 is provided in each antenna element region U.

The fourth insulating layer 58 is formed on the slot electrode 55 and in the slot 57. The fourth insulating layer 58 and the third insulating layer 52 may be formed of the same material. Because the slot electrode 55 is covered by the fourth insulating layer 58, the slot electrode 55 and the liquid crystal layer LC are not in direct contact with each other, resulting in an increase in reliability. In the case where the slot electrode 55 is formed of a Cu layer, Cu may dissolve out into the liquid crystal layer LC. In the case where the slot electrode 55 is formed of an Al layer using a thin-film deposition technique, voids may occur in the Al layer. The fourth insulating layer 58 can prevent the liquid crystal material from entering voids of the Al layer. Note that the problem of voids can be avoided if an aluminum foil that serves as the Al layer is attached to the dielectric substrate 51 by an adhesive and is then patterned to produce the slot electrode 55.

The slot electrode 55 includes a main layer 55M that is, for example, a Cu layer or an Al layer. The slot electrode 55 may have a layered structure including the main layer 55M, and an upper layer 55U and a lower layer 55L disposed so as to sandwich the main layer 55M (see FIGS. 7(*a*) and 7(*b*)). The thickness of the main layer 55M is determined, depending on the material, taking the skin effect into account, and may, for example, be 2 µm or more and 30 µm or less. The thickness of the main layer 55M is typically greater than the thicknesses of the upper layer 55U and the lower layer 55L.

In the illustrated example, the main layer 55M is a Cu layer, and the upper layer 55U and the lower layer 55L are each a Ti layer. Because the lower layer 55L is provided between the main layer 55M and the third insulating layer 52, it is possible to improve the adhesion between the slot electrode 55 and the third insulating layer 52. Because the upper layer 55U is provided, it is possible to prevent or reduce the corrosion of the main layer 55M (e.g., a Cu layer).

The reflective conductive plate 65, which forms a wall of the waveguide 301, preferably has a thickness that is 3 times or more, preferably 5 times or more, the skin depth. The reflective conductive plate 65 may be an aluminum plate, a copper plate, or the like, that is produced by machining and has a thickness of, for example, several millimeters.

(Non-Transmitting/Receiving Region R2)

A structure of the non-transmitting/receiving region R2 of the scanned antenna 1000A will be described with reference to FIGS. 3-5 and 7. The flattening layer 21 included in the TFT substrate 101A is provided substantially throughout the entire region other than the terminal portions (the transfer terminal portion, the source terminal portion, the gate terminal portion, and the CS terminal portion). The flattening layer 21 included in the TFT substrate 101A is not provided on any of the terminal portions.

<Structure (Non-Transmitting/Receiving Region R2) of TFT Substrate 101A>

FIGS. 3(*b*) and 3(*c*) are schematic plan views of the non-transmitting/receiving region R2 of the scanned antenna 1000A. FIGS. 4(*b*)-4(*e*) and 5(*a*)-5(*c*) are schematic cross-sectional views of the non-transmitting/receiving region R2 of the TFT substrate 101A.

FIG. 3(*b*) shows the transfer terminal portion PT, the gate terminal portion GT, and the CS terminal portion CT provided in the non-transmitting/receiving region R2. FIG. 3(*c*) shows the source-gate connection portion SG and the source terminal portion ST provided in the non-transmitting/receiving region R2.

The transfer terminal portion PT includes a first transfer terminal portion PT1 located in the seal region Rs, and a second transfer terminal portion PT2 provided outside the seal region Rs (on a side thereof on which the liquid crystal layer is not provided). In the illustrated example, the first transfer terminal portion PT1 extends along the seal region Rs so as to surround the transmitting/receiving region R1.

FIG. 4(*b*) is a cross-sectional view of the first transfer terminal portion PT1 taken along line of B-B' of FIG. 3(*b*). FIG. 4(*c*) is a cross-sectional view of the source-gate connection portion SG taken along line C-C of FIG. 3(*c*). FIG. 4(*d*) is a cross-sectional view of the source terminal portion ST taken along line D-D' of FIG. 3(*c*). FIG. 4(*e*) is a cross-sectional view of the second transfer terminal portion PT2 taken along line E-E' of FIG. 3(*b*). FIG. 5(*a*) is a cross-sectional view of the first transfer terminal portion PT1 taken along line F-F' of FIG. 3(*b*). FIG. 5(*b*) is a cross-sectional view of the source-gate connection portion SG taken along line G-G' of FIG. 3(*c*). FIG. 5(*c*) is a cross-sectional view of the source-gate connection portion SG and the source terminal portion ST taken along line I-I' of FIG. 3(*c*).

The gate terminal portion GT and the source terminal portion ST are typically provided for each gate bus line and for each source bus line. The source-gate connection portion SG is typically provided for each source bus line. Although FIG. 3(b) shows that the CS terminal portion CT and the second transfer terminal portion PT2, and the gate terminal portion GT, are arranged side by side, the numbers and arrangements of the CS terminal portions CT and the second transfer terminal portions PT2 are determined independently of those of the gate terminal portions GT. The numbers of the CS terminal portions CT and the second transfer terminal portions PT2 are typically smaller than the number of the gate terminal portions GT, and are appropriately determined, taking into account the uniformity of the voltages of the CS electrode and the slot electrode. The second transfer terminal portion PT2 may be omitted in the case where the first transfer terminal portion PT1 is provided.

The CS terminal portion CT is, for example, provided for each CS bus line. The CS terminal portion CT may be provided so that each CS terminal portion CT corresponds to a plurality of CS bus lines. For example, in the case where the same voltage as the slot voltage is supplied to each CS bus line, the TFT substrate 101A has at least one CS terminal portion CT. Note, however, that in order to reduce the interconnect resistance, the TFT substrate 101A preferably has a plurality of CS terminal portions CT. Note that the slot voltage is, for example, the ground potential. Also, in the case where the same voltage as the slot voltage is supplied to each CS bus line, the CS terminal portion CT or the second transfer terminal portion PT2 may be omitted.

Source-Gate Connection Portion SG

As shown in FIG. 3(c), the TFT substrate 101A has the source-gate connection portion SG in the non-transmitting/receiving region R2. The source-gate connection portion SG is typically provided for each source bus line SL. The source-gate connection portion SG electrically connects the source bus line SL to an interconnect formed in the gate metal layer 3 (such an interconnect is also referred to as a "source lower interconnect").

As shown in FIGS. 3(c), 4(c), 5(b), and 5(d), the source-gate connection portion SG includes a source lower interconnect 3sg, an opening 4sg1 provided in the gate insulating layer 4, a source bus line connection portion 7sg, an opening 11sg1 and an opening 11sg2 provided in the first insulating layer 11, and a source bus line upper connection portion 13sg. The flattening layer 21 is formed so as to cover the source-gate connection portion SG.

The source lower interconnect 3sg is included in the gate metal layer 3. The source lower interconnect 3sg is electrically separated from the gate bus line GL.

The opening 4sg1 provided in the gate insulating layer 4 reaches the source lower interconnect 3sg.

The source bus line connection portion 7sg is included in the source metal layer 7, and is electrically connected to the source bus line SL. In this example, the source bus line connection portion 7sg is extended from the source bus line SL, and is integrally formed with the source bus line SL. The source bus line connection portion 7sg may have a width greater than that of the source bus line SL.

The opening 11sg1 provided in the first insulating layer 11 overlaps with the opening 4sg1 provided in the gate insulating layer 4 as viewed in the direction normal to the dielectric substrate 1. The opening 4sg1 provided in the gate insulating layer 4 and the opening 11sg1 provided in the first insulating layer 11 form, a contact hole CH_sg1.

The opening 11sg2 provided in the first insulating-layer 11 reaches the source bus line connection portion 7sg. The opening 11sg2 is also referred to as a "contact hole CH_sg2."

The source bus line upper connection portion 13sg (also simply referred to as an "upper connection portion. 13sg") is included in the lower conductive layer 13. The upper connection portion 13sg is provided on the first insulating layer 11, and in the contact hole CH_sg1 and the contact hole CH_sg2, is connected to the source lower interconnect 3sg in the contact hole CH_sg1, and is connected to the source bus line connection portion 7sg in the contact hole CH_sg2. In this example, the upper connection portion 13sg is in contact with, the source lower interconnect 3sg in the opening 4sg1 provided in the gate insulating layer 4, and is in contact with the source bus line connection portion 7g in the opening 11sg2 provided in the first insulating layer 11.

A portion of the source lower interconnect 3sg that is exposed through the opening 4sg1 is preferably covered by the upper connection portion 13sg. A portion of the source bus line connection portion 7sg that is exposed through the opening 11sg2 is preferably covered by the upper connection portion 13sg.

In this example, the source-gate connection portion SG does not include a conductive portion in the patch metal layer 151 or the upper conductive layer 19.

The TFT substrate 101A has the upper connection portion 13sg in the source-gate connection portion SG, and therefore, has excellent operation stability. Because the source-gate connection portion SG includes the upper connection portion 13sg, it is possible to reduce damage to the gate metal layer 3 and/or the source metal layer 7 during the step of etching a patch conductive layer for forming the patch metal layer 151. This effect will be described.

As described above, in the TFT substrate 101A, the source-gate connection portion SG does not include a conductive portion in the patch metal layer 151. In other words, the patch conductive film, is removed from a source-gate connection portion formation region during the step of patterning the patch conductive film. If the source-gate connection portion SG does not include the upper connection portion 13sg, the gate metal layer 3 (the source lower interconnect 3sg) is exposed in the contact hole CH_sg1, and therefore, the patch conductive film that should be removed is deposited in the contact hole CH_sg1, and is formed in contact with the source lower interconnect 3sg. Likewise, if the source-gate connection portion SG does not include the upper connection portion 13sg, the source metal layer 7 (the source bus line connection portion 7sg) is exposed in the contact hole CH_sg2, and therefore, the patch conductive film that should be removed is deposited in the contact hole CH_sg2, and is formed in contact with the source bus line connection portion 7sg. In such cases, the gate metal layer 3 and/or the source metal layer 7 are likely to be damaged by etching. In the step of patterning the patch conductive film, for example, an etchant containing phosphoric acid, nitric acid, and acetic acid is used. If the source lower interconnect 3sg and/or the source bus line connection portion 7sg are damaged by etching, defective contact is likely to occur in the source-gate connection portion SG.

The source-gate connection portion SG of the TFT substrate 101A includes the upper connection portion 13sg provided in the contact hole CH_sg1 and the contact hole CH_sg2. Therefore, damage to the source lower interconnect 3sg and/or the source bus line connection portion 7sg due to etching during the step; of patterning the patch conductive film, is reduced. Therefore, the TFT substrate 101A has excellent operation stability.

In order to effectively reduce etching damage to the gate metal layer 3 and/or the source metal layer 7, a portion of the source lower interconnect 3sg that is exposed through the contact hole CH_sg1 is preferably covered by the upper connection portion 13sg, and a portion of the source bus line connection portion 7sg that is exposed through the opening 11sg2 is preferably covered by the upper connection portion 13sg.

In a TFT substrate used in a scanned antenna, a patch electrode may be formed using a relatively thick conductive film (patch conductive film). In this case, the etching time and overetching time of the patch conductive film may be longer than in the step of etching other layers. In this case, if the gate metal layer 3 (the source lower interconnect 3sg) and the source metal layer 7 (the source bus line connection portion 7sg) are exposed in the contact hole CH_sg1 and the contact hole CH_sg2, these metal layers are more significantly damaged by etching. Thus, in a TFT substrate having a relatively thick patch metal layer, if the source-gate connection portion SG includes the upper connection portion 13sg, etching damage to the gate metal layer 3 and/or the source metal layer 7 is particularly significantly reduced.

In the illustrated example, the contact hole CH_sg2 is separated from the contact hole CH_sg1. This embodiment is not limited to this. The contact hole CH_sg1 and the contact hole CH_sg2 may be continuous with each other (i.e., may be formed as a single contact hole). The contact hole CH_sg1 and the contact hole CH_sg2 may be formed as a single contact hole by the same step. Specifically, a single contact hole that reaches the source lower interconnect 3sg and the source bus line connection portion 7sg is formed in the gate insulating layer 4 and the first insulating layer 11, and the upper connection portion 13sg may be formed in that contact hole and on the first insulating layer 11. In this case, the upper connection portion 13sg is preferably formed so as to cover portions of the source lower interconnect 3sg and the source bus line connection portion 7sg that are exposed through the contact hole.

As described below, because the source-gate connection portion SG is provided, a lower connection portion of the source terminal portion ST can be formed of the gate metal layer 3. The source terminal portion ST including the lower connection portion formed of the gate metal layer 3 has excellent reliability.

Source Terminal Portion ST

As shown in FIG. 3(c), the TFT substrate 101A includes the source terminal portion ST in the non-transmitting/receiving region R2. The source terminal portion ST is typically provided for each source bus line SL. In this example, the source terminal portion ST and the source-gate connection portion SG are provided for each, source bus line SL.

As shown in FIGS. 3(c), 4(d), and 5(c), the source terminal portion ST includes a source terminal lower connection portion 3s (also simply referred to as a "lower-connection portion 3s") connected to the source lower interconnect 3sg provided in the source-gate connection portion SG, an opening 4s provided in the gate insulating layer 4, an opening 11s provided in the first insulating layer 11, an opening 17s provided in the second insulating layer 17, and a source terminal upper connection portion 19s (also simply referred to as an "upper connection portion 19s").

The lower connection portion 3s is included in the gate metal layer 3. The lower connection portion 3s is electrically connected to the source lower interconnect 3sg provided in the source-gate connection portion SG. In this example, the lower connection portion 3s is extended from the source lower interconnect 3sg, and is integrally formed with the source lower interconnect 3sg.

The opening 4s provided in the gate insulating layer 4 reaches the lower connection portion 3s.

The opening 11s provided in the first insulating layer 11 overlaps with the opening 4s provided in the gate insulating layer 4 as viewed in the direction normal to the dielectric substrate 1.

The opening 17s provided in the second insulating layer 17 overlaps with the opening 11s provided in the first insulating layer 11 as viewed in the direction normal to the dielectric substrate 1. The opening 4s provided in the gate insulating layer 4, the opening 11s provided in the first insulating layer 11, and the opening 17s provided in the second insulating layer 17 form a contact hole CH_s.

The upper connection portion 19s is included in the upper conductive layer 19. The upper connection portion 19s is provided on the second insulating layer 17 and in the contact hole CH_s, and is in contact with the lower connection portion 3s in the contact hole CH_s. In this example, the upper connection portion 19s is in contact with the lower connection portion 3s in the opening 4s provided in the gate insulating layer 4.

The upper conductive layer 19 includes, for example, a transparent conductive layer (e.g., an ITO layer). The upper conductive layer 19 may, for example, include only a transparent conductive layer(s). Alternatively, the upper conductive layer 19 may include a first upper conductive layer including a transparent conductive layer, and a second upper conductive layer provided below the first upper conductive layer. For example, the second upper conductive layer includes one layer selected from the group consisting of a Ti layer, a MoNbNi layer, a MoNb layer, a MoW layer, a W layer, and a Ta layer, or a layered structure including two or more thereof.

The entire upper connection portion 19s may overlap with the lower connection portion 3s as viewed in the direction normal to the dielectric substrate 1.

In this example, the source terminal portion ST does not include a conductive portion in the source metal layer 7, the lower conductive layer 13, or the patch metal layer 151.

The source terminal portion ST includes the lower connection portion 3s included in the gate metal layer 3, and therefore, has excellent reliability.

The terminal portions, particularly terminal portions disposed outside the seal region Rs (on an opposite side thereof from the liquid crystal layer) may undergo corrosion due to moisture contained in the atmosphere (impurities may be contained in the moisture). Moisture in the atmosphere may enter the contact hole that reaches the lower connection portion, reach the lower connection portion, and cause corrosion of the lower connection portion. In order to prevent or reduce the occurrence of such corrosion, it is preferable that the contact hole that reaches the lower connection portion should be deep. In other words, it is preferable that the thickness of the insulating layer in which an opening forming the contact hole is formed should be great.

In the step of fabricating a TFT substrate including a glass substrate as a dielectric substrate, the lower connection portion of a terminal portion may be scratched or broken due to chips or cullet of the glass substrate. For example, a plurality of TFT substrates are fabricated from a single mother substrate. For example, cullet occurs when a mother substrate is cut, a scribe line is formed on a mother substrate, etc. In order to prevent or reduce scratches or breaks of the lower connection portion of a terminal portion, it is preferable that a contact hole that reaches the lower connection portion should be deep. In other words, it is preferable that an insulating layer in which an opening forming a contact hole is formed should be great.

In the source terminal portion ST of the TFT substrate 101A, the lower connection portion 3s is included in the gate metal layer 3, and therefore, the contact hole CH_s, which reaches the lower connection portion 3s, includes the opening 4s provided in the gate insulating layer 4, the opening 11s provided in the first insulating layer 11, and the opening 17s provided in the second insulating layer 17. A depth of the contact hole CH_s is the sum of a thickness of the gate insulating layer 4, a thickness of the first insulating layer 11, and a thickness of the second insulating layer 17. In contrast to this, for example, if a lower connection portion is included in the source metal layer 7, a contact hole that reaches the lower connection portion includes only an opening provided in the first insulating layer 11 and an opening provided in the second insulating layer 17, and has a depth that is the sum of the thickness of the first insulating layer 11 and the thickness of the second insulating layer 17, which is smaller than that of the contact hole CH_s. As used herein, the depth of the contact hole and the thickness of the insulating layer refer to a depth thereof and a thickness thereof, respectively, in the direction normal to the dielectric substrate 1. The same is true of the other contact holes and insulating layers unless otherwise specified. Thus, in the source terminal portion ST of the TFT substrate 101A, the lower connection portion 3s is included in the gate metal layer 3, and therefore, the source terminal portion ST has excellent reliability compared to, for example, the case where the lower connection portion is included in the source metal layer 7.

The opening 4s provided in the gate insulating layer 4 is formed so as to expose only a portion of the lower connection portion 3s. The opening 4s provided in the gate insulating layer 4 is disposed inside the lower connection portion 3s as viewed in the direction normal to the dielectric substrate 1. Therefore, the entire region inside the opening 4s has a layered structure that includes the lower connection portion 3s and the upper connection portion 19s on the dielectric substrate 1. In the source terminal portion ST, all regions that do not include the lower connection portion 3s have a layered structure that includes the gate insulating layer 4, the first insulating layer 11, and the second insulating layer 17. As a result, the source terminal portion ST of the TFT substrate 101A has excellent reliability. In order to achieve excellent reliability, it is preferable that the sum of the thicknesses of the gate insulating layer 4, the first insulating layer 11, and the second insulating layer 17 should be great.

A portion of the lower connection portion 3s that is exposed through the opening 4s is covered by the upper connection portion 19s.

If the upper connection portion of a terminal portion has a great thickness (i.e., the upper conductive layer 19 has a great thickness), the occurrence of corrosion of the lower connection portion is prevented or reduced. In order to effectively prevent or reduce the occurrence of corrosion of the lower connection portion, the upper conductive layer 19 may have a layered structure that includes a first upper conductive layer including a transparent conductive layer (e.g., an ITO layer), and a second upper conductive layer that is provided below the first upper conductive layer and includes one layer selected from the group consisting of a Ti layer, a MoNbNi layer, a MoNb layer, a MoW layer, a W layer, and a Ta layer, or a layered structure including two or more thereof, as described above. In order to effectively prevent or reduce the occurrence of corrosion of the lower connection portion, the second upper conductive layer may have a thickness of, for example, more than 100 nm.

Gate Terminal Portion GT

As shown in FIG. 3(b), the TFT substrate 101A includes the gate terminal portion GT in the non-transmitting/receiving region R2. As shown in FIG. 3(b), the gate terminal portion GT may has a configuration similar to that of the source terminal portion ST. The gate terminal portion GT is typically provided for each gate bus line GL.

As shown in FIG. 3(b), in this example, the gate terminal portion GT includes a gate terminal lower connection portion 3g (also simply referred to as a "lower connection portion 3g"), an opening 4g provided in the gate insulating layer 4, an opening 11g provided in the first insulating layer 11, an opening 17g provided in the second insulating layer 17, and a gate terminal upper connection portion 19g (also simply referred to as an "upper connection portion 19g").

The lower connection portion 3g is included in the gate metal layer 3, and is electrically connected to the gate bus line GL. In this example, the lower connection portion 3g is extended from the gate bus line GL, and is integrally formed with the gate bus line GL.

The opening 4g provided in the gate insulating layer 4 reaches the lower connection portion 3g.

The opening 11g provided in the first insulating layer 11 overlaps with the opening 4g provided in the gate insulating layer 4 as viewed in the direction normal to the dielectric substrate 1.

The opening 17g provided in the second insulating layer 17 overlaps with the opening 11g provided in the first insulating layer 11 as viewed in the direction normal to the dielectric substrate 1. The opening 4g provided in the gate insulating layer 4, the opening 11g provided in the first insulating layer 11, and the opening 17g provided in the second insulating layer 17 form a contact hole CH_g.

The upper connection portion 19g is included in the upper conductive layer 19. The upper connection portion 19g is provided on the second insulating layer 17 and in the contact hole CH_g, and is connected to the lower connection portion 3g in the contact hole CH_g. For example, the upper connection portion 19g is in contact with the lower connection portion 3g in the opening 4g provided in the gate; insulating layer 4.

The entire upper connection portion 19g may overlap with the lower connection portion 3g as viewed in the direction normal to the dielectric substrate 1.

In this example, the gate terminal portion GT does not include a conductive portion in the source metal layer 7, the lower conductive layer 13, or the patch metal layer 151.

The gate terminal portion GT includes the lower connection portion 3g included in the gate metal layer 3, and therefore, has excellent reliability like the source terminal portion ST.

CS Terminal Portion CT

As shown in FIG. 3(b), the TFT substrate 101A includes the CS terminal portion CT in the non-transmitting/receiving region R2. In this example, as shown in FIG. 3(b), the CS terminal portion CT has a configuration similar to those of the source terminal portion ST and the gate terminal portion GT. The CS terminal portion CT may, for example, be provided for each CS bus line CL.

As shown in FIG. 3(b), the CS terminal portion CT includes a CS terminal lower connection portion 3c (also simply referred to as a "lower connection portion 3c"), an opening 4c provided in the gate insulating layer 4, an opening 11c provided in the first insulating layer 11, an opening 17c provided in the second insulating layer 17, and a CS terminal upper connection portion 19c (also simply referred to as an "upper connection portion 19c").

The lower connection portion 3c is included in the gate metal layer 3. The lower connection portion 3c is electrically connected to the CS bus line CL. In this example, the lower connection portion 3c is extended from the CS bus line CL, and is integrally formed with the CS bus line CL.

The opening 4c provided in the gate insulating layer 4 reaches the lower connection portion 3c.

The opening 11c provided in the first insulating layer 11 overlaps with the opening 4c provided in the gate insulating layer 4 as viewed in the direction normal to the dielectric substrate 1.

The opening 17c provided in the second insulating layer 17 overlaps with the opening 1ie provided in the first insulating layer 11 as viewed in the direction normal to the dielectric substrate 1. The opening 4c provided in the gate insulating layer 4, the opening 11c provided in the first insulating layer 11, and the opening 17c provided in the second insulating layer 17 form a contact hole CH_c.

The upper connection portion 19c is included in the upper conductive layer 19. The upper connection portion 19c is provided on the second insulating layer 17 and in the contact hole CH_c, and is connected to the lower connection portion 3c in the contact hole CH_c. For example, the upper connection portion 19c is in contact with the lower connection portion 3c in the opening 4c provided in the gate insulating layer 4.

The entire upper connection portion 19c may overlap with the lower connection portion 3c as viewed in the direction normal to the dielectric substrate 1.

In this example, the CS terminal portion CT does not include a conductive portion in the source metal layer 7, the lower conductive layer 13, or the patch metal layer 151.

The CS terminal portion CT includes the lower connection portion 3c included in the gate metal layer 3, and therefore, has excellent reliability like the source terminal portion ST.

Transfer Terminal Portion PT

As shown in FIG. 3(b), the TFT substrate 101A includes the first transfer terminal portion PT1 in the non-transmitting/receiving region R2. In this example, the first transfer terminal portion PT1 is provided in the seal region Rs (i.e., the first transfer terminal portion PT1 is provided in the seal portion surrounding the liquid crystal layer).

As shown in FIGS. 3(b) and 4(b), the first transfer terminal portion PT1 includes a first transfer terminal lower connection portion 3p1 (also simply referred to as a "lower connection portion 3p1"), an opening 4p1 provided in the gate insulating layer 4, an opening 11p1 provided in the first insulating layer 11, a first transfer terminal first conductive portion 13p1 (also simply referred to as a "first conductive portion 13p1"), a first transfer terminal second conductive portion 15p1 (also simply referred to as a "second conductive portion 15p1"), an opening 17p1 provided in the second insulating layer 17, and a first transfer terminal upper connection portion 19p1 (also simply referred to as an "upper connection portion 19p1").

The lower connection portion 3p1 is included in the gate metal layer 3. In other words, the lower connection portion 3p1 and the gate bus line GL are formed of the same conductive film. The lower connection portion 3p1 is electrically separated from the gate bus line GL. For example, when the same voltage as the slot voltage is supplied to the CS bus line CL, the lower connection portion 3p1 is electrically connected to the CS bus line CL. As illustrated, the lower connection portion 3p1 may be extended from the CS bus line. The present invention is not limited to this. The lower connection portion 3p1 may be electrically separated from the CS bus line.

The opening 4p1 provided in the gate insulating layer 4 reaches the lower connection portion 3p1.

The opening 11p1 provided in the first insulating layer 11 overlaps with the opening 4p1 provided in the gate insulating layer 4 as viewed in the direction normal to the dielectric substrate 1. The opening 4p1 provided in the gate insulating layer 4 and the opening 11p1 provided in the first insulating layer 11 form a contact hole CH_p1.

The first conductive portion 13p1 is included in the lower conductive layer 13. The first conductive portion 13p1 is provided on the first insulating layer 11 and in the contact hole CH_p1, and is connected to the lower connection portion 3p1 in the contact hole CH_p1. In this example, the first conductive portion 13p1 is in contact with the lower connection portion 3p1 in the opening 4p1.

The second conductive portion 15p1 is included in the patch metal layer 151. The second conductive portion 15p1 is provided on the first conductive portion 13p1. The second conductive portion 15p1 is electrically connected to the first conductive portion 13p1. In this example, the second conductive portion 15p1 is in direct contact with the first conductive portion 13p1.

The opening 17p1 provided in the second insulating layer 17 reaches the second conductive portion 15p1.

The upper connection portion 19p1 is included in the upper conductive layer 19. The upper connection portion 19p1 is provided on the second insulating layer 17 and in the opening 17p1, and is connected to the conductive portion 15p1 in the opening 17p1. In this example, the upper connection portion 19p1 is in contact with the conductive portion 15p1 in the opening 17p1. The upper connection portion 19p1 is connected to a transfer terminal upper connection portion of the slot substrate by, for example, a sealant containing conductive particles (see FIG. 7(b)).

In this example, the first transfer terminal portion PT1 does not include a conductive portion in the source metal layer 7.

The first transfer terminal portion PT1 includes the first conductive portion 13p1 and the second conductive portion 15p1 between the lower connection portion 3p1 and the upper connection portion 19p1. As a result, the first transfer terminal portion PT1 advantageously has a low electrical resistance between the lower connection portion 3p1 and the upper connection portion 19p1.

The entire upper connection portion 19p1 may overlap with the second conductive portion 15p1 as viewed in the direction normal to the dielectric substrate 1.

In this example, the lower connection portion 3p1 is disposed between two adjacent gate bus lines GL. Two lower connection portions 3p1 disposed on opposite sides of a gate bus line GL may be electrically connected to each other via a conductive connection portion (not shown). The conductive connection portion electrically connecting the two lower connection portions 3p1 may, for example, be included in the source metal layer 7.

In this example, a plurality of contact holes CH_p1 are provided, and the lower connection portion 3p1 is connected to the upper connection portion 19p1 via the first conductive portion 13p1 and the second conductive portion 15p1. In any case, at least one contact hole CH_p1 is provided for one lower connection portion 3p1. A single contact hole may be provided for each lower connection portion 3p1. The number and shapes of contact holes are not limited to the illustrated example.

Although, in this example, a plurality of first conductive portions 13p1 are each disposed so as to overlap with the corresponding one of the contact holes CH_p1, the shapes of the first conductive portions 13p1 are not limited to this. The first conductive portion may be disposed so as to overlap with a plurality of contact holes CH_p1.

In this example, the upper connection portion 19p1 is connected to the second conductive portion 15p1 via a single opening 17p1. In any case, at least one opening 17p1 is provided for each upper connection portion 19p1. A plurality of openings may be provided for each upper connection portion 19p1. The number and shapes of openings are not limited to the illustrated example.

The second transfer terminal portion PT2 is provided outside the seal region Rs (on am opposite side thereof from transmitting/receiving region R1). As shown in FIGS. 3(b) and 4(e), the second transfer terminal portion PT2 includes a second transfer terminal lower connection portion 15p2 (also simply referred to as a "lower connection portion 15p2"), an opening 17p2 provided in the second insulating layer 17, and a second transfer terminal upper connection portion 19p2 (also simply referred to as an "upper connection portion 19p2").

The second transfer terminal portion PT2 has a cross-sectional structure similar to that a portion of the first transfer terminal portion PT1 that does not include the lower connection portion 3p1, the contact hole CH_p1, or the first conductive portion 13p1 (see FIG. 5(a)).

The lower connection portion 15p2 is included in the patch metal layer 151. In this example, the lower connection portion 15p2 is extended from the first transfer terminal second conductive portion 15p1, and is integrally formed with the first transfer terminal second conductive portion 15p1.

The opening (contact hole) 17p2 provided in the second insulating layer 17 reaches the lower connection portion 15p2.

The upper connection portion 19p2 is included in the upper conductive layer 19. The upper connection portion 19p2 is provided on the second insulating layer 17 and in the opening 17p2, and is connected to the lower connection portion 15p2 in the opening 17p2. In this example, the upper connection portion 19p2 is in contact with the lower connection portion 15p2 in the opening 17p2.

In this example, the second transfer terminal portion PT2 does not include a conductive portion in the gate metal layer 3, the source metal layer 7, or the lower conductive layer 13.

Also in the second transfer terminal portion PT2, the upper connection portion 19p2 may be connected to a transfer terminal connection portion of the slot substrate by, for example, a sealant containing conductive particles.

<Structure (Non-Transmitting/Receiving Region R2) of Slot Substrate 201>

Figure 7A:
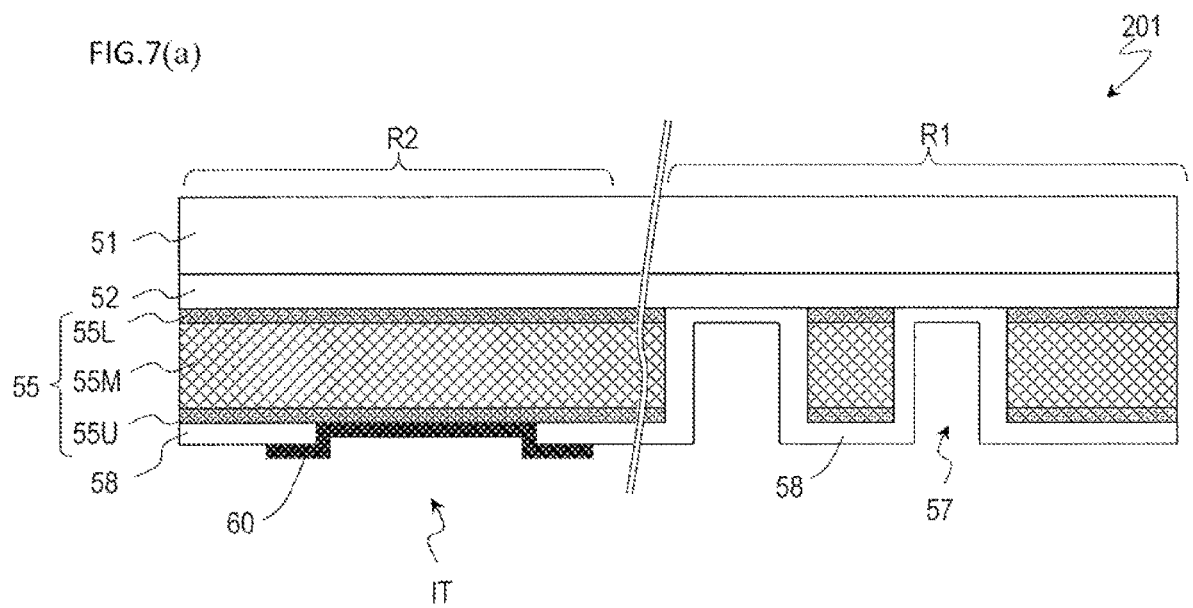
FIG. 7(a) is a cross-sectional view schematically showing a slot substrate 201.
Figure 7B:
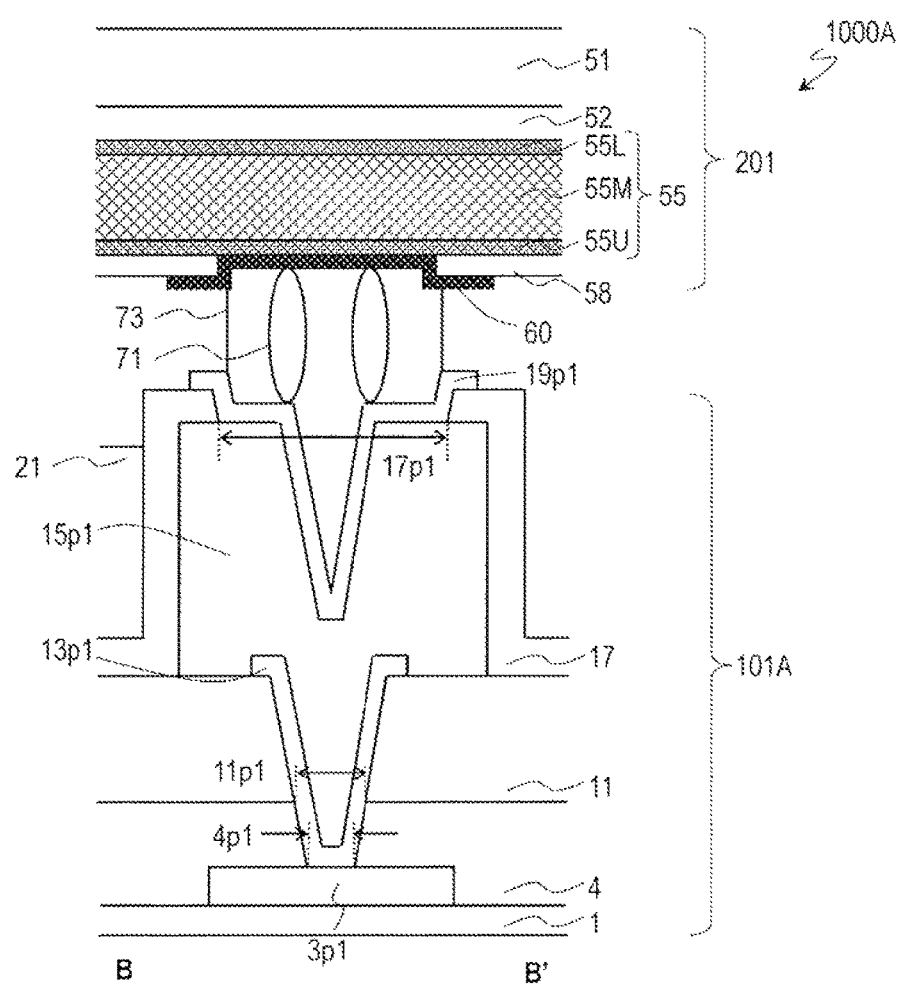
FIG. 7(b) is a schematic: cross-sectional view for describing a transfer portion of the TFT substrate 101A and the slot substrate 201.

FIG. 7(a) is a cross-sectional view schematically showing the antenna element region U of the slot substrate 201, and a terminal portion IT of the non-transmitting/receiving region R2. FIG. 7(b) is a schematic cross-sectional view for describing a transfer portion that connects the first transfer terminal portion PT1 of the TFT substrate 101A and the terminal portion IT of the slot substrate 201 together.

As shown in FIG. 7(a), the terminal portion IT is provided in the non-transmitting/receiving region R2 of the slot substrate 201. The terminal portion IT includes the slot electrode 55, a fourth insulating layer 58 covering the slot electrode 55, and an upper connection portion 60. The fourth insulating layer 58 includes an opening that reaches the slot electrode 55. The upper connection portion 60 is in contact with the slot electrode 55 in the opening. In this embodiment, the terminal portion IT is disposed in the seal region Rs, and is connected to the transfer terminal portion of the TFT substrate by a seal resin containing conductive particles (transfer portion).

As shown in FIG. 7(b), in the transfer portion, the upper connection portion 60 of the terminal portion IT is electrically connected to the first transfer terminal upper connection portion 19p1 of the first transfer terminal portion PT1 in the TFT substrate 101A. In this embodiment, the upper connection portion 60 and the upper connection portion 19p1 are connected to each other via a resin (seal resin) 73 (also referred to as a "seal portion 73") containing conductive beads 71.

The upper connection portions 60 and 19p1 may both be a transparent conductive layer, such as ITO film or an IZO film, on a surface of which an oxide film may occur. If the oxide film occurs, the electrical connection between the transparent conductive layers may not be ensured, so that the contact resistance may increase. In contrast to this, in this embodiment, these transparent conductive layers are bonded together by the resin containing conductive beads (e.g., Au beads) 71. Therefore, even if the surface oxide film occurs, the conductive beads break through (penetrate through) the surface oxide film, and therefore, the increase in contact resistance can be prevented or reduced. The conductive beads 71 may penetrate through not only the surface oxide film but also the upper connection portions 60 and 19p1, which are a transparent conductive layer, and may be in direct contact with the conductive portion 15p1 and the slot electrode 55.

The transfer portion may be provided in only one or both of the central and peripheral portions of the scanned antenna 1000A (i.e., the interior and exterior of the donut-shaped transmitting/receiving region R1 as viewed in the direction normal to the scanned antenna 1000A). The transfer portion may be provided in the seal region Rs for sealing liquid crystal, or outside the seal region Rs (an opposite side thereof from the liquid crystal layer).

<Method for Manufacturing TFT Substrate 101A>

A method for manufacturing the TFT substrate 101A will be described with reference to FIGS. 8-15.

FIGS. 8(a)-8(g), 9(a)-9(g), 10(a)-10(d), 11(a)-11(d), 12(a) 12(d), 13(a) 13(d), 14(a) 14(c), and 15(a) 15(c) are schematic cross-sectional views for describing a method for manufacturing the TFT substrate 101A. These figures show cross-sections corresponding to FIGS. 4(a), 4(b), 4(e), 4(c), 4(d), 5(b), and 5(d) (A-A', B-B', E-E', C-C', D-D', G-G', and H-H' cross-sections of the TFT substrate 101A). Note that a cross-section corresponding to FIG. 5(a) (a F-F' cross-section of the TFT substrate 101A) is not shown, and the structure shown in FIG. 5(a) is formed by a method similar to that for the structure shown in the cross-section corresponding to FIG. 4(e) (the E-E' cross-section of the TFT substrate 101A).

As shown in FIGS. 8(a) and 9(a), initially, a gate conductive film 3' is formed on the dielectric substrate 1 by sputtering, etc. The material for the gate conductive film 3' is not particularly limited, and may, for example, be a film containing a metal such as aluminum (Al), tungsten (W), molybdenum (Mo), tantalum (Ta), chromium (Cr), titanium (Ti), or copper (Cu) or an alloy thereof, or a metal nitride thereof, which can be used as appropriate. In this example, as the gate conductive film 3', a layered film (MoN/Al) is formed in which an Al film (thickness: 150 nm, for example) and a MoN film (thickness: 100 nm, for example) are stacked in that order.

Next, as shown in FIGS. 8(b) and 9(b), the gate conductive film 3' is patterned to form, the gate metal layer 3. Specifically, the gate electrode 3G, the gate bus line GL, the storage capacitor counter electrode 3C, and the CS bus line CL are formed in an antenna element formation region, the source lower interconnect 3sg is formed in a source-gate connection portion formation region, and the lower connection portions 3s, 3g, 3c, and 3p1 are formed in respective terminal portion formation regions. In this example, the gate conductive film 3' is patterned by wet etching.

Thereafter, as shown in FIGS. 8(c) and 9(c), a gate insulating film 4', an intrinsic amorphous silicon film 5', and an n$^+$-type amorphous silicon film 6' are formed in that order so as to cover the gate metal layer 3. The gate insulating film 4' may be formed by CYD, etc. The gate insulating film 4' may be a silicon oxide (SiO$_x$) film, a silicon nitride (Si$_x$N$_y$) film, a silicon oxide nitride (SiO$_x$N$_y$; x>y) film, and a silicon nitride oxide (SiN$_x$O$_y$; x>y) film, etc., which can be used as appropriate. In this example, as the gate insulating film 4', for example, a silicon nitride (Si$_x$N$_y$) film having a thickness of 350 nm is formed. In addition, the intrinsic amorphous silicon film 5' having a thickness of, for example, 120 nm and the n$^+$-type amorphous silicon film 6' having a thickness of, for example, 30 nm are formed.

Next, as shown in FIGS. 8(d) and 9(d), the intrinsic amorphous silicon film 5' and the n$^+$-type amorphous silicon film 6' are patterned to obtain the island-shaped semiconductor layer 5 and the contact layer 6. Note that the semiconductor film used in the semiconductor layer 5 is not limited to an amorphous silicon film. For example, an oxide semiconductor layer may be formed as the semiconductor layer 5. In this case, a contact layer may not be provided between the semiconductor layer 5 and the source or drain electrode.

Next, as shown in FIGS. 8(e) and 9(e), a source conductive film 7' is formed on the gate insulating film 4' and the contact layer 6 by sputtering, etc. The material for the source conductive film 7' is not particularly limited, and may, for example, be a film containing a metal such as aluminum (Al), tungsten (W), molybdenum (Mo), tantalum (Ta), chromium (Cr), titanium (Ti), or copper (Cu) or an alloy thereof, or a metal nitride thereof, which can be used as appropriate. In this example, as the source conductive film 7', a layered film (MoN/Al/MoN) is formed in which MoN (thickness: 50 nm, for example), Al (thickness: 150 nm, for example), and MoN (thickness: 100 nm, for example) are layered in that order.

Next, as shown in FIGS. 8(f) and 9(f), the source conductive film 7' is patterned to form the source metal layer 7. Specifically, the source electrode 7S, the drain, electrode 7D, the source bus line SL, and the storage capacitor electrode 7C are formed in the antenna element formation region, and the source bus line connection portion 7sg is formed in the source-gate connection portion formation region. At that time, the contact layer 6 is also etched, so that the source contact layer 6S and the drain contact layer 6D, which are separated from each other, are formed. In this example, the source conductive film 7' is patterned by wet etching. For example, the MoN film and the Al film are simultaneously patterned by wet etching using am aqueous solution containing phosphoric acid, nitric acid, and acetic acid. Thereafter, a portion of the contact layer that is located over a region that is to serve as the channel region of the semiconductor layer 5 is removed by, for example, dry etching to form a gap portion, so that the source contact layer 6S and the drain contact layer 6D, which are separated from each other, are formed. At that time, in the gap portion, a surface and near-surface portion of the semiconductor layer 5 are also etched (overetching). Thus, the TFT 10 is obtained.

Note that in the case where, for example, a layered film in which a Ti film and an Al film are stacked in that order is used as the source conductive film, the Al film may be patterned by, for example, wet etching using an aqueous solution containing phosphoric acid, acetic acid, and nitric acid, and thereafter, the Ti film and the contact layer (re-type amorphous silicon layer) 6 may be simultaneously patterned by dry etching. Alternatively, the source conductive film and the contact layer can be etched together in a single etching step. Note that when the source conductive film or a lower layer thereof, and the contact layer 6, are simultaneously etched, it may be difficult to control the distribution of an etch amount (an etch depth in the gap portion) of the semiconductor layer 5 throughout the entire surface of the substrate. In contrast to this, if the source-drain separation and the gap portion formation are performed in separate etching steps as described above, the etch amount of the gap portion can be more easily controlled.

In this example, in the source-gate connection portion formation region, the source metal layer 7 is formed such that not all the source lower interconnect 3sg overlaps with the source bus line connection portion 7sg. Each terminal portion formation region does not include a conductive portion in the source metal layer 7.

Next, as shown in FIGS. 8(g) and 9(g), a first insulating film 11' is formed so as to cover the TFT 10 and the source metal layer 7. The first insulating film 11' is formed by, for example, CVD. The first insulating film 11' may be a silicon oxide (SiO$_x$) film, a silicon nitride (Si$_x$N$_y$) film, a silicon oxide nitride (SiO$_x$N$_y$; x>y) film, a silicon nitride oxide (SiN$_x$O$_y$; x>y) film, etc., which can be used as appropriate. In this example, the first insulating film 11' is formed so as to be in contact with the channel region of the semiconductor layer 5. In this example, as the first insulating film 11', for example, a silicon, nitride (Si$_x$N$_y$) film having a thickness of 330 nm is formed.

Next, as shown in FIGS. 10(a) and 11(a), the first insulating film 11' and the gate insulating film 4' are etched by a photolithographic process known in the art. Specifically, in the antenna element formation region, the opening 11a that reaches a portion extended from the drain electrode 7D is formed in the first insulating film 11'. In the first transfer terminal portion formation region, a contact hole that reaches the lower connection portion 3p1 is formed in the gate insulating film 4' and the first insulating film 11'. In the source-gate connection portion formation region, the contact hole CH_sg1 that reaches the source lower interconnect 3sg is formed in the gate insulating film 4' and the first insulating film 11', and the opening 11sg2 (contact hole CH_sg2) that reaches the source bus line connection portion 7sg is formed in the first insulating film 11'.

In this etching step, the first insulating film 11' and the gate insulating film 4' are etched using the source metal layer 7 as an etch stop.

In the source-gate connection portion formation region, the first insulating film 11' and the gate insulating film 4' are etched together in a single etching step in a region thereof overlapping with the source lower interconnect 3sg, and the first insulating film 11' is etched with the source bus line connection portion 7sg functioning as an etch stop in a region thereof overlapping with the source bus line connection portion 7sg. As a result, the contact holes CH_sg1 and CH_sg2 are obtained.

The contact hole CH_sg1 includes the opening 4sg1 formed in the gate insulating film 4', and the opening 11sg1 formed in the first insulating film 11'. In this example, the source lower interconnect 3sg is formed such that not all the source lower interconnect 3sg overlaps the source bus line connection portion 7sg, and therefore, the contact hole CH_sg1 is formed in the gate insulating film 4' and the first insulating film 11'. A side surface of the opening 4sg1 and a side surface of the opening 11sg1 may be aligned together on a side surface of the contact hole CH_sg1. As used herein, term "aligned together" with respect to side surfaces of two or more different layers in a contact hole not only means that the side surfaces of the layers exposed to the contact hole are flush with each other in a vertical direction, but also includes the case where the side surfaces form, a sloped surface, such as a tapered surface. Such a configuration, is, for example, obtained by etching these layers using the same mask or by etching one layer using the other layer as a mask.

The first insulating film 11' and the gate insulating film 4' are, for example, etched together in a single etching step using the same enchant. In this example, the first insulating film 11' and the gate insulating film 4' are etched by dry etching using a fluorine-based gas. The first insulating film 11' and the gate insulating film 4' may be etched using different etchants.

In the first transfer terminal portion formation region, the first insulating film 11' and the gate insulating film 4' are etched together in a single etching step to form the opening 4p1 in the gate insulating film 4' and the opening 11p1 in the first insulating film 11'. A side surface of the opening 4p1 and a side surface of the opening 11p1 may be aligned together.

In this step, an opening is not formed in the gate insulating film 4' or the first insulating film 11', in the source terminal portion formation region, the gate terminal portion formation region, the CS terminal portion formation region, and the second transfer terminal portion formation region.

Next, as shown in FIGS. 10(b) and 11(b), a lower conductive film 13' is formed on the first insulating film 11', and in the opening 11a and the contact holes CH_sg1, CH_sg2, and CH_p1 by, for example, sputtering. The lower conductive film 13' includes, for example, a transparent conductive film. The transparent conductive film may, for example, be an ITO (indium, tin oxide) film, an IZO film, or a ZnO film (zinc oxide film). In this example, as the lower conductive film 13', for example, an ITO film having a thickness of 70 nm is formed.

Next, as FIGS. 10(c) and 11(c), a lower conductive film 13' is patterned to form the lower conductive layer 13. Specifically, in the antenna element formation region, the connection portion 13a is formed that is in contact with a portion extended from the drain electrode 7D in the opening 11a. In the first transfer terminal portion formation region, the first conductive portion 13p1 is formed that is in contact with the lower connection portion 3p1 in the contact hole CH_p1. In the source-gate connection portion formation region, the source; bus line upper connection portion 13sg is formed that is in contact with the source lower interconnect 3sg in the contact hole CH_sg1 and in contact with the source bus line connection portion 7sg in the contact hole CH_sg2.

Next, as shown in FIGS. 10(d) and 11(d), a patch conductive film 15' are formed on the lower conductive layer 13 and the first insulating film 11'. The patch conductive film 15' may be formed of a material similar to that for the gate conductive film 3' or the source conductive film 7'. In this example, as the patch conductive film 15', a layered film (Cu/Ti) is formed in which a Ti film (thickness: 20 nm, for example) and a Cu film (thickness: 500 nm, for example) are stacked in that order. Alternatively, as the patch conductive film 15', a layered film (MoN/Al/MoN) may be formed in which a MoN film (thickness: 50 nm, for example), an Al film (thickness: 1000 nm, for example), and a MoN film (thickness: 50 nm, for example) are stacked in that order.

It is preferable that the patch conductive film should be thicker than the gate conductive film and the source conductive film. This can reduce the sheet resistance of the patch electrode, resulting in a reduction in a loss caused by transformation of the oscillation of free electrons into heat in the patch electrode. The patch conductive film preferably has a thickness of, for example, 0.3 μm or more. If the thickness of the patch conductive film is smaller than 0.3 μm, the sheet resistance is 0.10 Ω/sq or more, likely leading to a problem that the loss is great. The thickness of the patch conductive film is, for example, 3 μm or less, more preferably 2 μm or less. If the thickness of the patch conductive film is greater than that, the substrate is likely to warp due to thermal stress during a process. If the substrate warps significantly, a problem, may occur in a mass-production process, such as transportation trouble, substrate chipping, or substrate breakage.

Figure 13A:
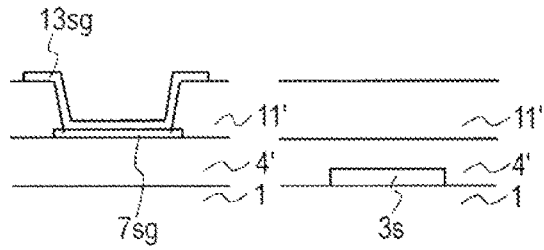
FIGS. 13(a)-13(d) are schematic cross-sectional views for describing a method for manufacturing the TFT substrate 101A.

Next, as shown in FIGS. 12(a) and 13(a), the patch conductive film 15' is patterned to form, the patch metal layer 151. Specifically, in the antenna element formation region, the patch electrode 15, the connection portion 15a, and the protruding portion 15h are formed. In the first transfer terminal portion formation region, the second conductive portion 15p1 is formed. In the second transfer terminal portion formation region, the lower connection portion 15p2 is formed.

In the antenna element formation region, the connection portion 15a is formed so as to be connected to the connection portion 13a. In this example, the connection portion 15a is formed so as to be in contact with the connection portion 13a. In the first transfer terminal portion formation region, the second conductive portion 15p1 is formed so as to be connected to the first conductive portion 13p1. In this example, the second conductive portion 15p1 is formed so as to be in contact with the first conductive portion 13p1.

In the case where, as the patch conductive film 15', a layered film (MoN/Al/MoN) in which MoN, Al, and MoN are layered in that order is formed, the patch conductive film 15' is patterned, for example, in the following manner: the MoN film and the Al film are simultaneously patterned by wet etching using an aqueous solution containing phosphoric acid, nitric acid, and acetic acid as an etchant. In the case where, as the patch conductive film 15', a layered film (Cu/Ti) in which Ti and Cu are layered in that order is formed, the patch conductive film 15' can, for example, be patterned by wet etching using an aqueous mixed acid solution as an etchant.

In the step of patterning the patch conductive film 15', the patch conductive film 15' is removed from the source-gate connection portion formation region. Because the source bus line upper connection portion 13sg has been formed in the contact hole CH_sg1 and the contact hole CH_sg2, damage to the source lower interconnect 3sg and/or the source bus line connection portion 7sg by etching is reduced in the step of patterning the patch conductive film 15'.

In this example, a portion of the source lower interconnect 3sg that is exposed through the contact hole CH_sg1 is covered by the source bus line upper connection portion 13sg, and a portion of the source bus line connection portion 7sg that is exposed through the contact hole CH_sg2 is covered by the source bus line upper connection portion 13sg. As a result, etching damage to the source bus line connection portion 7sg and/or the source lower interconnect 3sg is effectively reduced.

Figure 13B:
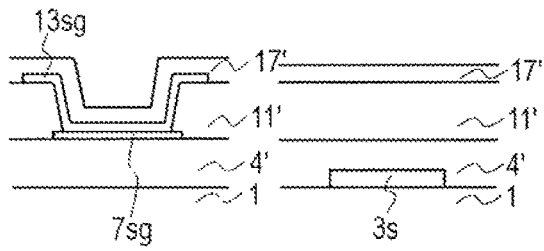

Next, as shown in FIGS. 12(b) and 13(b), a second insulating film 17' is formed on the patch metal layer 151, the lower conductive layer 13, and the first insulating layer 11. The second insulating film 17' is formed so as to cover the lower conductive layer 13 and the patch metal layer 151. The second insulating film 17' is formed by, for example, CVD. The second insulating film 17' may a silicon oxide ($SiO_x$) film, a silicon nitride ($Si_xN_y$) film, a silicon oxide nitride ($SiO_xN_y$; x>y) film, a silicon nitride oxide ($SiN_xO_y$; x>y) film, etc., which can be used as appropriate. In this example, as the second insulating film 17', for example, a silicon nitride ($Si_xN_y$) film having a thickness of 100 nm is formed.

Figure 13C:
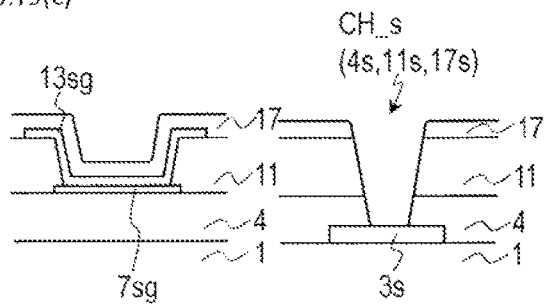

Next, as shown in FIGS. 12(c) and 13(c), the gate insulating film 4', the first insulating film 11', and the second insulating film 17' are etched by a photolithographic process known in the art to form, the gate insulating layer 4, the first insulating layer 11, and the second insulating layer 17. Specifically, in the source terminal portion formation region, the contact hole CH_s that reaches the lower connection portion 3s is formed in the second insulating film 17', the first insulating film 11', and the gate insulating film 4'. In the gate terminal portion formation region, the contact hole CH_g that reaches the lower connection portion 3g is formed in the second insulating film 17', the first insulating film 11', and the gate insulating film 4'. In the CS terminal portion formation region, the contact hole CH_c that reaches the lower connection portion 3c is formed in the second insulating film 17', the first insulating film 11', and the gate insulating film 4'. In the first transfer terminal portion formation region, the opening 17p1 that reaches the conductive portion 15p1 is formed in the second insulating film 17'. In the second transfer terminal portion formation region, the opening 17p2 that reaches the lower connection, portion 15p2 is formed in the second insulating film 17'.

The second insulating film 17', the first insulating film 11', and the gate insulating film 4' are, for example, etched together in a single etching step using the same etchant. In this example, the second insulating film 17', the first insulating film 11', and the gate insulating film 4' are etched by dry etching using a fluorine-based gas. The second insulating film. 17', the first insulating film 11', and the gate insulating film 4' may be etched using different etchants.

In this etching step, the second insulating film 17', the first insulating film 11', and the gate insulating film 4' are etched using the patch metal layer 151 as an etch stop. In each of the source terminal portion formation region, the gate terminal portion formation region, and the CS terminal portion formation region, none of the conductive portions included in the source metal layer 7 and the patch metal layer 151 is formed, and therefore, the second insulating film 17', the first insulating film 11', and the gate insulating film 4' are etched together in a single etching step.

In the source terminal portion formation region, the second insulating film 17', the first insulating film 11', and the gate insulating film 4' are etched together in a single etching step to form the contact hole CH_s. The contact hole CH_s includes the opening 4s that is formed in the gate insulating layer 4 and reaches the lower connection portion 3s, the opening 11s that is formed in the first insulating layer 11 and overlaps with the opening 4s, and the opening 17s that is formed in the second insulating layer 17 and overlaps with the opening 11s. A side surface of the opening 4s, a side surface of the opening 11s, and a side surface of the opening 17s may be aligned together on a side surface of the contact hole CH_s.

In the gate terminal portion formation region, the second insulating film 17', the first insulating film 11', and the gate insulating film 4' are etched together in a single etching step to form the contact hole CH_g. The contact hole CH_g includes the opening 4g that is formed in the gate insulating layer 4 and reaches the lower connection portion 3g, the opening 11g that is formed in the first insulating layer 11 and overlaps with the opening 4g, and the opening 17g that is formed in the second insulating layer 17 and overlaps with the opening 11g. A side surface of the opening 4g, a side surface of the opening 11g, and a side surface of the opening 17g may be aligned together on a side surface of the contact hole CH_g.

In the CS terminal portion formation region, the second insulating film 17', the first insulating film 11', and the gate insulating film 4' are etched together in a single etching step to form the contact hole CH_c. The contact hole CH_c includes the opening 4c that is formed in the gate insulating layer 4 and reaches the lower connection portion 3c, the opening 11c that is formed in the first insulating layer 11 and overlaps with the opening 4c, and the opening 17c that is formed in the second insulating layer 17 and overlaps with the opening 11c. A side surface of the opening 4c, a side surface of the opening 11c, and a side surface of the opening 17c may be aligned together on a side surface of the contact hole CH_c.

Figure 13D:
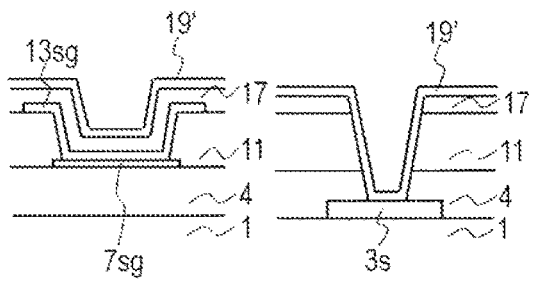

Next, as shown in FIGS. 12(d) and 13(d), an upper conductive film 19' is formed on the second insulating layer 17, and in the contact holes CH_s, CH_g; and CH_c and the openings 17p1 and 17p2 by, for example, sputtering. The upper conductive film 19' includes, for example, a transparent conductive film. The transparent conductive film may, for example, be an ITO (indium tin oxide) film, an IZO film, or a ZnO film (zinc oxide film). In this example, as the upper conductive film 19', for example, an ITO film having a thickness of 70 nm is formed. Alternatively, as the upper conductive film 19', a layered film (ITO/Ti) may be used in which Ti (thickness: 50 nm, for example) and ITO (thickness: 70 nm, for example) are layered in that order. Instead of the Ti film, one film selected from the group consisting of a MoNbNi film, a. MoN film, a MoW film, a W film, and a Ta film, or a layered film including two or more thereof, may be used. In other words, as the upper conductive film 19', a layered film may be used in which one film selected from the group consisting of a MoNbNi film, a MoNb film, a MoW film, a W film, and a Ta film, or a layered film including two or more thereof, and an ITO film are stacked in that order.

Figure 15A:
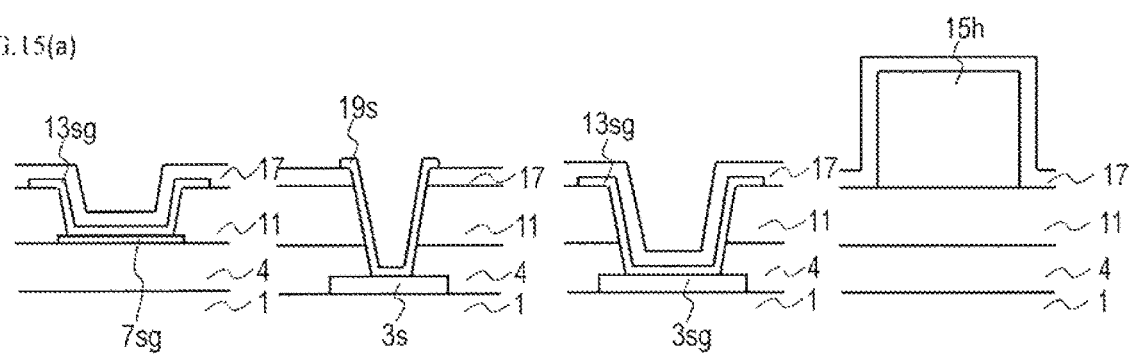
FIGS. 15(a)-15(c) are schematic cross-sectional views for describing a method for manufacturing the TFT substrate 101A.

Next, FIGS. 14(a) and 15(a), the upper conductive film 19' is patterned to form the upper conductive layer 19. Specifically, formed are the upper connection portion 19s that is in contact with the lower connection portion 3s in the contact hole CH_s in the source terminal portion formation region, the upper connection portion 19g that is in contact with the lower connection portion 3g in the contact hole CH_g in the gate terminal portion formation region, the upper connection portion 19c that is in contact with the lower connection portion 3c in the contact hole CH_c in the CS terminal portion formation region, the upper connection portion 19p1 that is connected to the conductive portion 15p1 in the opening 17p1 in the first transfer terminal portion formation region, and the upper connection portion 19p2 that is connected to the lower connection portion 15p2 in the opening 17p2 in the second transfer terminal portion formation region.

Figure 15B:
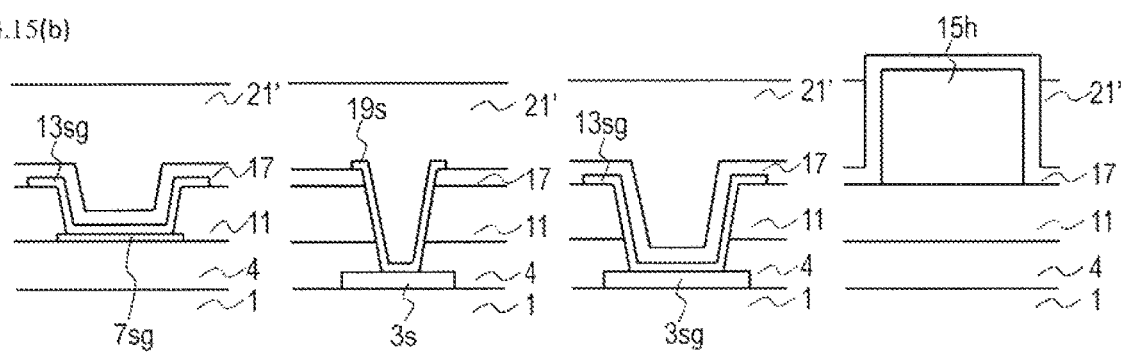

Next, as shown in FIGS. 14(b) and 15(b), a flattening film 21' is formed substantially throughout the entire surface of the dielectric substrate 1. In this example, as the flattening film 21', for example, an acrylic resin film having a thickness of 480 nm is formed. Although the thickness of the flattening film 21' typically depends on a height difference (step) of an underlying layer thereof, the thickness of the flattening film 21' is herein defined as a thickness that the flattening film 21' has in most of its region. In this example, shown is a thickness df (see FIG. 14(b)) of the flattening film 21' in a region that has a layered structure that includes the gate insulating layer 4, the first insulating layer 11, and the second insulating layer 17, and does not include a conductive layer. Specifically, in this example, the thickness df of the flattening film 21' is a distance between an upper surface of the second insulating layer 17 and an upper surface of the flattening film 21', in the above region, in the direction normal to the dielectric substrate 1. The same is true of the description that follows unless otherwise specified. The thickness of the flattening layer 21 that is formed from the flattening film 21' is similarly defined. In this example, the flattening film 21' is formed such that the upper surface of the flattening film 21' is lower than the upper surface of the patch electrode 15. Therefore, at least the patch electrode 15 does not overlap with the flattening film 21'.

Figure 15C:
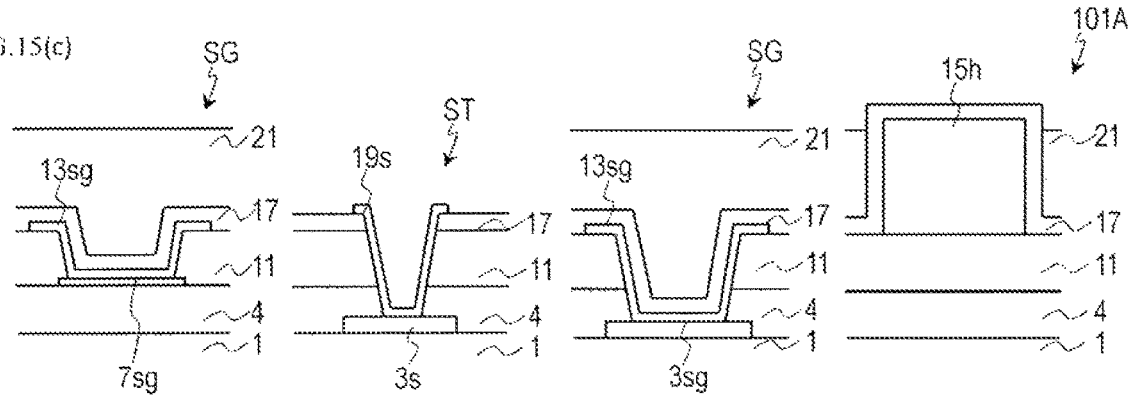

Next, as shown in FIGS. 14(c) and 15(c), the flattening film 21' is patterned to form the flattening layer 21. In this example, the flattening film 21' is formed of a photosensitive (e.g., positive) acrylic resin, and therefore, the flattening film 21' can be patterned by exposure and development without a resist layer being formed on the flattening film 21'. In this example, the flattening layer 21 is not formed in any of the terminal portion formation regions (the source terminal portion formation region, the gate terminal portion formation region, the CS terminal portion formation region, the first transfer terminal portion formation region, and the second transfer terminal portion formation region). The present invention is not limited to the illustrated example. In any case, the upper connection portions 19s, 19g, 19c, 19p1, and 19p2 in the terminal portions are exposed from the flattening layer 21.

After the flattening film 21' is formed or after the flattening film 21' is patterned, the flattening film 21' may be treated by ashing. This treatment can remove a resin that is attached to the patch electrode 15 when the flattening film 21' is formed.

Thus, obtained are the antenna element region U, the source-gate connection portion SG, the source terminal portion ST, the gate terminal portion GT, the CS terminal portion CT, the first transfer terminal portion PT1, and the second transfer terminal portion PT2.

Thus, the TFT substrate 101A is manufactured.

<Method for Manufacturing Slot Substrate 201>

The slot substrate 201 may, for example, be manufactured by the following method.

Initially, a third insulating layer (thickness: 200 nm, for example) 52 is formed on a dielectric substrate. The dielectric: substrate may be a substrate having a high transmittance for electromagnetic waves (i.e., having a small dielectric constant $\varepsilon_M$ and a small dielectric loss tan $\delta_M$), such as a glass substrate or a resin substrate. The dielectric substrate is preferably thin in order to reduce the attenuation of electromagnetic waves. For example, after constituent elements such as the slot electrode 55 are formed on the front surface of the glass substrate in a process described below, the glass substrate may be thinned from the back side thereof. Thus, the thickness of the glass substrate can be reduced to, for example, 500 μm or less.

In the case where a resin substrate is used as the dielectric: substrate, constituent elements such as TFTs may be formed directly on the resin substrate or may be formed on the resin substrate using a transfer method. In the case of the transfer method, for example, after a resin film (e.g., a polyimide film) is formed on a glass substrate, and constituent elements are formed on the resin film by a process described below, the resin film with the constituent elements formed thereon is separated from the glass substrate. In general, resins have a smaller dielectric constant $\varepsilon_M$ and dielectric loss tan $\delta_M$ than those of glasses. The thickness of the resin substrate is, for example, 3 μm to 300 μm. The resin material may, for example, be a liquid crystal polymer as well as a polyimide.

The third insulating layer 52 is not particularly limited, and may, for example, be a silicon oxide ($SiO_2$) film, a silicon nitride ($SiN_x$) film, a silicon oxide nitride ($SiO_xN_y$; x>y) film, a silicon nitride oxide ($SiN_xO_y$; x>y) film, etc., which can be used as appropriate.

Next, a metal film is formed on the third insulating layer 52 and then patterned to obtain the slot electrode 55 having a plurality of slots 57. The metal film may be a Cu film (or an Al film) having a thickness of 2 μm to 5 μm. In this example, a layered film in which a Ti film, a Cu film and a Ti film are stacked in that order is used. Alternatively, a layered film in which a Ti film, a Cu film, and a Ti film are stacked in that order may be formed.

Thereafter, a fourth insulating layer (thickness: 100 nm or 200 nm, for example) 58 is formed on the slot electrode 55 and in the slots 57. The fourth insulating layer 58 may be formed of the same material as that for the third insulating layer. Thereafter, in the non-transmitting/receiving region R2, openings that reach the slot electrode 55 are formed in the fourth insulating layer 58.

Next, a transparent conductive film is formed on the fourth insulating layer 58 and in the openings of the fourth insulating layer 58, and is then patterned to form the upper connection portions 60 that are in contact with the slot electrode 55 in the openings. Thus, the terminal portions IT are obtained.

Thereafter, a photosensitive resin film is formed on the fourth insulating layer 58 and the upper connection portions 60, and is then exposed and developed using a photomask having openings arranged in a predetermined pattern, to form the columnar spacers PS. The photosensitive resin may be either negative or positive. In this example, an acrylic resin film (thickness: 2.7 μm, for example) is used.

Thus, the slot substrate 201 is manufactured.

Note that the TFT substrate may include the columnar spacers PS. In this case, after the TFT substrate 101A is manufactured using the above method, a photosensitive resin film may be formed on the second insulating layer 17 and the flattening layer 21, and then exposed and developed, to form the columnar spacers PS.

<Material and Structure of TFT 10>

In this embodiment, a TFT including the semiconductor layer 5 as the active layer is used as a switching element provided in each pixel. The semiconductor layer 5 is not limited to an amorphous silicon layer, and may be a polysilicon layer or an oxide semiconductor layer.

In the case where an oxide semiconductor layer is used, the oxide semiconductor contained in the oxide semiconductor layer may be either an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor whose c-axis is oriented substantially perpendicularly to the layer surface.

The oxide semiconductor layer may have a layered structure of two or more layers. In the case where the oxide semiconductor layer has a layered structure, the oxide semiconductor layer may include an amorphous oxide semiconductor layer and a crystalline oxide semiconductor layer. Alternatively, the oxide semiconductor layer may include a plurality of crystalline oxide semiconductor layers having different crystalline structures. Alternatively, the oxide semiconductor layer may include a plurality of amorphous oxide semiconductor layers. In the case where the oxide semiconductor layer has a 2-layer structure including an upper layer and a lower layer, the energy gap of the oxide semiconductor contained in the upper layer is preferably greater than the energy gap of the oxide semiconductor contained in the lower layer. Note, however, that in the case where the difference in energy gap between these layers is relatively small, the energy gap of the oxide semiconductor of the lower layer may be greater than the energy gap of the oxide semiconductor of the upper layer.

The material, structure, and film formation method of the amorphous oxide semiconductor, those of the crystalline oxide semiconductors described above, and the structure of the oxide semiconductor layer having a layered structure, etc., are described in, for example, Japanese Laid-open Patent Publication No. 2014-007399. The entire disclosure of Japanese Laid-Open Patent Publication No. 2014-007399 is herein incorporated by reference.

The oxide semiconductor layer may, for example, include at least one metal element of In, Ga, and Zn. In this embodiment, the oxide semiconductor layer includes, for example, an In—Ga—Zn—O-based semiconductor (e.g., indium gallium zinc oxide). As used herein, the In—Ga—Zn—O-based semiconductor is a ternary oxide of In (indium), Ga (gallium), and Zn (zinc). The ratio (composition ratio) of In, Ga, and Zn is not particularly limited, and may, for example, be In:Ga:Zn=2:2:1, In:Ga:Zn=1:1:1, or In:Ga:Zn=1:1:2. Such an oxide semiconductor layer may be formed of an oxide semiconductor film containing the In—Ga—Zn—O-based semiconductor.

The In—Ga—Zn—O-based semiconductor may be either amorphous or crystalline. The crystalline In—Ga—Zn—O-based semiconductor is preferably one whose c-axis is oriented substantially perpendicularly to the layer surface.

Note that the crystalline structure of the crystalline In—Ga—Zn—O-based semiconductor is disclosed in, for example, Japanese Laid-open Patent Publication No. 2014-007399, Japanese Laid-Open Patent Publication No. 2012-134475, Japanese Laid-Open Patent Publication No. 2014-209727, etc., mentioned above. The entire disclosures of Japanese Laid-Open Patent Publication No. 2012-134475 and Japanese Laid-Open Patent Publication No. 2014-209727 are herein incorporated by reference. A TFT including an In—Ga—Zn—O-based semiconductor layer, which has a high mobility (greater than 20 times that of an a-Si TFT) and a lower leakage current (less than 1/100 of that of an a-Si TFT), is suitably used as a driver TFT (e.g., a TFT included in the driving circuit provided in the non-transmitting/receiving region) and a TFT provided in each antenna element region.

The oxide semiconductor layer may contain other oxide semiconductors instead of an In—Ga—Zn—O-based semiconductor. For example, the oxide semiconductor layer may contain an In—Sn—Zn—O-based semiconductor (e.g., $In_2O_3$—$SnO_2$—ZnO; InSnZnO). The In—Sn—Zn—O-based semiconductor is a ternary oxide of In (indium), Sn (tin), and Zn (zinc). Alternatively, the oxide semiconductor layer may contain an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, CdO (cadmium oxicle), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, an Al—Ga—Zn—O-based semiconductor, a Ga—Zn—O-based semiconductor, etc.

In the example shown in FIG. 3, the TFT 10 is a channel-etch TFT having a bottom-gate structure. In the "channel-etch TFT," there is not an etch-stop layer on the channel region, and the lower surfaces of end portions closer to the channel of the source and drain electrodes are disposed in contact with the upper surface of the semiconductor layer. The channel-etch TFT is formed by, for example, forming a source-drain electrode conductive film on a semiconductor layer, and performing source-drain separation. In the source-drain separation step, a surface portion of the channel region may be etched.

Note that the TFT 10 may be an etch-stop TFT in which an etch-stop layer is formed over the channel region. In the etch-st op TFT, the lower surfaces of end portions closer to the channel of the source and drain electrodes are, for example, located on the etch-stop layer. The etch-stop TFT is formed by, for example, forming an etch-stop layer covering a portion of a semiconductor layer that is to serve as the channel region, and thereafter, forming a source-drain electrode conductive film over the semiconductor layer and the etch-stop layer, and performing source-drain separation.

While the TFT 10 has a top-contact structure in which the source and drain electrodes are in contact with the upper surface of the semiconductor layer, the source and drain electrodes may be disposed in contact with the lower surface of the semiconductor layer (bottom-contact structure). Moreover, the TFT 10 may have either a bottom-gate structure in which the gate electrode is provided on a side of the semiconductor layer on which the dielectric substrate is provided, or a top-gate structure in which the gate electrode is provided above the semiconductor layer, (Variations)

A scanned antenna 1000Aa according to a variation of this embodiment and a TFT substrate 101Aa included in the scanned antenna 1000Aa will be described with reference to FIG. 16. The same parts as those of the scanned antenna 1000A and the TFT substrate 101A may be indicated by the same reference signs and may not be described.

Figure 16A:
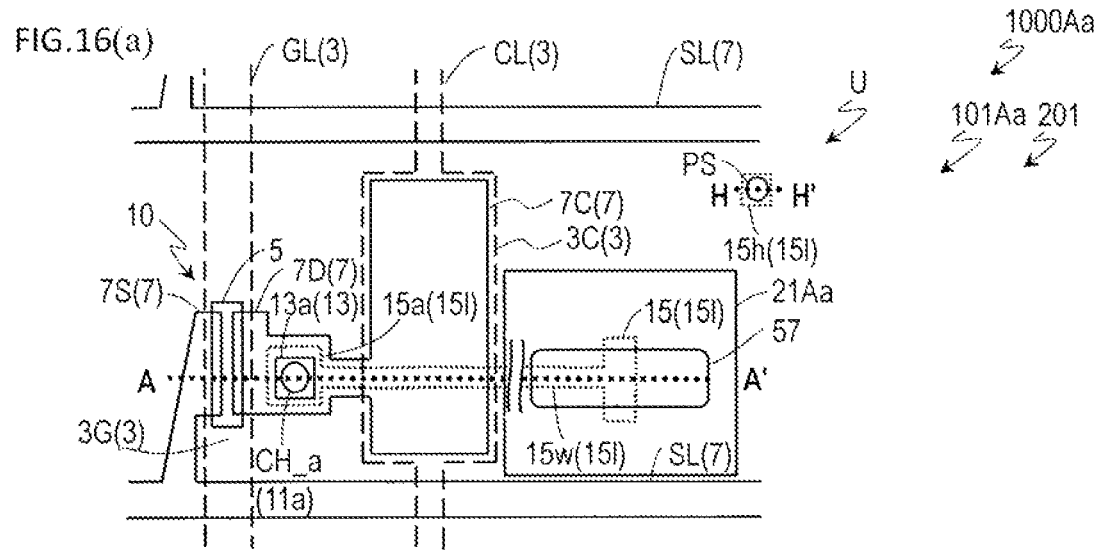
FIG. 16(a) is a schematic plan view of a scanned antenna 1000Aa according to a variation of the first embodiment.
Figure 16B:
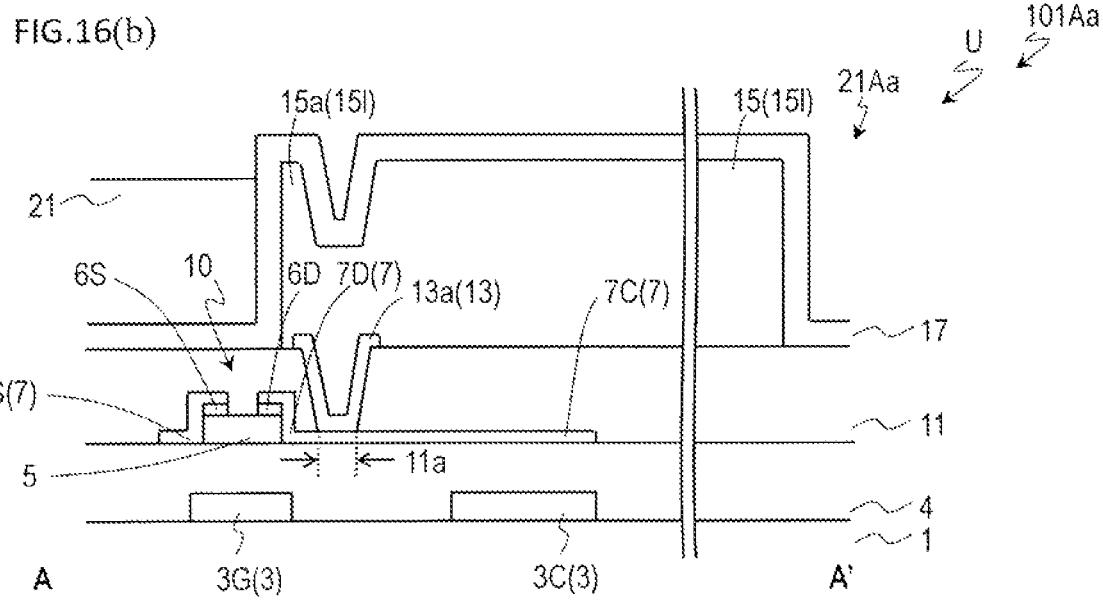
FIG. 16(b) is a schematic cross-sectional view of a TFT substrate 101Aa included in the scanned antenna 1000Aa.

FIG. 16(a) is a schematic plan view of an antenna element region U in a transmitting/receiving region R1 of the scanned antenna 1000Aa. FIG. 16(b) is a schematic cross-sectional view of the TFT substrate 101Aa taken along line A-A' of FIG. 16(a). Note that another cross-section (i.e., an H-H' cross-section) of the antenna element region of the TFT substrate 101Aa is the same as that of the TFT substrate 101A and is not shown or described. The non-transmitting/receiving region R2 of the TFT substrate 101Aa is the same as that of the TFT substrate 101A and is not shown or described.

As shown in FIG. 16, the TFT substrate 101Aa of the scanned antenna 1000Aa is different from the TFT substrate 101A of the scanned antenna 1000A in a shape of the flattening layer 21. The flattening layer 21 of the TFT substrate 101Aa is formed so as not to overlap with the patch electrode 15 or the slot 57 as viewed in the direction normal to the dielectric substrate 1. The flattening layer 21 of the TFT substrate 101Aa includes an opening 21Aa in each antenna element region. The opening 21Aa overlaps with the patch electrode 15 and the slot 57 as viewed in the direction normal to the dielectric substrate.

In the scanned antenna 1000Aa including the TFT substrate 101Aa, the reduction in antenna performance is further prevented or reduced compared to the scanned antenna 1000A.

The TFT substrate 101Aa is manufactured by a manufacturing method similar to that for the TFT substrate 101A, except that the flattening film 21' is patterned into a different shape as appropriate.

Second Embodiment

In the foregoing embodiment, the upper surface of the flattening layer has a height lower than or equal to the upper surface of the patch electrode. In this embodiment, the upper surface of the flattening layer is higher than the upper surface of the patch electrode.

A scanned antenna 1000B according to this embodiment and a TFT substrate 101B included in the scanned antenna 1000B will be described with reference to FIGS. 17-20. The same parts as those of the foregoing embodiment may be indicted by the same reference signs and may not be described.

<Structure (Antenna Element Region U) of TFT Substrate 101B>

A structure of the antenna element region U in the transmitting/receiving region R1 of the scanned antenna 1000B of this embodiment will be described with reference to FIGS. 17(a), 17(b), and 18.

Figure 17A:
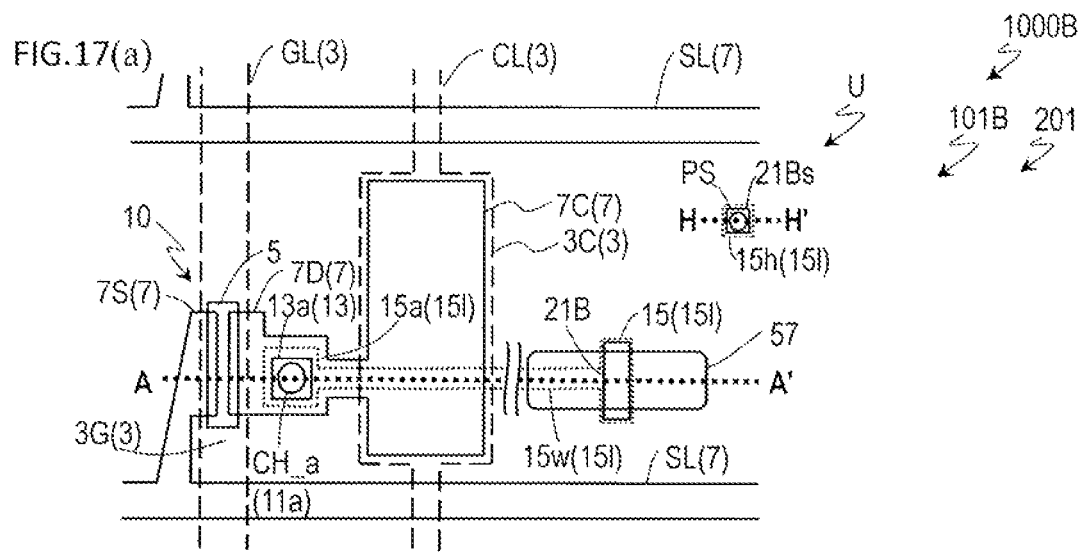
FIG. 17(a) is a schematic plan view of a scanned antenna 1000B according to a second embodiment.
Figure 17B:
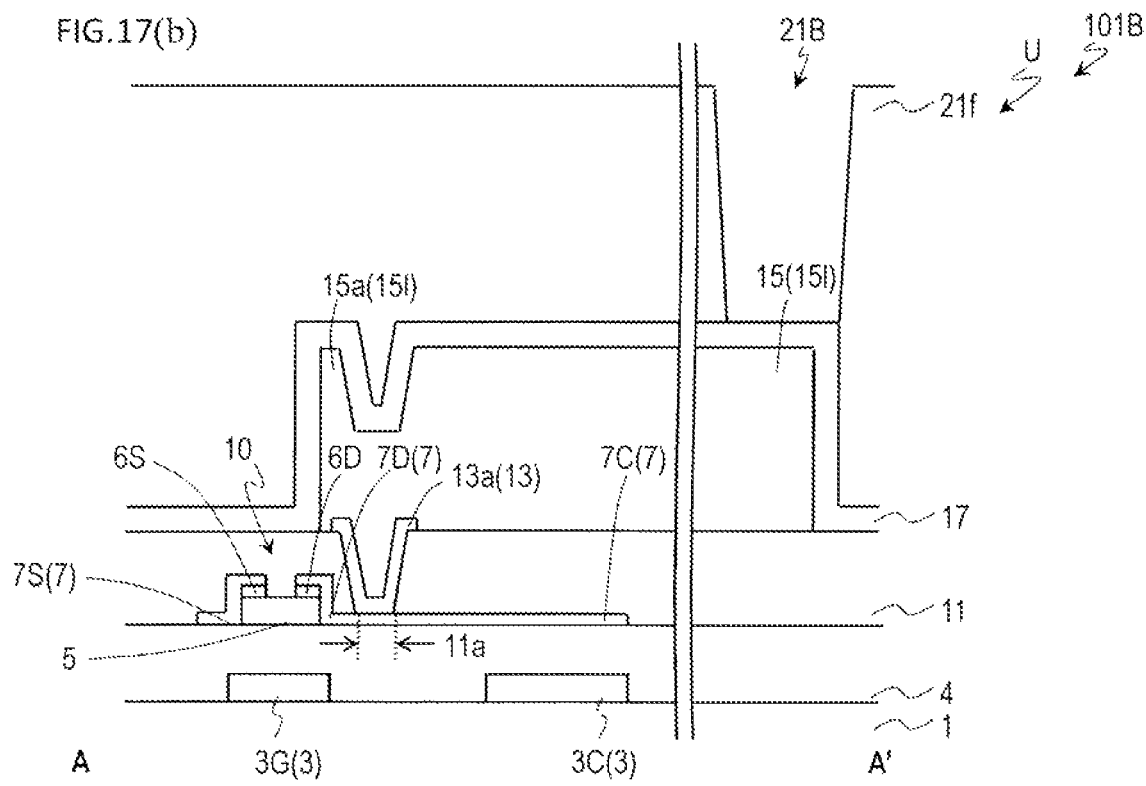
FIG. 17(b) is a schematic cross-sectional view of a TFT substrate 101B included in the scanned antenna 1000B.

FIG. 17(a) is a schematic plan view of the antenna element region U in the transmitting/receiving region R1 of the scanned antenna 1000B. FIG. 17(b) is a schematic cross-sectional view of the TFT substrate 101B included in the scanned antenna 1000B, that is taken along line A-A' of FIG. 17(a). FIG. 18 is a schematic cross-sectional view of a liquid crystal panel 100B included in the scanned antenna 1000B, that is taken along line H-H' of FIG. 17(a).

As shown in FIGS. 3(a), 4(a), and 5(d), in the TFT substrate 101A, the upper surface of the flattening layer 21 is lower than the upper surface of the patch electrode 15. In contrast to this, as shown in FIGS. 17(a), 17(b), and 18, in the TFT substrate 101B, an upper surface of a flattening layer 21f is higher than the upper surface of the patch electrode 15. The flattening layer 21f includes, in each antenna element region U, an opening 21B that overlaps with the patch electrode 15 as viewed in the direction normal to the dielectric substrate 1. At least a portion of the patch electrode 15 overlaps with the opening 21B of as viewed in the direction normal to the dielectric substrate 1. As a result, a reduction in antenna performance due to the presence of the flattening layer 21f can be prevented or reduced in the scanned antenna 1000B including the TFT substrate 101B.

It is preferable, in terms of antenna performance, that the flattening layer 21f should not overlap with the patch electrode 15 as viewed in the direction normal to the dielectric: substrate 1. It is more preferable that the flattening layer 21f should not overlap with the patch electrode 15 or the slot 57. Note, however, that as the shape of the opening included in the flattening layer 21f increases, the effect of reducing the volume of the liquid crystal layer LC decreases.

It is preferable, in terms of antenna performance, that the difference in height between the upper surface of the flattening layer 21f and the upper surface of the patch electrode 15 should, for example, be 500 nm or less. The difference in height between the upper surface of the flattening layer 21f and the upper surface of the patch electrode 15 is preferably, for example, 23% or less of the thickness d1 (see FIG. 1) of the liquid crystal layer LC between the patch electrode 15 and the slot electrode 55.

Figure 18:
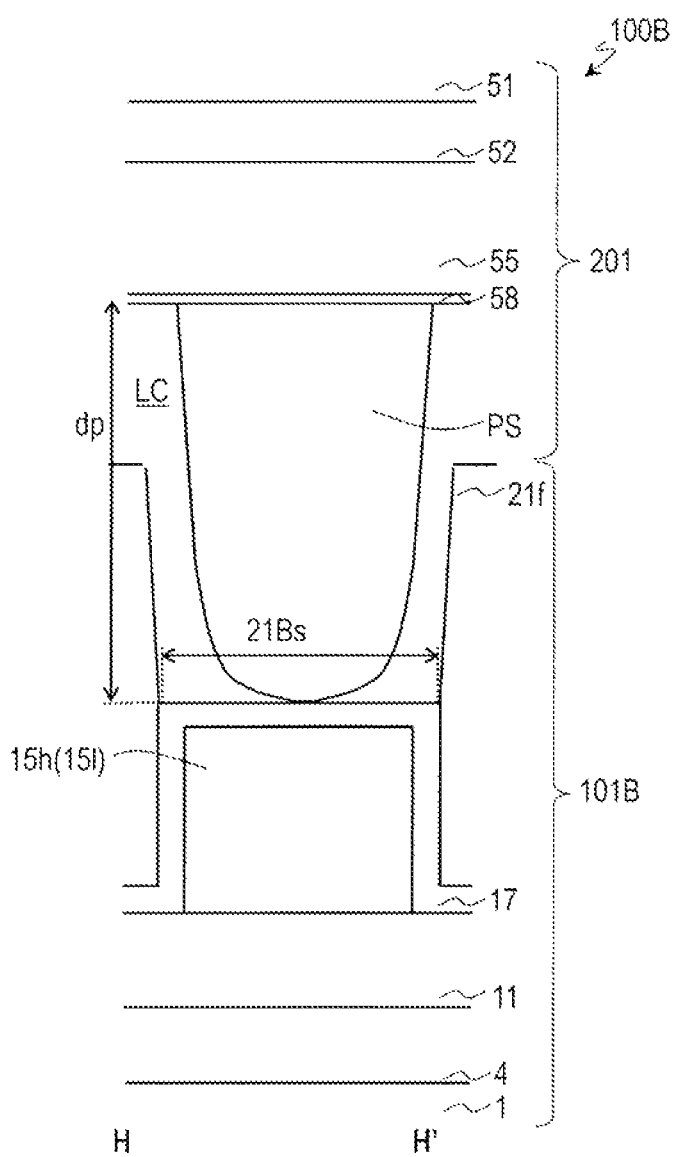
FIG. 18 is a schematic cross-sectional view of a liquid crystal panel 100B included in the scanned antenna 1000B.

As shown in FIGS. 17(a) and 18, the flattening layer 21f of the TFT substrate 101B further includes, in the antenna element region U, an opening 21Bs that overlaps with the columnar spacer PS as viewed in the direction normal to the dielectric substrate 1. The flattening layer 21f is formed so as not to overlap the columnar spacer PS as viewed in the direction normal to the dielectric substrate 1. As a result, the thickness d1 (see FIG. 1) of the liquid crystal layer LC between the patch electrode 15 and the slot electrode 55 can advantageously be controlled with high precision. This is because, in this example, the thickness d1 of the liquid crystal layer LC between the patch electrode 15 and the slot electrode 55 is defined only by the height of the columnar spacer PS. In other words, the thickness d1 is not affected by variations in the thickness of the flattening layer 21f. The height of the columnar spacer PS corresponds to the thickness dp (see FIG. 18) of the liquid crystal layer LC defined by the columnar spacer PS, and is the same as the height of the columnar spacer PS of the scanned antenna 1000A (see FIG. 5(d)).

Figure 23A:
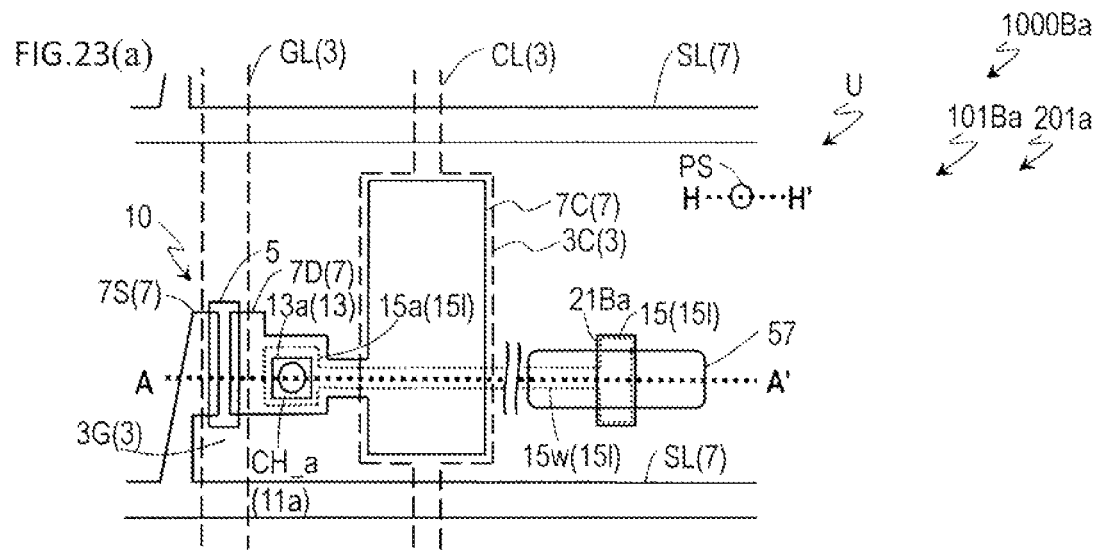
FIG. 23(a) is a schematic plan view of a scanned antenna 1000Ba according to a variation of the second embodiment.
Figure 23B:
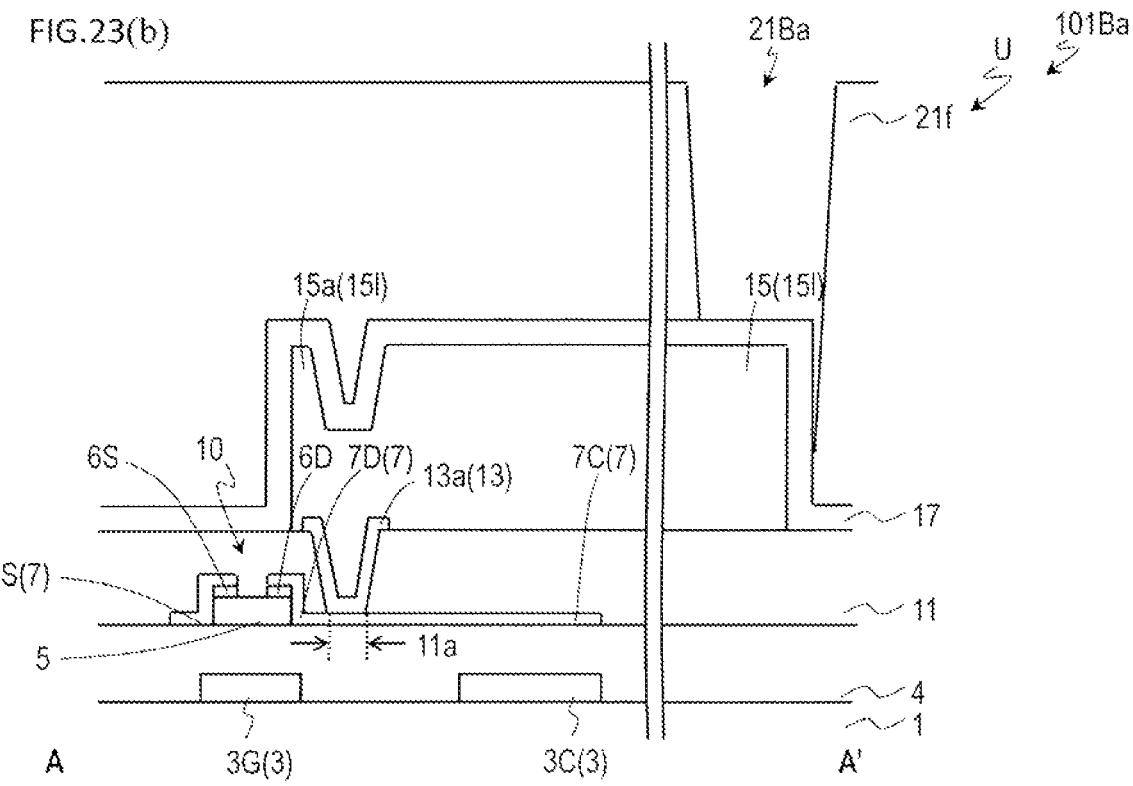
FIG. 23(b) is a schematic cross-sectional view of a TFT substrate 101Ba included in the scanned antenna 1000Ba.
Figure 24:
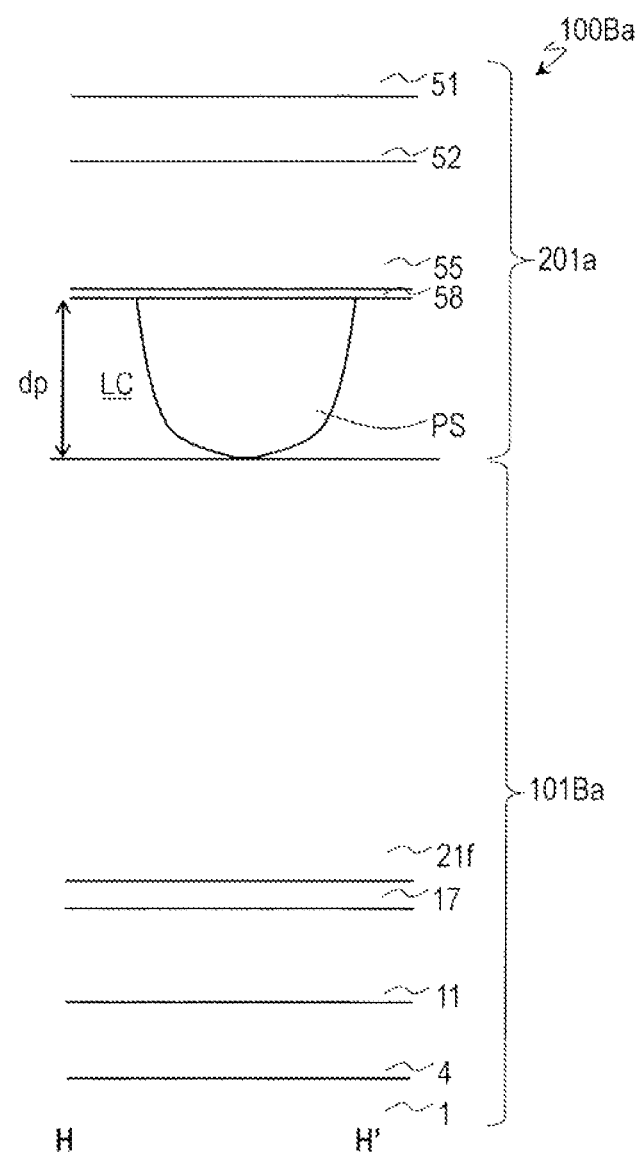
FIG. 24 is a schematic cross-sectional view of a liquid crystal panel 100Ba included in the scanned antenna 1000Ba.

Note that the opening 21Bs may be omitted (e.g., see variations shown in FIGS. 23 and 24). In the case where the opening 21Bs is not provided, the precision of the control of the thickness d1 of the liquid crystal layer LC between the patch electrode 15 and the slot electrode 55 may be deteriorated. This is because, in the absence of the opening 21Bs, the thickness d1 of the liquid crystal layer LC between the patch electrode 15 and the slot electrode 55 is determined by the height of the columnar spacer and the thickness of the flattening layer 21f. Note, however, that if the opening 21Bs is omitted, the volume of the liquid crystal layer LC and the material for the columnar spacer PS are advantageously further reduced.

<Structure (Non-Transmitting/Receiving Region R2) of TFT Substrate 101B>

A structure of the non-transmitting/receiving region R2 of the TFT substrate 101B will be described with reference to FIGS. 19 and 20. FIGS. 19(a)-19(d) and 20 are schematic cross-sectional views of the non-transmitting/receiving region R2 of the TFT substrate 101B. The non-transmitting/receiving region R2 of the TFT substrate 101B has the same plan view as that of the TFT substrate 101A shown in FIGS. 3(b) and 3(c), and therefore, will also be described with reference to FIGS. 3(b) and 3(c).

Figure 19A:
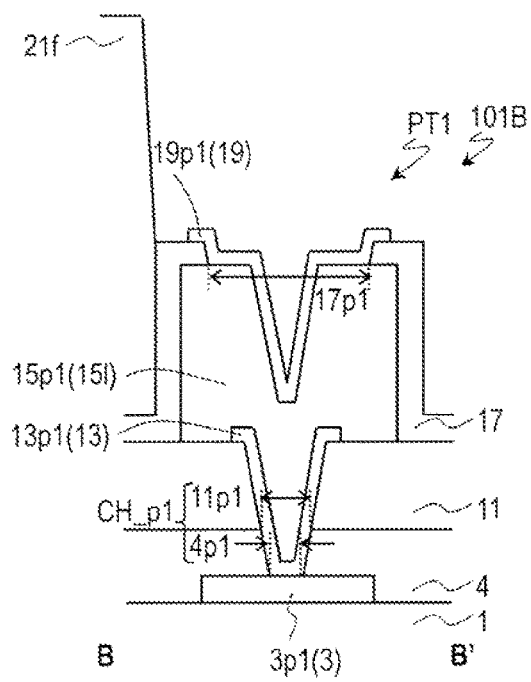
FIGS. 19(a)-19(d) are schematic cross-sectional views of the TFT substrate 101B.
Figure 19B:
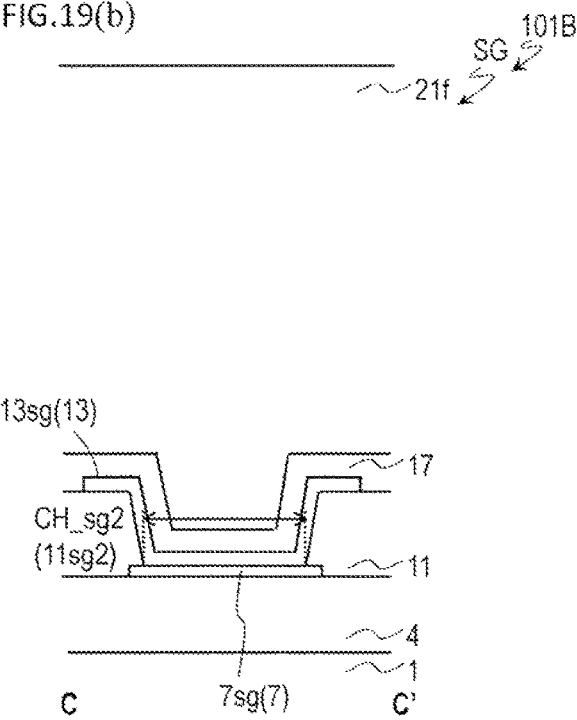
Figure 19C:
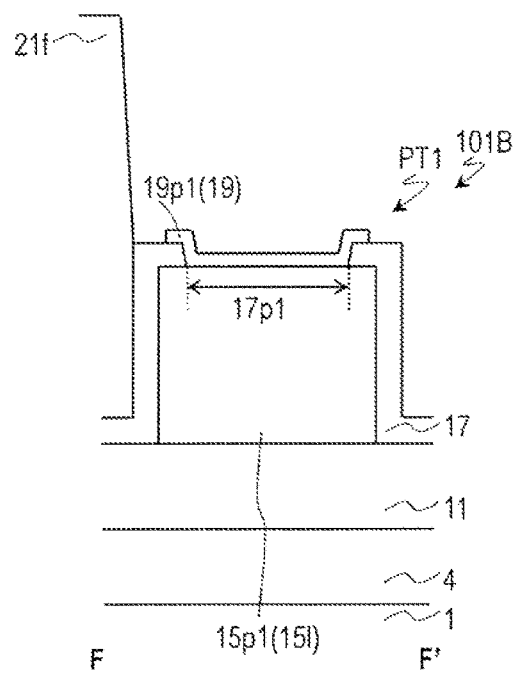
Figure 19D:
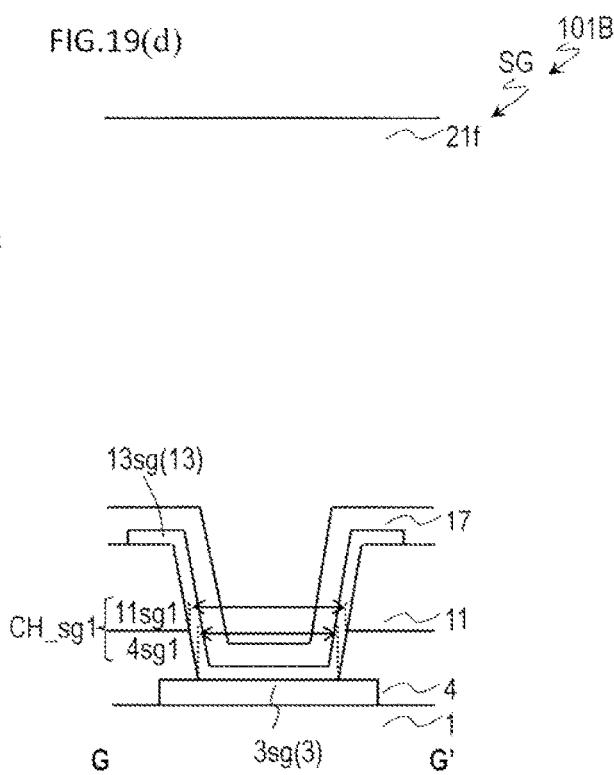
Figure 20:
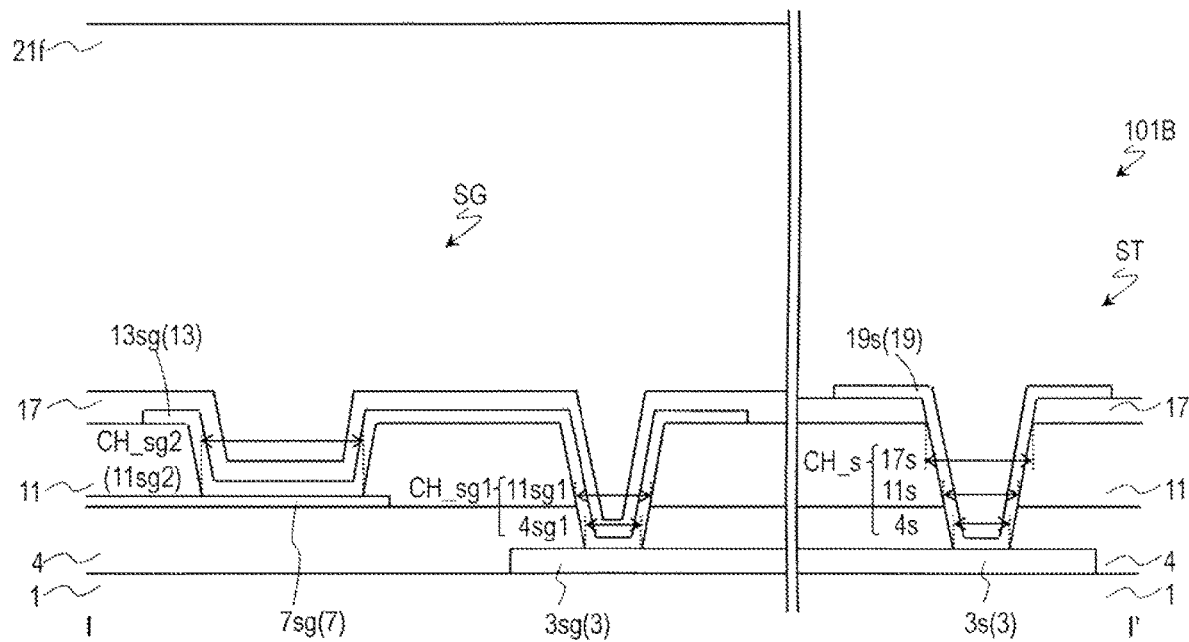
FIG. 20 is a schematic cross-sectional view of the TFT substrate 101B.

FIG. 19(a) shows a cross-section of the first transfer terminal portion PT1 taken along line B-B' of FIG. 3(b). FIG. 19(b) shows a cross-section of the source-gate connection portion SG taken along line C-C' of FIG. 3(c). FIG. 19(c) shows a cross-section of the first transfer terminal portion PT1 taken along line F-F' of FIG. 3(b). FIG. 19(d) snows a cross-section of the source-gate connection portion SG taken along line G-G' of FIG. 3(c). FIG. 20 shows cross-sections of the source-gate connection portion SG and the source terminal portion ST taken along line I-I' of FIG. 3(c). Note that other cross-sections of the TFT substrate 101B are the same as those of the TFT substrate 101A, and are not shown or described.

As shown in FIGS. 19(a) 19(d) and 20, the structure of the non-transmitting/receiving region R2 of the TFT substrate 101B is different from that of the TFT substrate 101A in the thickness (or the height of the upper surface) of the flattening layer 21f. Specifically, the thickness of the flattening layer 21f is greater than the thickness of the flattening layer 21 of the TFT substrate 101A. The upper surface of the flattening layer 21f is higher than the upper surface of the flattening layer 21 of the TFT substrate 101A.

<Method for Manufacturing TFT Substrate 101B>

A method for manufacturing the TFT substrate 101B will be described with reference to FIGS. 21 and 22.

FIGS. 21(a), 21(b), 22(a), and 22(b) are schematic cross-sectional views for describing a method for manufacturing the TFT substrate 101B. These figures show cross-sections corresponding to FIGS. 4(a), 4(b), 4(e), 4(c), 4(d), 5(b), and 5(d) (A-A', B-B', E-E', C-C', D-D', G-G', and H-H' cross-sections of the TFT substrate 101A). In the description that follows, differences from the method for manufacturing the TFT substrate 101A described with reference to FIGS. 8-15 will be described.

Initially, as shown in FIGS. 8(a)-8(g), 9(a)-9(g), 10(a)-10(d), 11(a)-11(d), 12(a)-12(d), 13(a)-13(d), 14(a), and 15(a), on the dielectric substrate 1, formed are the gate metal layer 3, the gate insulating layer 4, the island-shaped semiconductor layer 5, the contact layers 6S and 6D, the source metal layer 7, the first insulating layer 11, the lower conductive layer 13, the patch metal layer 151, the second insulating layer 17, and the upper conductive layer 19.

Figure 21A:
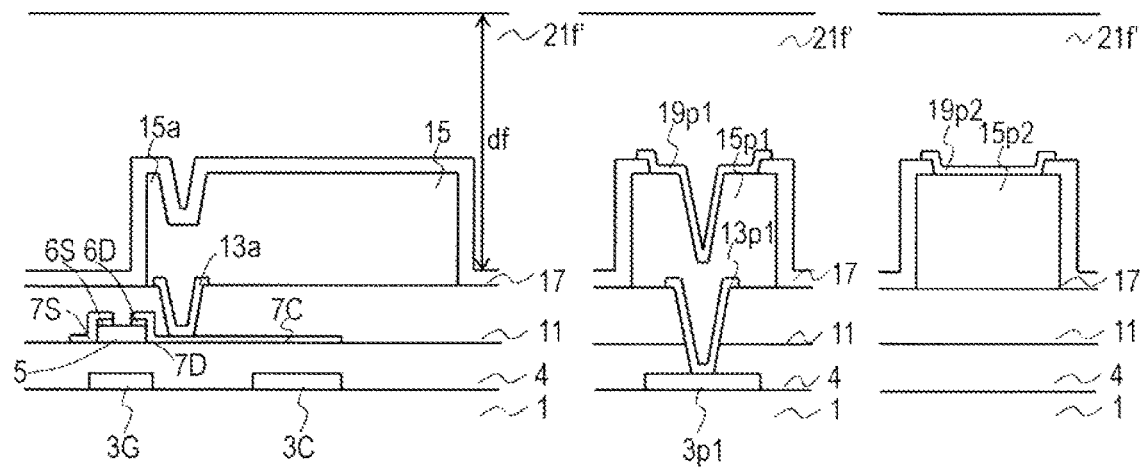
FIGS. 21(a) and 21(b) are schematic cross-sectional views for describing a method for manufacturing the TFT substrate 101B.
Figure 22A:
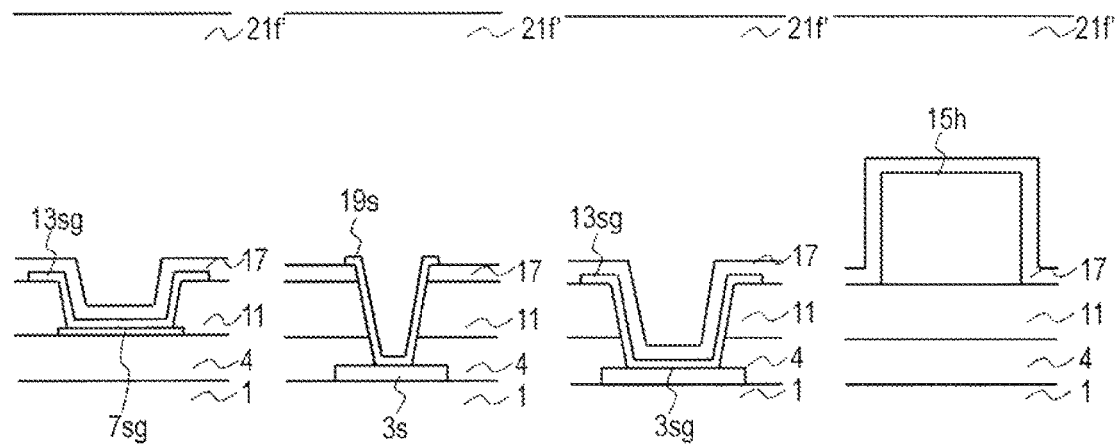
FIGS. 22(a) and 22(b) are schematic cross-sectional views for describing a method for manufacturing the TFT substrate 101B.

Next, as shown in FIGS. 21(a) and 22(a), a flattening film 21f' is formed substantially throughout the entire surface of the dielectric substrate 1. In this example, as the flattening film 21f', for example, an acrylic resin film having a thickness df (see FIG. 21(a)) of 1000 nm is formed. In this example, the flattening film 21f' is formed so as to have an upper surface higher than the upper surface of the patch electrode 15. The flattening film 21f' is formed so as to cover the second insulating layer 17 and the upper conductive layer 19.

Figure 21B:
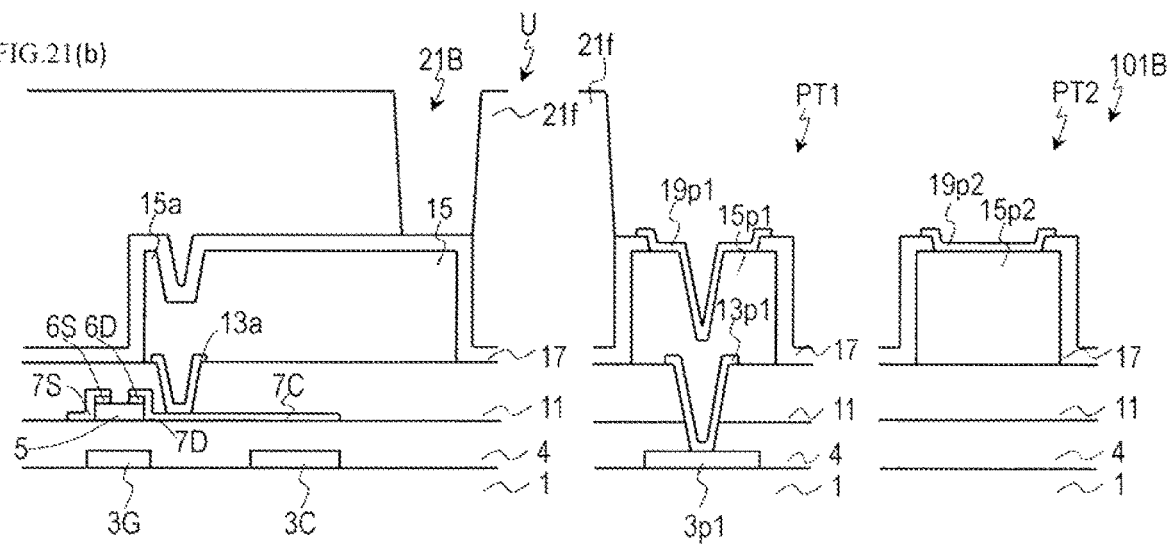
Figure 22B:
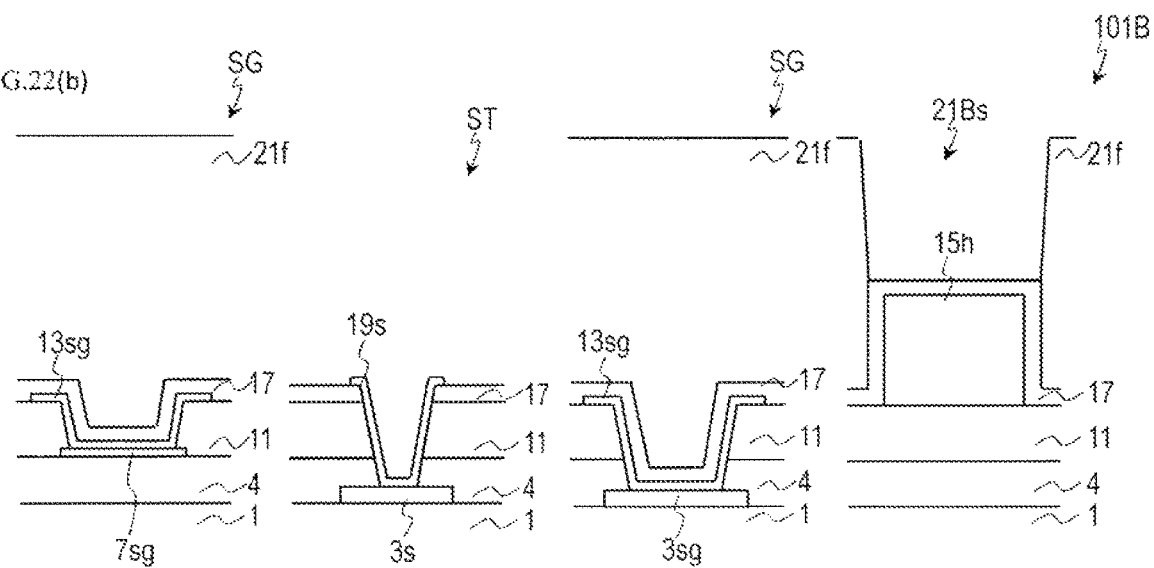

Next, as shown in FIGS. 21(b) and 22(b), the flattening film 21f' is patterned to form the flattening layer 21f. In this example, the flattening layer 21f is not formed in any of the terminal portion formation regions (the source terminal portion formation region, the gate terminal portion formation region, the CS terminal portion formation region, the first transfer terminal portion formation region, and the second transfer terminal portion formation region). In the antenna element formation region, the opening 21B overlapping with the patch electrode 15, and the opening 21Bs overlapping with the protruding portion 15h, are formed. Because the opening 21B is formed, at least a portion of the patch electrode 15 does not overlap with the flattening layer 21f.

Thus, obtained are the antenna element region U, the source-gate connection portion SG, the source terminal portion ST, the gate terminal portion GT, the CS terminal portion CT, the first transfer terminal portion PT1, and the second transfer terminal portion PT2.

Thus, the TFT substrate 101B is manufactured,
(Variations)

A scanned antenna 1000Ba according to a variation of this embodiment, and a TFT substrate 101Ba and a slot substrate 201a included in the scanned antenna 1000Ba, will be described with reference to FIGS. 23 and 24. The same parts as those of the scanned antenna 1000B, the TFT substrate 101B, and the slot substrate 201 may be indicated by the same reference signs and may not be described.

FIG. 23(a) is a schematic plan view of the antenna element region U in the transmitting/receiving region R1 of the scanned antenna 1000Ba. FIG. 23(b) is a schematic cross-sectional view of the TFT substrate 101Ba included in the scanned antenna 1000Ba, that is taken along line A-A' of FIG. 23(a). FIG. 24 is a schematic cross-sectional view of a liquid crystal panel 100Ba included in the scanned antenna 1000Ba, that is taken along line H-H' of FIG. 23(a). Note that the no n-transmitting/receiving region R2 of the TFT substrate 101Ba is the same as that of the TFT substrate 101B and is not shown or described.

As shown in FIGS. 23 and 24, the TFT substrate 101Ba of the scanned antenna 1000Ba is different from the TFT substrate 101B of the scanned antenna 1000B in the patterned shape of the flattening layer 21f.

As shown in FIGS. 23(a) and 23(b), the flattening layer 21f of the TFT substrate 101Ba is formed so as not to overlap with the patch electrode 15 as viewed in the direction normal to the dielectric substrate 1. The flattening layer 21f of the TFT substrate 101Ba includes, in each antenna element region U, an opening 21Ba that overlaps with the entire patch electrode 15 as viewed in the direction normal to the dielectric substrate 1. In the scanned antenna 1000Ba including the TFT substrate 101Ba, the reduction in antenna performance is further prevented or reduced compared to the scanned antenna 1000B.

As shown in FIGS. 23(a) and 24, the flattening layer 21f of the TFT substrate 101Ba does not include an opening that overlaps with the columnar spacer PS in the antenna element region U. In other words, the flattening layer 21f is formed so as to overlap with the columnar spacer PS as viewed in the direction normal to the dielectric substrate 1. As a result, the thickness dp (see FIG. 24) of the liquid crystal layer LC defined by the columnar spacer PS is smaller than that of the TFT substrate 101B (see FIG. 18). Therefore, in the scanned antenna 1000Ba including the TFT substrate 101Ba, the volume of the liquid crystal layer LC and the material for the columnar spacer PS are significantly reduced compared to the scanned antenna 1000B. The TFT substrate 101Ba is also different from the TFT substrate 101B in that the TFT substrate 101Ba does not include the protruding portion 15h. Although the protruding portion 15h is not provided in the scanned antenna 1000Ba, the volume of the liquid crystal layer LC and the material for the columnar spacer PS are advantageously reduced.

The TFT substrate 101Ba is manufactured by a method similar to that for the TFT substrate 101B, except that the patch conductive film 151' and the flattening film 21f' are patterned into a different shape as appropriate.

The slot substrate 201a is manufactured by a method similar to that for the slot substrate 201, except that the thickness of the photosensitive resin film for forming the columnar spacers is adjusted as appropriate.

Third Embodiment

This embodiment is characterized in that a surface of an opening included in a flattening layer has a small taper angle.

A scanned antenna 1000C according to this embodiment and a TFT substrate 101C included in the scanned antenna 1000C will be described with reference to FIGS. 25-27. The same parts as those of the foregoing embodiments may be indicated by the same reference signs and may not be described.

<Structure (Antenna Element Region U) of TFT Substrate 101C>

A structure of the antenna element region U in the transmitting/receiving region R1 of the scanned antenna 1000C of this embodiment will be described with reference to FIGS. 25(a), 25(b), and 26.

Figure 25A:
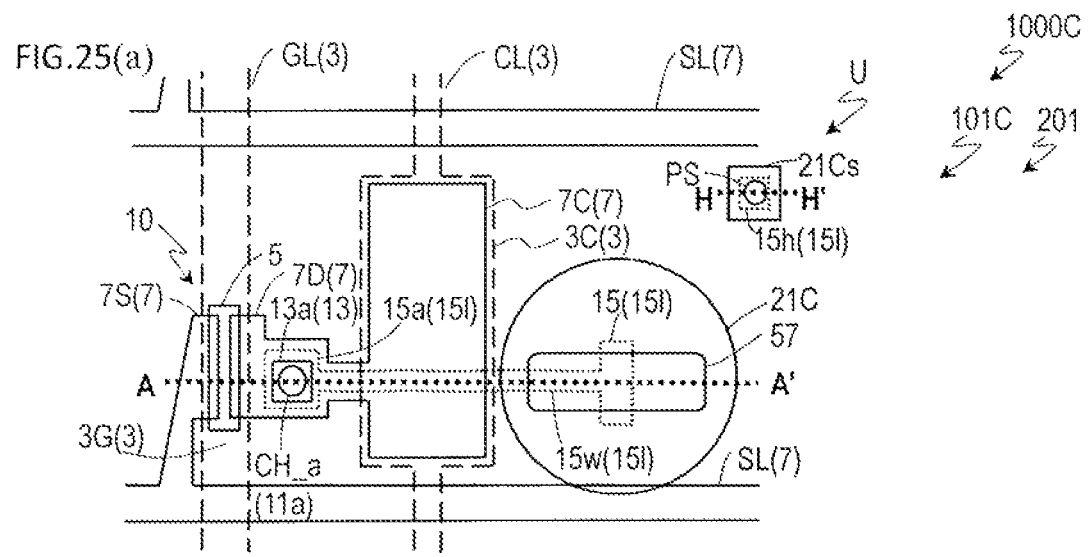
FIG. 25(a) is a schematic plan view of a scanned antenna 1000C according to a third embodiment.

FIG. 25(a) is a schematic plan view of the antenna element region U in the transmitting/receiving region R1 of the scanned antenna 1000C. FIG. 25(b) is a schematic cross-sectional view of the TFT substrate 101C included in the scanned antenna 1000C, that is taken along line A-A' of FIG. 25(a). FIG. 26 is a schematic cross-sectional view of a liquid crystal panel 100C included in the scanned antenna 1000C, that is taken along line H-H' of FIG. 25(a).

Figure 25B:
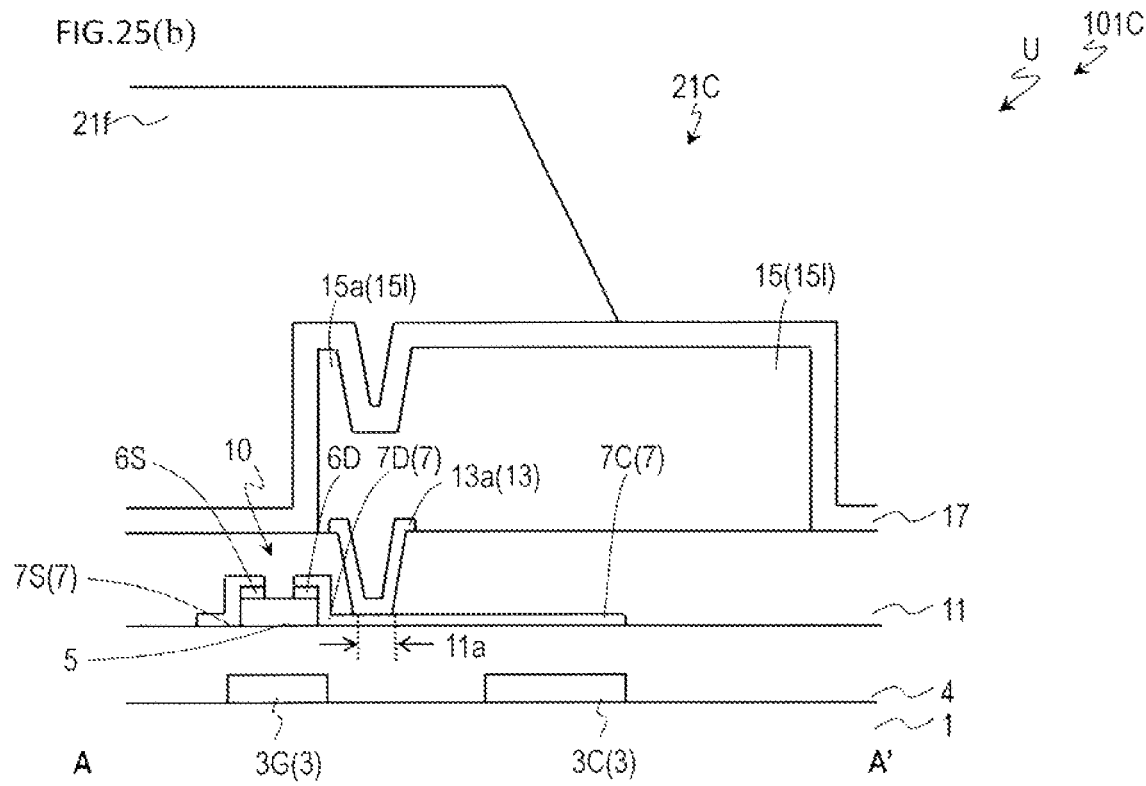
FIG. 25(b) is a schematic cross-sectional view of a TFT substrate 101C included in the scanned antenna 1000C.
Figure 26:
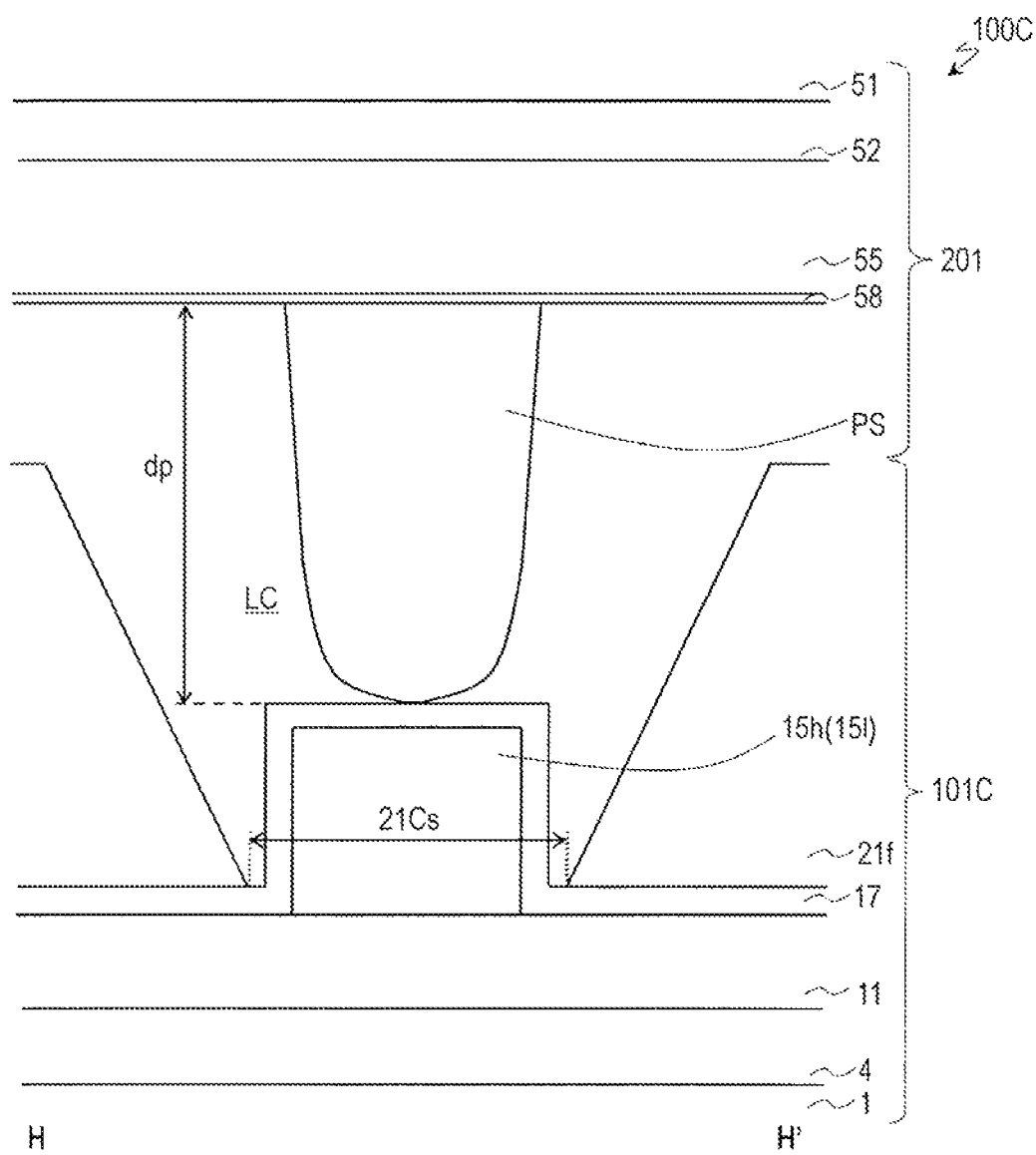
FIG. 26 is a schematic cross-sectional view of a liquid crystal panel 100C included in the scanned antenna 1000C.

As shown in FIGS. 25(a), 25(b), and 26, the flattening layer 21f includes, in each antenna element region U, an opening 21C that does not overlap with the patch electrode 15 or the slot 57 as viewed in the direction normal to the dielectric substrate 1. The flattening layer 21f is formed so as not to overlap with the patch electrode 15 or the slot 57 as viewed in the direction normal to the dielectric substrate 1. The opening 21C is different from the opening 21B included in the flattening layer 21f of the TFT substrate 101B in that a side surface of the opening 21C has a small taper angle, and in a shape as viewed from above. The taper angle of the side surface of the opening 21C is preferably, for example, 70° or less. The shape of the opening 21C as viewed from above is preferably circular or elliptical. In the scanned antenna 1000C including the TFT substrate 101C, in which the flattening layer 21f having the opening 21C is provided, the reduction of antenna performance is effectively prevented or reduced compared to the scanned antenna 1000B including the TFT substrate 101B.

A reason why the reduction of antenna performance is prevented or reduced in the scanned antenna 1000C will be described.

In the scanned antenna 1000B, the reduction of antenna performance may not be sufficiently prevented or reduced. The antenna performance is particularly affected by the aligned state of liquid crystal molecules near the patch electrode 15 and the slot 57. The alignment of liquid crystal molecules is affected by, for example, a shape (e.g., a height difference (step)) of a surface of the TFT substrate closer to the liquid crystal layer. As the thickness of the flattening layer 21f increases (i.e., the upper surface of the flattening layer 21f is higher), the height difference (step) of a surface of the TFT substrate closer to the liquid crystal layer LC, that is formed by an opening, increases. The flattening layer 21f of the TFT substrate 101B included in the scanned antenna 1000B has the opening 21B overlapping with at least a portion of the patch electrode 15, and therefore, the alignment of liquid crystal molecules near the patch electrode 15 and the slot 57 is easily affected by a height difference (step) formed by the opening 21B. As a result, the antenna performance may not be sufficient.

In contrast to this, the side surface of the opening 21C in the flattening layer 21f of the TFT substrate 101C included in the scanned antenna 1000C has a taper angle of as small as, for example, 70° or less, and therefore, the alignment of liquid crystal molecules is less affected. Therefore, in the scanned antenna 1000C, the reduction of antenna performance is prevented or reduced compared to the scanned antenna 1000B.

In addition, the opening 21C in the flattening layer 21f of the TFT substrate 101C included in the scanned antenna 1000C has a circular or elliptical shape as viewed from above, and therefore, has less influence on the alignment of liquid crystal molecules compared to the scanned antenna 1000B, in which the opening 21B has a rectangular shape as viewed from above.

Note that an edge of the opening 21C in the plan view of FIG. 25(a) is of a lower end (closer to the dielectric substrate 1) of the side surface of the opening 21C. The same is true of other plan views and openings unless otherwise specified. The phrase "the flattening layer 21f is formed so as not to overlap with the patch electrode 15 or the slot 57 as viewed in the direction normal to the dielectric substrate 1" means that an innermost edge of the opening 21C as viewed in the direction normal to the dielectric substrate 1 does not overlap with the patch electrode 15 or the slot 57. For example, if the side surface of the opening 21C has a taper angle of less than 90° (i.e., the opening 21C has a forward-tapered side surface), an edge at a lower end (closer to the dielectric substrate 1) of the side surface of the opening 21C is the innermost edge of the opening 21C as viewed in the direction normal to the dielectric substrate 1.

As shown in FIGS. 25(a) and 26, the flattening layer 21f of the TFT substrate 101C further includes, in the antenna element region U, am opening 21Cs that overlaps with the columnar spacer PS as viewed in the direction normal to the dielectric substrate 1. The flattening layer 21f is formed so as not to overlap with the columnar spacer PS as viewed in the direction normal to the dielectric substrate 1. The columnar spacer PS has a height corresponding to the thickness dp (see FIG. 26) of the liquid crystal layer LC defined by the columnar spacer PS, and is the same as the height of the columnar spacer PS of the scanned antenna 1000A (see FIG. 5(d)). The side surface of the opening 21Cs may have a taper angle of 70° or less. Note, however, that if the columnar spacer PS is disposed at a sufficient distance from the patch electrode 15, then even in the case where the side surface of the opening 21Cs has a taper angle of more than 70°, the antenna performance is not significantly affected.

<Structure (Non-Transmitting/Receiving Region R2) of TFT Substrate 101C>

A structure of the non-transmitting/receiving region R2 of the TFT substrate 101C will be described with reference to FIG. 27. FIGS. 27(a) and 27(b) are schematic cross-sectional views of the non-transmitting/receiving region R2 of the TFT substrate 101C. The non-transmitting/receiving region R2 of the TFT substrate 101C has the same plan view as that of the TFT substrate 101A shown in FIGS. 3(b) and 3(c), and therefore, will be described with reference to FIGS. 3(b) and 3(c).

Figure 27A:
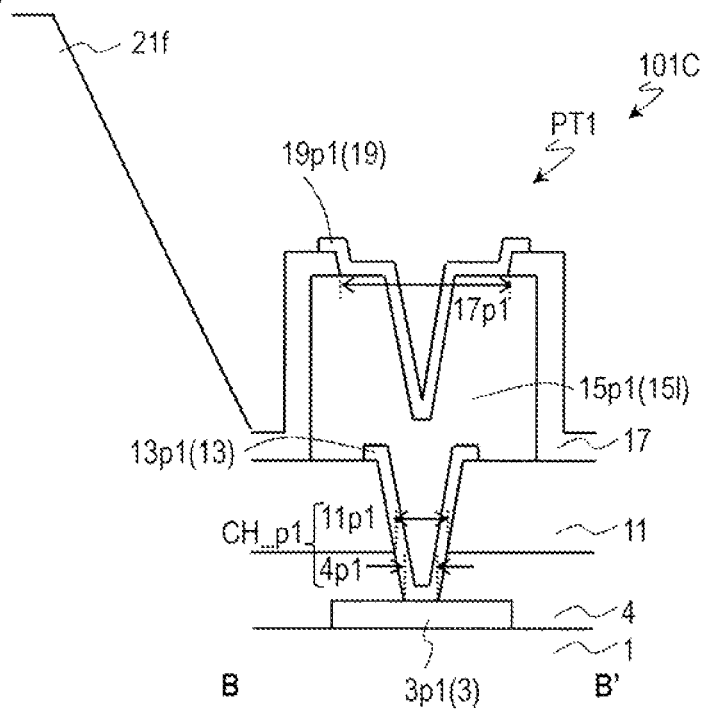
FIGS. 27(a) and 27(b) are schematic cross-sectional views of the TFT substrate 101C.

FIG. 27(a) shows a cross-section of the first transfer terminal portion PT1 taken along line B-B' of FIG. 3(b). FIG. 27(b) shows a cross-section of the first transfer terminal portion PT1 taken along line F-F' of FIG. 3(b). Note that other cross-sections of the TFT substrate 101C are the same as those of the TFT substrate 101B, and are not shown or described.

Figure 27B:
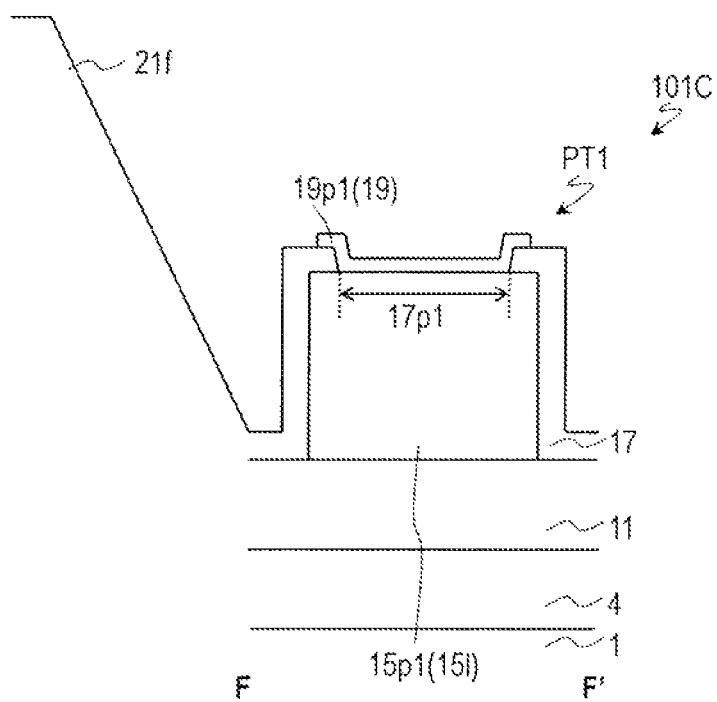

As shown in FIGS. 27(a) and 27(b), the structure of the non-transmitting/receiving region R2 of the TFT substrate 101C is different from that of the TFT substrate 101B in that the side surface of the flattening layer 21f of the TFT substrate 101C has a smaller taper angle.

The TFT substrate 101C is manufactured by a method similar to that for the TFT substrate 101B, except that the flattening film 21f is patterned into a different shape, and the taper angle of the side surface is changed, as appropriate.

(Variations)

Figure 28A:
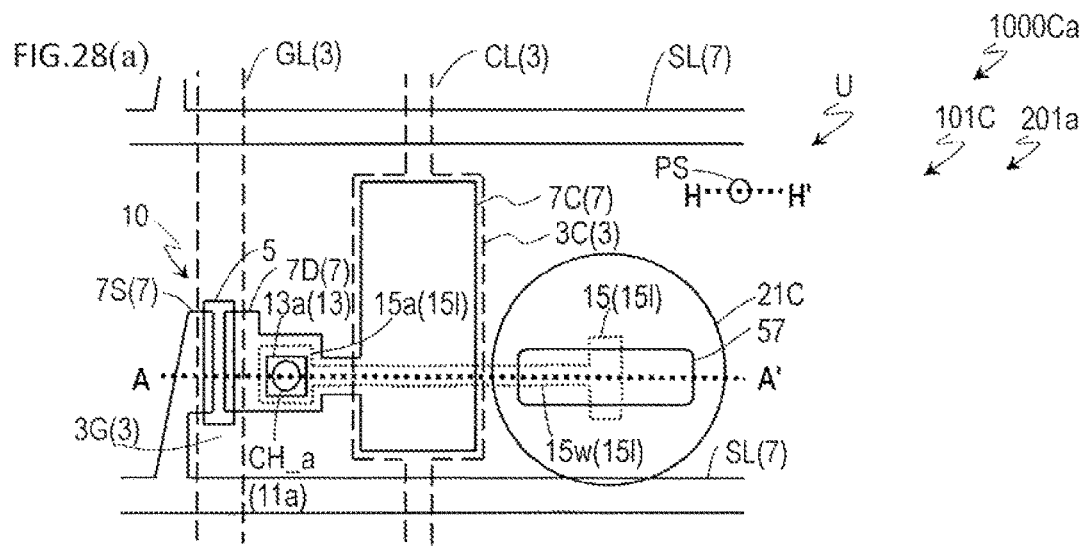
FIG. 28(a) is a schematic plan view of a scanned antenna 1000Ca according to a variation of the third embodiment.
Figure 28B:
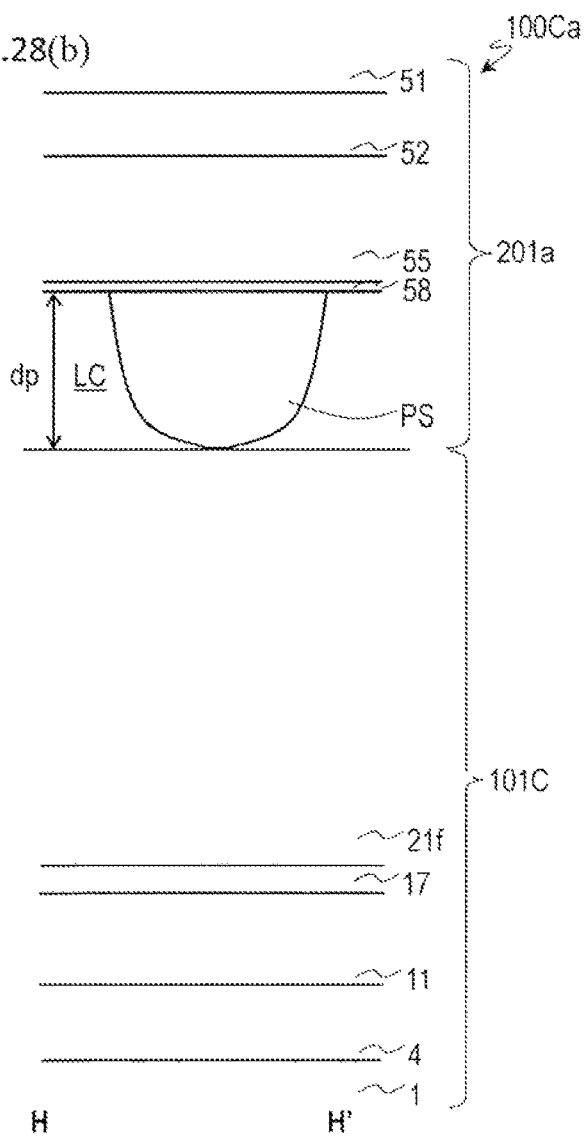
FIG. 28(b) is a schematic cross-sectional view of a liquid crystal panel 100Ca included in the scanned antenna 1000Ca.

A scanned antenna 1000Ca according to a variation of this embodiment, and a TFT substrate 101Ca and a slot substrate 201a included in the scanned antenna 1000Ca, will be described with reference to FIG. 28. The same parts as those of the scanned antenna 1000C and the TFT substrate 101C may be indicted by the same reference signs and may not be described. The slot substrate 201a has a structure similar to that of the slot substrate 201a included in the scanned antenna 1000Ba, FIG. 28(a) is a schematic plan view of the antenna element region U in the transmitting/receiving region R1 of the scanned antenna 1000Ca. FIG. 28(b) is a schematic cross-sectional view of a liquid crystal panel 100Ca included in the scanned antenna 1000Ca, that is taken along line H-H' of FIG. 28(a). Note that another cross-section (i.e., an A-A' cross-section) of the antenna element region of the TFT substrate 101Ca is the same as that of the TFT substrate 101C, and is not shown or described. The non-transmitting/receiving region R2 of the TFT substrate 101Ca is the same as that of the TFT substrate 101C, and is not shown or described.

As shown in FIGS. 28(a) and 28(b), the flattening layer 21f of the TFT substrate 101Ca is different from that of the TFT substrate 101C in that the flattening layer 21f of the TFT substrate 101Ca does not include an opening overlapping with the columnar spacer PS in the antenna element region U. As a result, a thickness dp (see FIG. 28(b)) of the liquid crystal layer LC defined by the columnar spacer PS is smaller than that of the TFT substrate 101C (see FIG. 26). Therefore, in the scanned antenna 1000Ca including the TFT substrate 101Ca, the volume of the liquid crystal layer LC and the material for the columnar spacer PS are significantly reduced compared to the scanned antenna 1000C. The TFT substrate 101Ca is also different from the TFT substrate 101C in that the TFT substrate 101Ca does not include the protruding portion 15h. Although the protruding portion 15h is not provided in the scanned antenna 1000Ca, the volume of the liquid crystal layer LC and the material for the columnar spacer PS are advantageously reduced.

The TFT substrate 101Ca is manufactured by a method similar to that for the TFT substrate 101C, except that the patch conductive film 151' and the flattening film 21f are patterned into a different shape as appropriate.

Fourth Embodiment

This embodiment is different from the foregoing embodiments in the positional relationship between the gate metal layer including the gate electrode of the TFT and the source metal layer including the source electrode of the TFT. This embodiment is also different from the foregoing embodiments in that the patch electrode is included in the gate metal layer. This embodiment may be applied to any of the foregoing embodiments.

A scanned antenna 1000D according to this embodiment and a TFT substrate 101D included in the scanned antenna 1000D will be described with reference to FIGS. 29-31. The same parts as those of the foregoing embodiments may be indicated by the same reference signs and may not be described.

<Structure (Antenna Element Region U) of TFT Substrate 101D>

A structure of the antenna element region U in the transmitting/receiving region R1 of the scanned antenna 1000D of this embodiment will be described with reference to portion (a) of FIG. 29, FIG. 30(a), and FIG. 31(d).

Figure 29:
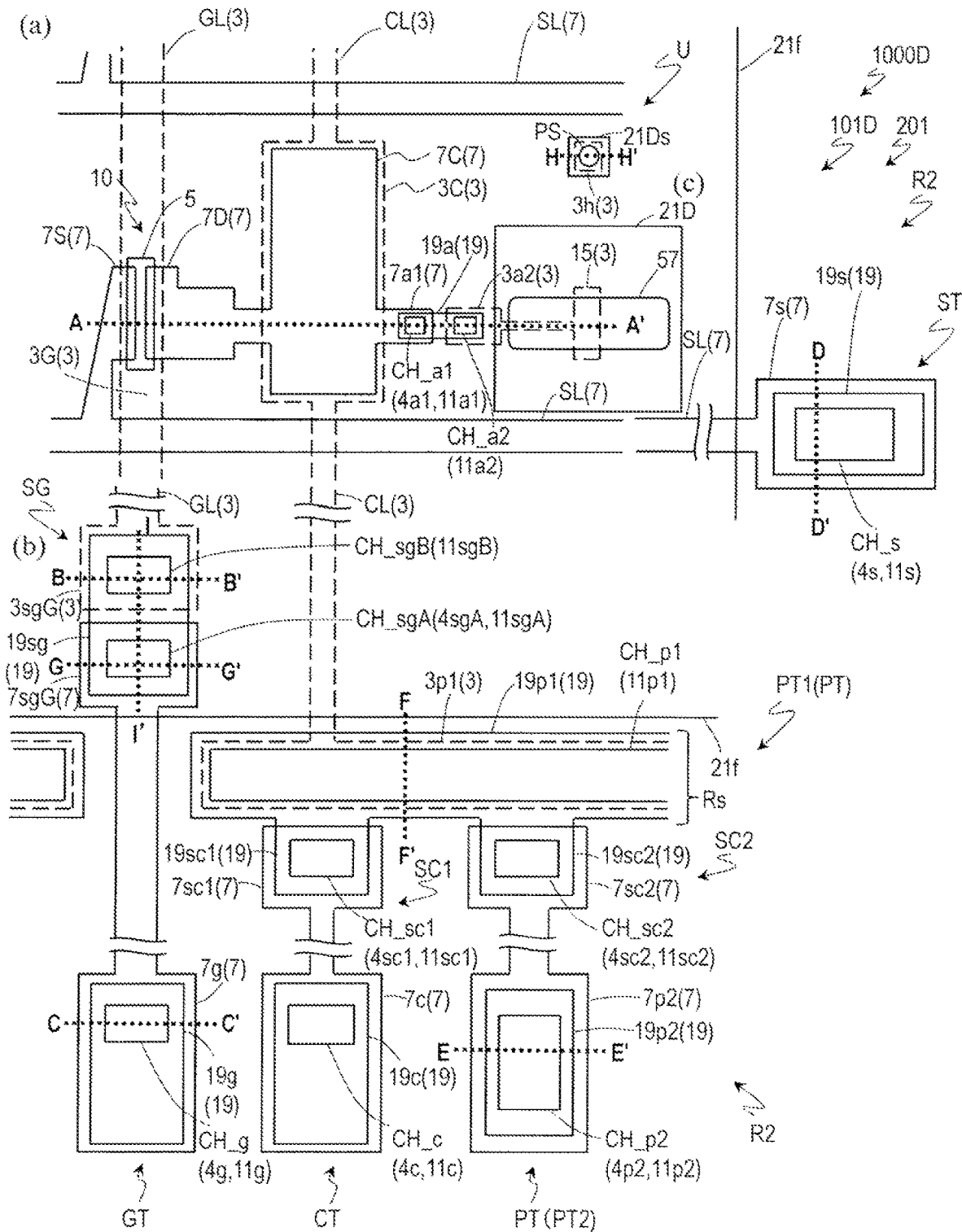
FIG. 29 is a schematic plan view of a scanned antenna 1000D according to a fourth embodiment. Portion (a) of FIG. 29 is a schematic plan view of an antenna element region U in a transmitting/receiving region R1 of a scanned antenna 1000D according to a fourth embodiment. Portions (b) and (c) of FIG. 29 are schematic plan views of a non-transmitting/receiving region R2 of the scanned antenna 1000D.

Portion (a) of FIG. 29 is a schematic plan view of the antenna element region U in the transmitting/receiving region R1 of the scanned antenna 1000D. FIG. 30(a) is a schematic cross-sectional view of the TFT substrate 101D included in the scanned antenna 1000D, that is taken along line A-A' of portion (a) of FIG. 29. FIG. 31(d) is a schematic cross-sectional view of a liquid crystal panel 100D included in the scanned antenna 1000D, that is taken along line H-H' of portion (a) of FIG. 29.

Figure 30A:
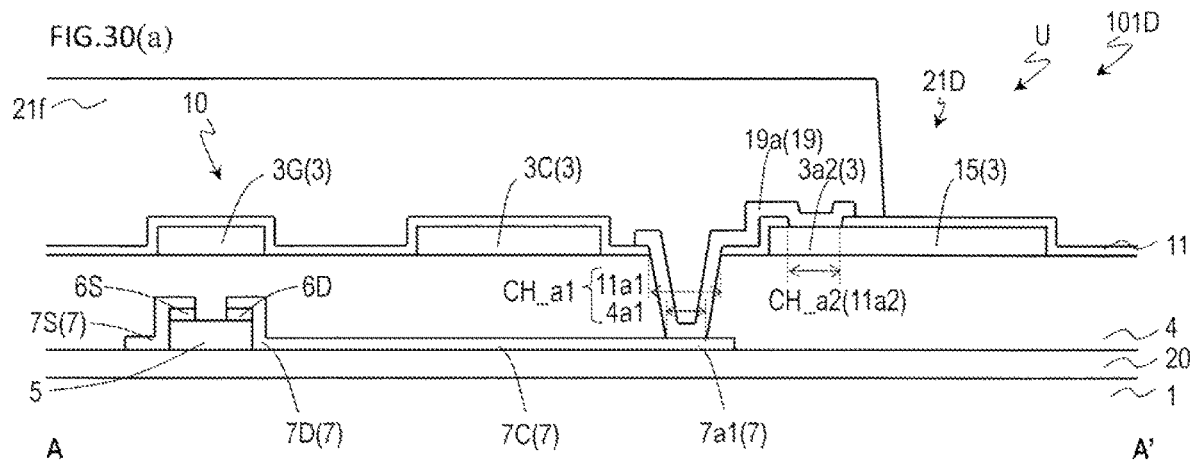
FIGS. 30(a)-30(e) are schematic cross-sectional views of a TFT substrate 101D included in the scanned antenna 1000D.
Figure 31A:
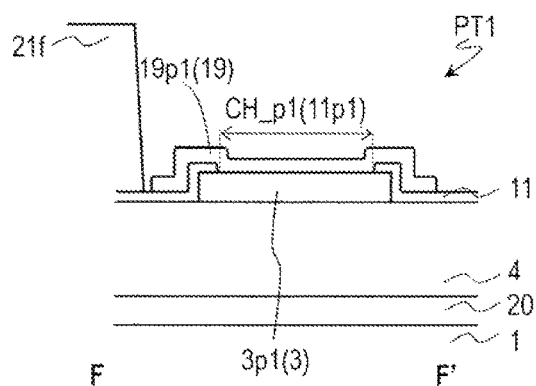
FIGS. 31(a)-31(c) are schematic cross-sectional views of the TFT substrate 101D.
Figure 31D:
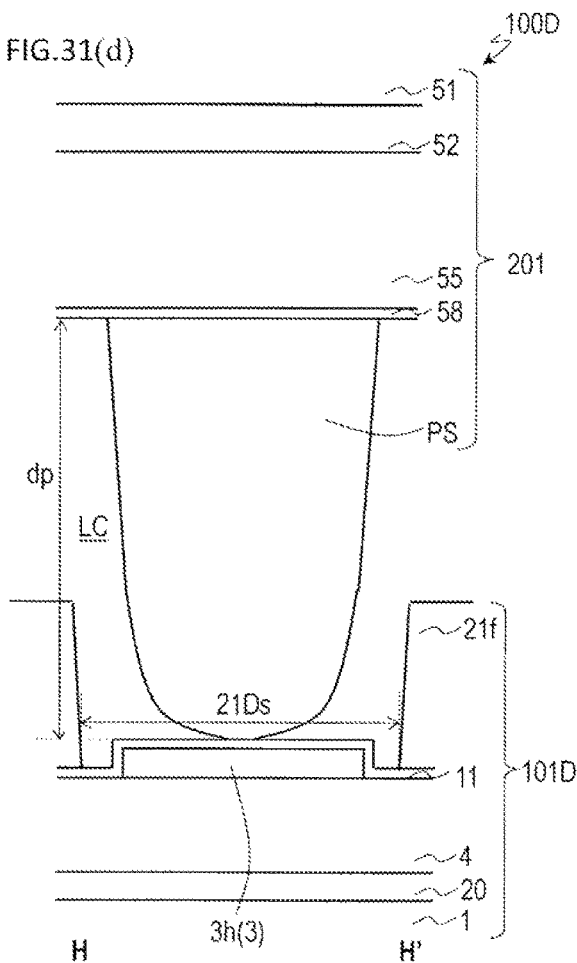
FIG. 31(d) is a schematic cross-sectional view of a liquid crystal panel 100D included in the scanned antenna 1000D.

As shown in portion (a) of FIG. 29, FIG. 30(a), and FIG. 31(d), the TFT substrate 101D includes a dielectric substrate 1; a plurality of antenna element regions U that are provided on the dielectric substrate 1, and each of which includes a TFT 10, and a patch electrode 15 electrically connected to a drain electrode 7D of the TFT 10; and a flattening layer 21f formed of a resin that is provided above a layer (in this example, a gate metal layer 3) including the patch electrode 15, over the dielectric substrate 1.

Because the flattening layer 21f is provided in the TFT substrate 101D, the volume of the liquid crystal layer LC in the scanned antenna 1000D including the TFT substrate 101D can be reduced. The reduction of the liquid crystal material leads to a reduction in the cost of the scanned antenna 1000D.

In the TFT substrate 101D, the upper surface of the flattening layer 21f is higher than the upper surface of the patch electrode 15. The flattening layer 21f includes, in each antenna element region U, an opening 21D that overlaps with the patch electrode 15 and the slot 57 as viewed in the direction normal to the dielectric substrate 1. In this example, the flattening layer 21f is formed so as not to overlap with the patch electrode 15 or the slot 57 as viewed in the direction normal to the dielectric substrate 1. As a result, in the scanned antenna 1000D including the TFT substrate 101D, the reduction of antenna performance due to the presence of the flattening layer 21f is prevented or reduced.

The opening included in the flattening layer 21f of the TFT substrate 101D is not limited to the illustrated example, and may have a side surface having a taper angle of 70° or less as described in the foregoing embodiments, and have a circular or elliptical shape as viewed from above. The upper surface of the flattening layer included in the TFT substrate 101D may be lower than the upper surface of the patch electrode 15.

A structure of the antenna element region U of the TFT substrate 101D will be described in greater detail.

As shown in portion (a) of FIG. 29, FIG. 30(a), and FIG. 31(d), the TFT substrate 101D includes a semiconductor layer 5 supported by the dielectric substrate 1, a source metal layer 7 provided on the semiconductor layer 5, a gate metal layer 3 provided on the source metal layer 7, a gate insulating layer 4 provided between the semiconductor layer 5 and the gate metal layer 3, a first insulating layer 11 provided on the gate metal layer 3, an upper conductive layer 19 provided on the first insulating layer 11, and a flattening layer 21f provided on the upper conductive layer 19.

The TFT substrate 101D further includes an underlying insulating layer 20 between the dielectric substrate 1 and the semiconductor layer 5. The underlying insulating layer 20 may, for example, be provided throughout the entire surface of the dielectric substrate 1. Note that the underlying insulating layer 20 may be omitted.

The TFT 10 of the TFT substrate 101D is different from the foregoing embodiments (e.g., the TFT substrate 101A of FIG. 3) in that the TFT 10 of the TFT substrate 101D has a top-gate structure. In the TFT 10 of the TFT substrate 101D, a gate electrode 3G is provided on the semiconductor layer 5 with the gate insulating layer 4 interposed therebetween.

The source metal layer 7 includes a source electrode 7S and a drain electrode 7D of the TFT 10, a source bus line SL, a storage capacitor electrode 7C, and a connection portion 7a1 electrically connected to the drain electrode 7D. In this example, the connection portion 7a1 is extended from the storage capacitor electrode 7C.

The gate insulating layer 4 includes an opening 4a1 that reaches the connection portion 7a1.

The gate metal layer 3 includes a gate electrode 3G of the TFT 10, a gate bus line GL, a storage capacitor counter electrode 3C, a CS bus line CL, the patch electrode 15, and a protruding portion 3h.

The first insulating layer 11 includes an opening 11a1 that overlaps with the opening 4a1 provided in the gate insulating layer 4 as viewed in the direction normal to the dielectric substrate 1, and an opening 11a2 that reaches a connection portion 3a2 extended from the patch electrode 15. The opening 4a1 provided in the gate insulating layer 4 and the opening 11a1 provided in the first insulating layer 11 form a contact hole CH_a1. The opening 11a2 provided in the first insulating layer 11 is also referred to as a "contact hole CH_a2."

The upper conductive layer 19 includes a patch drain connection portion 19a. The patch drain connection portion 19a is provided on the first insulating layer 11 and in the contact holes CH_a1 and CH_a2, is connected to the connection portion 7a1 in the contact hole CH_a1, and is connected to the connection portion 3a2 in the contact hole CH_a2. In this example, the patch drain connection portion 19a is in contact with the connection portion 7a1 in the opening 4a1 provided in the gate insulating layer 4, and is in contact with the connection portion 3a2 in the opening 11a2 provided in the first insulating layer 11.

The patch electrode 15 of the TFT substrate 101D is included in the gate metal layer 3 (i.e., the patch electrode 15 and the gate electrode 3G are formed of the same conductive film). As a result, the manufacturing cost of the TFT substrate 101D is reduced. For example, the number of steps (e.g., the number of photomasks) in the manufacturing process of the TFT substrate 101D is reduced.

As shown in portion (a) of FIG. 29 and FIG. 31(d), the flattening layer 21f of the TFT substrate 101D further includes, in the antenna element region U, an opening 21Ds that overlaps with the columnar spacer PS as viewed in the direction normal to the dielectric substrate 1. The columnar spacer PS has a height corresponding to a thickness dp (see FIG. 31(d)) of the liquid crystal layer LC defined by the columnar spacer PS.

The TFT substrate 101D includes, in each antenna element region U, the protruding portion 3h that overlaps with the columnar spacer PS as viewed in the direction normal to the dielectric substrates 1 and 51. In this example, the protruding portion 3h is included in the gate metal layer 3. In other words, the protruding portion 3h and the patch electrode 15 are formed of the same layer.

<Structure (Non-Transmitting/Receiving Region R2) of TFT Substrate 101D>

A structure of the non-transmitting/receiving region R2 of the TFT substrate 101D will be described with reference to FIGS. 29-31.

Portions (b) and (c) of FIG. 29 are schematic plan views of the non-transmitting/receiving region R2 of the TFT substrate 101D. FIGS. 30(b)-30(e) and 31(a)-31(c) are schematic cross-sectional views of the non-transmitting/receiving region R2 of the TFT substrate 101D.

Portion (b) of FIG. 29 shows a gate terminal portion GT, a CS terminal portion CT, a transfer terminal portion PT, a source-gate connection portion SG, a first source-CS connection portion SC1, and a second source-CS connection portion SC2 that are provided in the non-transmitting/receiving region R2. Portion (c) of FIG. 29 shows a source terminal portion ST that is provided in the non-transmitting/receiving region R2.

Figure 30B:
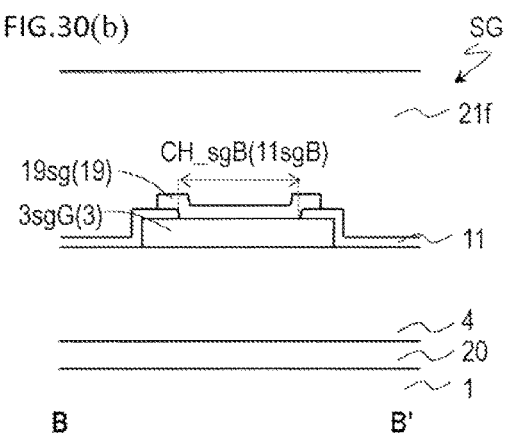
Figure 30C:
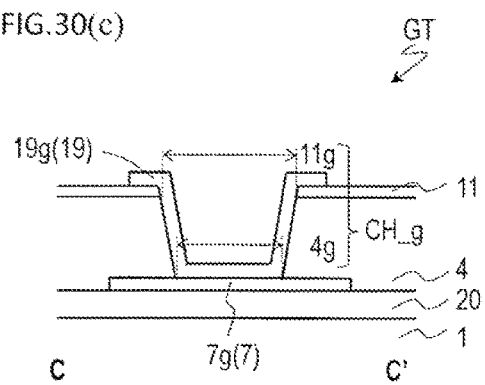
Figure 30D:
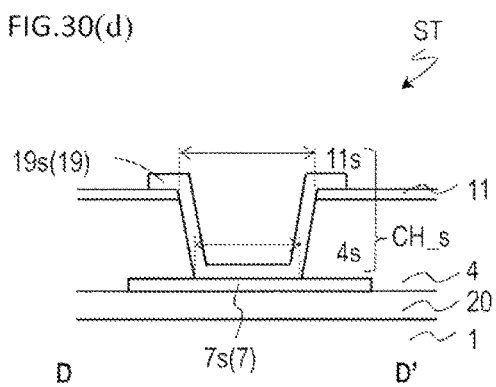
Figure 30E:
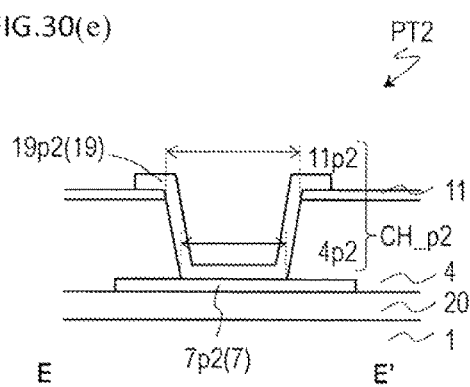
Figure 31B:
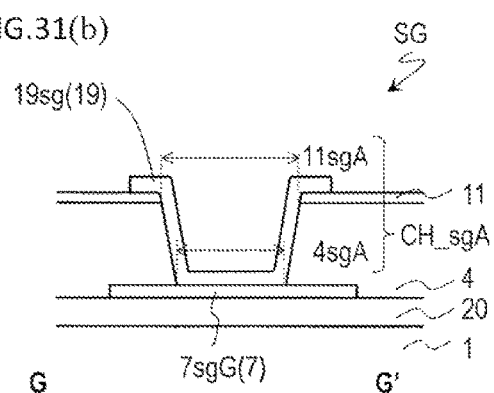
Figure 31C:
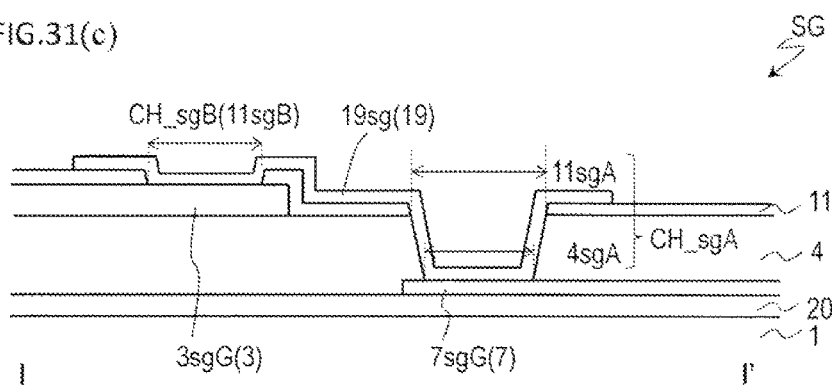

FIG. 30(b) shows a cross-section of the source-gate connection portion SG taken along line B-B' of portion (b) of FIG. 29. FIG. 30(c) shows a cross-section of the gate terminal portion GT taken along line C-C of portion (b) of FIG. 29. FIG. 30(d) shows a cross-sect ion of the source terminal portion ST taken along line D-D' of portion (c) of FIG. 29. FIG. 30(e) shows a cross-section of the second transfer terminal portion PT2 taken along line E-E' of portion (b) of FIG. 29. FIG. 31(a) shows a cross-section of the first transfer terminal portion PT1 taken along line F-F' of portion (b) of FIG. 29. FIG. 31(b) shows a cross-section of the source-gate connection portion SG taken along line G-G' of portion (b) of FIG. 29. FIG. 31(c) shows a cross-section of the source-gate connection portion SG taken along line I-I' of portion (b) of FIG. 29.

Source-Gate Connection Portion SG

As shown in portion (b) of FIG. 29, the TFT substrate 101D includes the source-gate connection portion SG in the non-transmitting/receiving region R2. The source-gate connection portion SG is typically provided for each gate bus line GL. The source-gate connection portion SG electrically connects the corresponding gate bus line GL to an interconnect (also referred to as a "gate lower interconnect") provided in the source metal layer 7. Because the source-gate connection portion SG is provided, the lower connection portion of the gate terminal portion GT can be formed of the source metal layer 7. The gate terminal portion GT including the lower connection portion formed of the source metal layer 7 has excellent reliability. This will be described in detail below.

As shown in portion (b) of FIG. 29, FIG. 30(b), FIG. 31(b), and FIG. 31(c), the source-gate connection portion SG electrically connects the gate bus line GL to a gate lower interconnect 7sgG (also simply referred to as a "lower interconnect 7sgG") via a gate upper connection portion 19sg (also simply referred to as an "upper connection portion 19sg").

Specifically, the source-gate connection portion SG includes the gate lower interconnect 7sgG, an opening 4sgA provided in the gate insulating layer 4, a gate bus line connection portion 3sgG connected to the gate bus line GL, an opening 11sgA and an opening 11sgB provided in the first insulating layer 11, and the gate upper connection portion 19sg. The flattening layer 21f is formed so as to cover the source-gate connection portion SG.

The gate lower interconnect 7sgG is included in the source metal layer 7, and is electrically separated from the source bus line SL.

The opening 4sgA provided in the gate insulating layer 4 reaches the gate lower interconnect 7sgG.

The gate bus line connection portion 3sgG is included in the gate metal layer 3, and is connected to the gate bus line GL. In this example, the gate bus line connection portion 3sgG is extended from the gate bus line GL, and is integrally formed with the gate bus line GL. The gate bus line connection portion 3sgG may have a width greater than that of the gate bus line GL.

The opening 11sgA provided in the first insulating layer 11 overlaps with the opening 4sgA provided in the gate insulating layer 4 as viewed in the direction normal to the dielectric substrate 1. The opening 4sgA provided in the gate insulating layer 4 and the opening 11sgA provided in the first insulating layer 11 form a contact hole CH_sgA.

The opening 11sgB provided in the first insulating layer 11 reaches the gate bus line connection portion 3sgG. The opening 11sgB provided in the first insulating layer 11 is also referred to as a "contact hole CH_sgB."

The gate upper connection portion 19sg is included in the upper conductive layer 19. The gate upper connection portion 19sg is provided on the first insulating layer 11 and in the contact holes CH_sgA and CH_sgB, is connected to the gate lower interconnect 7sgG in the contact hole CH_sgA, and is connected to the gate bus line connection portion 3sgG in the contact hole CH_sgB. In other words, the gate upper connection portion 19sg is in contact with the gate lower interconnect 7sgG in the opening 4sgA provided in the gate insulating layer 4, and is in contact with the gate bus line connection portion 3sgG in the opening 11sgB provided in the first insulating layer 11.

In the illustrated example, the contact hole CH_sgB is separated from the contact hole CH_sgA. This embodiment is not limited to this. The contact hole CH_sgA and the contact hole CH_sgB may be continuous with each other (i.e., these holes may be formed as a single contact hole). The contact hole CH_sgA and the contact hole CH_sgB may be formed as a single contact hole in the same step. Specifically, a single contact hole that reaches the gate lower interconnect 7sgG and the gate bus line connection portion 3sgG may be formed in the gate insulating layer 4 and the first insulating layer 11, and the gate upper connection portion 19sg may be formed in that contact hole and on the first insulating layer 11.

In the illustrated example, the source-gate connection portion SG is disposed inside the seal region Rs (on a side thereof on which the liquid crystal layer is provided). This embodiment is not limited to this. The source-gate connection portion SG may be disposed outside the seal region Rs (on a side thereof on which the liquid crystal layer is not provided).

Gate Terminal Portion GT

As shown in portion (b) of FIG. 29, the TFT substrate 101D includes the gate terminal portion GT in the non-transmitting/receiving region R2. The gate terminal portion GT is typically provided for each gate bus line GL. In this example, the gate terminal portion GT and the source-gate connection portion SG are provided for each gate bus line GL.

As shown in portion (b) of FIG. 29 and FIG. 30(c), the gate terminal portion GT includes a gate terminal lower connection portion 7g (also simply referred to as a "lower connection portion 7g"), an opening 4g provided in the gate insulating layer 4, an opening 11g provided in the first insulating layer 11, and a gate terminal upper connection portion 19g (also simply referred to as an "upper connection portion 19g").

The lower connection portion 7g is included in the source metal layer 7. The lower connection portion 7g is connected to the gate lower interconnect 7sgG provided in the source-gate connection portion SG. In this example, the lower connection portion 7g is extended from the gate lower interconnect 7sgG, and is integrally formed with the gate lower interconnect 7sgG.

The opening 4g provided in the gate insulating layer 4 reaches the lower connection portion 7g.

The opening 11g provided in the first insulating layer 11 overlaps with the opening 4g provided in the gate insulating layer 4 as viewed in the direction normal to the dielectric substrate 1. The opening 4g provided in the gate insulating layer 4 and the opening 11g provided in the first insulating layer 11 form a contact hole CH_g.

The upper connection portion 19g is included in the upper conductive layer 19. The upper connection portion 19g is provided on the first insulating layer 11 and in the contact hole CH_g, and is connected to the lower connection portion 7g in the contact hole CH_g. In other words, the upper connection portion 19g is in contact with the lower connection portion 7g in the opening 4g provided in the gate insulating layer 4.

The entire upper connection portion 19g may overlap with the lower connection portion 7g as viewed in the direction normal to the dielectric substrate 1.

The gate terminal portion GT does not include a conductive portion in the gate metal layer 3.

The gate terminal portion GT includes the lower connection portion 7g included in the source metal layer 7, and therefore, has excellent reliability. The terminal portions, particularly terminal portions disposed outside the seal region Rs (on an opposite side of the seal region Rs from the liquid crystal layer) may undergo corrosion due to moisture in the atmosphere (which may contain impurities). Moisture in the atmosphere may enter the contact hole that reaches the lower connection portion, reach the lower connection portion, and cause corrosion of the lower connection portion. In order to prevent or reduce the occurrence of such corrosion, it is preferable that the contact hole that reaches the lower connection portion should be deep. In other words, it is preferable that the thickness of the insulating layer in which an opening forming the contact hole is formed should be great.

In the gate terminal portion GT of the TFT substrate 101D, the lower connection portion 7g is included in the source metal layer 7, and therefore, the contact hole CH_g that reaches the lower connection portion 7g includes the opening 4g provided in the gate insulating layer 4 and the opening 11g provided in the first insulating layer 11. A depth of the contact hole CH_g is the sum of a thickness of the gate insulating layer 4 and a thickness of the first insulating layer 11. In contrast to this, for example, in the case where the lower connection portion is included in the gate metal layer 3, the contact hole that reaches the lower connection portion includes only the opening provided in the first insulating layer 11, and has a depth that is the thickness of the first insulating layer 11, which is smaller than that of the contact hole CH_g. As used herein, the depth of the contact hole and the thickness of the insulating layer refer to the depth and thickness, respectively, in the direction normal to the dielectric substrate 1. The same is true of the other contact holes and insulating layers unless otherwise specified. Thus, in the gate terminal portion GT of the TFT substrate 101D, the lower connection portion 7g is included in the source metal layer 7, and therefore, the gate terminal portion GT has excellent reliability compared to, for example, the case where the lower connection portion is included in the gate metal layer 3.

If the upper connection portion of the terminal portion has a great thickness (i.e., the upper conductive layer 19 has a great thickness), the occurrence of corrosion of the lower connection portion is prevented or reduced. In order to effectively prevent or reduce the occurrence of corrosion of the lower connection portion, the upper conductive layer 19 may have a layered structure that includes a first upper conductive layer including a transparent conductive layer (e.g., an ITO layer), and a second upper conductive layer that is provided below the first upper conductive layer and includes one layer selected from the group consisting of a Ti layer, a MoNbNi layer, a MoNb layer, a MoW layer, a W layer, and a Ta layer, or a layered structure including two or more thereof, as described above. In order to effectively prevent or reduce the occurrence of corrosion of the lower connection portion, the second upper conductive layer may have a thickness of, for example, more than 100 nm.

Source Terminal Portion ST

As shown in portion (c) of FIG. 29, the TFT substrate 101D includes the source terminal portion ST in the non-transmitting/receiving region R2. As shown in portion (c) of FIG. 29 and FIG. 30(d), the source terminal portion ST may have a configuration similar to that of the gate terminal portion GT. The source terminal portion ST is typically provided for each source bus line.

The source terminal portion ST includes a source terminal lower connection portion 7s (also simply referred to as a "lower connection portion 7s"), an opening 4s provided in the gate insulating layer 4, an opening 11s provided in the first insulating layer 11, and a source terminal upper connection portion 19s (also simply referred to as an "upper connection portion 19s").

The lower connection portion 7s is included in the source metal layer 7, and is connected to the source bus line SL. In this example, the lower connection portion 7s is extended from the source bus line SL, and is integrally formed with the source bus line SL.

The opening 4s provided in the gate insulating layer 4 reaches the lower connection portion 7s.

The opening 11s provided in the first insulating layer 11 overlaps with the opening 4s provided in the gate insulating layer 4 as viewed in the direction normal to the dielectric substrate 1. The opening 4s provided in the gate insulating layer 4 and the opening 11s provided in the first insulating layer 11 form a contact hole CH_s.

The upper connection portion 19s is included in the upper conductive layer 19. The upper connection portion 19s is provided on the first insulating layer 11 and in the contact hole CH_s, and is connected to the lower connection portion 7s in the contact hole CH_s. In other words, the upper connection portion 19s is in contact with the lower connection portion 7s in the opening 4s provided in the gate insulating layer 4.

The entire upper connection portion 19s may overlap with the lower connection portion 7s as viewed in the direction normal to the dielectric substrate 1.

The source terminal portion ST does not include a conductive portion in the gate metal layer 3.

The source terminal portion ST includes the lower connection portion 7s included in the source metal layer 7, and therefore, has excellent reliability like the gate terminal portion GT. As described above, in order to provide the lower connection portion of the gate terminal portion GT formed of the source metal layer 7, the source-gate connection portion SG that connects the gate metal layer 3 to the source metal layer 7 is provided for each gate terminal portion GT. In contrast to this, such a connection portion may not need to be provided for the source terminal portion ST.

First Transfer Terminal Portion PT1

As shown in portion (b) of FIG. 29, the TFT substrate 101D includes the first transfer terminal portion PT1 in the non-transmitting/receiving region R2. In this example, the first transfer terminal portion PT1 is provided in the seal region Rs (i.e., the first transfer terminal portion PT1 is provided in the seal portion surrounding the liquid crystal layer).

As shown in portion (b) of FIG. 29 and FIG. 31(a), the first transfer terminal portion PT1 includes a first transfer terminal lower connection portion 3p1 (also simply referred to as a "lower connection portion 3p1"), an opening 11p1 provided in the first insulating layer 11, and a first transfer terminal upper connection portion 19p1 (also simply referred to as an "upper connection portion 19p1").

The lower connection portion 3p1 is included in the gate metal layer 3, and is electrically connected to the CS bus line CL. In this example, the lower connection portion 3p1 is integrally formed with the CS bus line CL. The lower connection portion 3p1 is electrically separated from the gate bus line GL.

The opening 11p1 provided in the first insulating layer 11 reaches the lower connection portion 3p1. The opening 11p1 provided in the first insulating layer 11 is also referred to as a "contact hole CH_p1."

The upper connection portion 19p1 is included in the upper conductive layer 19. The upper connection portion 19p1 is provided on the first insulating layer 11 and in the contact hole CH_p1, and is connected to the lower connection portion 3p1 in the contact hole CH_p1. In other words, the upper connection portion 19p1 is in contact with the lower connection portion 3p1 in the opening 11p1 provided in the first insulating layer 11. The upper connection portion 19p1 is connected to a transfer terminal connection portion of the slot substrate by, for example, a sealant containing conductive particles.

A portion of the lower connection portion 3p1 that is exposed through the opening 11p1 is covered by the upper connection portion 19p1.

In this example, the lower connection portion 3p1 is disposed between two adjacent gate bus lines GL. Two lower connection portions 3p1 disposed on opposite sides of a gate bus line GL may be electrically connected to each other via a conductive connection portion (not shown). The conductive connection portion may, for example, be formed of the source metal layer 7.

Although, in this example, the lower connection portion 3p1 is connected to the upper connection portion 19p1 by the single contact hole CH_p1, a plurality of contact holes may be provided for each lower connection portion 3p1.

CS terminal Portion CT and First Source-CS Connection Portion SC1

As shown in portion (b) of FIG. 29, the TFT substrate 101D includes the CS terminal portion CT and the first source-CS connection portion SC1 in the non-transmitting/receiving region R2. The CS terminal portion CT is, for example, provided for each CS bus line CL. In this example, the first source-CS connection portion SC1 is provided for the CS terminal portion CT. For example, the CS terminal portion CT and the first source-CS connection portion SC1 are provided for each CS bus line CL. Because the first source-CS connection portion SC1 is provided, the lower connection portion of the CS terminal portion CT can be formed of the source metal layer 7. The CS terminal portion CT including the lower connection portion formed of the source metal layer 7 has excellent reliability.

As shown in portion (b) of FIG. 29, in this example, the CS terminal portion CT (its cross-sectional structure is not shown) has a configuration similar to that of the gate terminal portion GT.

The CS terminal portion CT includes a CS terminal lower connection portion 7c (also simply referred to as a "lower connection portion 7c"), an opening 4c provided in the gate insulating layer 4, an opening 11c provided in the first insulating layer 11, and a CS terminal upper connection portion 19c (also simply referred to as an "upper connection portion 19c").

The lower connection portion 7c is included in the source metal layer 7, and is electrically connected to the CS bus line CL. The lower connection portion 7c is connected to a CS lower interconnect 7sc1 provided in the first source-CS connection portion SC1. In this example, the lower connection portion 7c is extended from the CS lower interconnect 7sc1, and is integrally formed with the CS lower interconnect 7sc1.

The opening 4c provided in the gate insulating layer 4 reaches the lower connection portion 7c.

The opening 11c provided in the first insulating layer 11 overlaps with the opening 4c provided in the gate insulating layer 4 as viewed in the direction normal to the dielectric: substrate 1. The opening 4c provided in the gate insulating layer 4 and the opening 11c provided in the first insulating layer 11 form, a contact hole CH_c.

The upper connection portion 19c is included in the upper conductive layer 19. The upper connection portion 19c is provided on the first insulating layer 11 and in the contact hole CH_c, and is connected to the lower connection portion 7c in the contact hole CH_c. In other words, the upper connection portion 19c is in contact with the lower connection portion 7c in the opening 4c provided in the gate insulating layer 4.

The entire upper connection portion 19c may overlap with the lower connection, portion 7c as viewed in the direction normal to the dielectric substrate 1.

The CS terminal portion CT does not include a conductive portion in the gate metal layer 3.

The CS terminal portion CT includes the lower connection portion 7c included in the source metal layer 7, and therefore, has excellent reliability like the gate terminal portion GT.

In this example, the first source-CS connection portion SC1 has a configuration similar to that of a cross-section of the source-gate connection portion SG taken along line G-G' of portion (b) of FIG. 29 (see FIG. 31(b)). The cross-sectional structure of the first source-CS connection portion SC1 is not shown.

The first source-CS connection portion SC1 includes a CS lower interconnect 7sc1 (also simply referred to as a "lower interconnect 7sc1"), an opening 4sc1 provided in the gate insulating layer 4, an opening 11sc1 provided in the first insulating layer 11, and a CS upper connection portion 19sc1.

The CS lower interconnect 7sc1 is included in the source metal layer 7, and is electrically separated from the source bus line SL.

The opening 4sc1 provided in the gate insulating layer 4 reaches the CS lower interconnect 7sc1.

The opening 11sc1 provided in the first insulating layer 11 overlaps with the opening 4sc1 provided in the gate insulating layer 4 as viewed in the direction normal to the dielectric: substrate 1. The opening 4sc1 provided in the gate insulating layer 4 and the opening 11sc1 provided in the first insulating layer 11 form a contact hole CH_sc1.

The CS upper connection portion 19sc1 is included in the conductive layer 19. The CS upper connection portion 19sc1 is provided on the first insulating layer 11 and in the contact hole CH_sc1, and is connected to the CS lower interconnect 7sc1 in the contact hole CH_sc1. In other words, the CS upper connection portion 19sc1 is in contact with the CS lower interconnect 7sc1 in the opening 4sc1 provided in the gate insulating layer 4.

In this example, the CS upper connection portion 19sc1 is extended from the first transfer terminal upper connection portion 19p1 provided in the first transfer terminal portion PT1, and is integrally formed with the upper connection portion 19p1. In the first transfer terminal portion PT1, the upper connection portion 19p1 is connected to the lower connection portion 3p1 integrally formed with the CS bus line CL. Thus, the lower connection portion 7c of the CS terminal portion CT is electrically connected to the CS bus line CL.

The CS upper connection portion 19sc1 and the upper connection portion of each terminal portion are formed of the same conductive film. As a result, the TFT substrate 101D can be manufactured using five photomasks. Because the first source-CS connection portion SC1 is provided, the lower connection portion of the CS terminal portion CT can be formed of the source metal layer 7. As a result, the CS terminal portion CT of the TFT substrate 101D has excellent reliability.

In the illustrated example, the TFT substrate 101D includes the CS terminal portion CT for each CS bus line. As described above, this embodiment is not limited to this. The TFT substrate of this embodiment may include a single CS terminal portion CT for a plurality of CS bus lines.

Second Transfer Terminal Portion PT2 and Second Source-CS Connection Portion SC2

As shown in portion (b) of FIG. 29, the TFT substrate 101D includes the second transfer terminal portion PT2 and the second source-CS connection portion SC2 in the non-transmitting/receiving region R2. The second transfer terminal portion PT2 is provided outside the seal region Rs (on an opposite side thereof from the transmitting/receiving region R1). In other words, the second transfer terminal portion PT2 is provided outside the seal portion surrounding the liquid crystal layer. In this example, the second source-CS connection portion SC2 is provided for the second transfer terminal portion PT2.

As shown in FIG. 30(e), the second transfer terminal portion PT2 has a cross-sectional structure similar to that of the gate terminal portion GT shown in FIG. 30(c). Specifically, as shown in FIG. 30(e), the second transfer terminal portion PT2 includes a second transfer terminal lower connection portion 7p2 (also simply referred to as a "lower connection portion 7p2"), an opening 4p2 provided in the gate insulating layer 4, an opening 11p2 provided in the first insulating layer 11, and a second transfer terminal upper connection portion 19p2 (also simply referred to as an "upper connection portion 19p2").

The lower connection portion 7p2 is included in the source metal layer 7, and is electrically connected to the CS bus line CL. The lower connection portion 7p2 is electrically separated from the source bus line SL. In this example, the lower connection portion 7p2 is extended from a CS lower interconnect 7sc2 (also simply referred to as a "lower interconnect 7sc2") provided in the second source-CS connection portion SC2, and is integrally formed with the CS lower interconnect 7sc2.

The opening 4p2 provided in the gate insulating layer 4 reaches the lower connection portion 7p2.

The opening 11p2 provided in the first insulating layer 11 overlaps with the opening 4p2 provided in the gate insulating layer 4 as viewed in the direction normal to the dielectric substrate 1. The opening 4p2 provided in the gate insulating layer 4 and the opening 11p2 provided in the first insulating layer 11 form a contact hole CH_p2.

The upper connection portion 19p2 is included in the upper conductive layer 19. The upper connection portion 19p2 is provided on the first insulating layer 11 and in the contact hole CH_p2, and is connected to the lower connection portion 7p2 in the contact hole CH_p2. In other words, the upper connection portion 19p2 is in contact with the lower connection portion 7p2 in the opening 4p2 provided in the gate insulating layer 4.

In this example, the second transfer terminal portion PT2 does not include a conductive portion in the gate metal layer 3.

The second transfer terminal portion PT2 includes the lower connection portion 7p2 included in the source metal layer 7, and therefore, has excellent reliability like the gate terminal portion GT.

Also in the second transfer terminal portion PT2, the upper connection portion 19p2 may be connected to a transfer terminal connection portion of the slot substrate by, for example, a sealant containing conductive particles.

In this example, the second source-CS connection portion SC2 has a configuration similar to that of a cross-section of the source-gate connection portion SG taken along line G-G' of portion (b) of FIG. 29 (see FIG. 31(b)), like the first source-CS connection portion SC1. The cross-sectional structure of the second source-CS connection portion SC2 is not shown.

The second source-CS connection portion SC2 includes a CS lower interconnect 7sc2, an opening 4sc2 provided in the gate insulating layer 4, an opening 11sc2 provided in the first insulating layer 11, and a CS upper connection portion 19sc2.

The CS lower interconnect 7sc2 is included in the source metal layer 7, and is electrically separated from the source bus line SL.

The opening 4sc2 provided in the gate insulating layer 4 reaches the CS lower interconnect 7sc2.

The opening 11sc2 provided in the first insulating layer 11 overlaps with the opening 4sc2 provided in the gate insulating layer 4 as viewed in the direction normal to the dielectric substrate 1. The opening 4sc2 provided in the gate insulating layer 4 and the opening 11sc2 provided in the first insulating layer 11 form, a contact hole CH_sc2.

The CS upper connection portion 19sc2 is included in the upper conductive layer 19. The CS upper connection portion 19sc2 is provided on the first insulating layer 11 and in the contact hole CH_sc2, and is connected to the CS lower interconnect 7sc2 in the contact hole CH_sc2. In other words, the CS upper connection portion 19sc2 is in contact with the CS lower interconnect 7sc2 in the opening 4sc2 provided in the gate insulating layer 4.

In this example, the CS upper connection portion 19sc2 is extended from the first transfer terminal upper connection portion 19p1 provided in the first transfer terminal portion PT1, and is integrally formed with the upper connection portion 19p1. In the first transfer terminal portion PT1, the upper connection portion 19p1 is connected to the lower connection portion 3p1 integrally formed with the CS bus line CL. Thus, the lower connection portion 7p2 of the second transfer terminal portion PT2 is electrically connected to the CS bus line CL.

The CS upper connection portion 19sc2 and the upper connection portion of each terminal portion are formed of the same conductive film. As a result, the TFT substrate 101D can be manufactured using five photomasks. Because the second source-CS connection portion SC2 is provided, the lower connection portion of the second transfer terminal portion PT2 can be formed of the source metal layer 7. As a result, the second transfer terminal portion PT2 of the TFT substrate 101D has excellent reliability.

In the illustrated example, the TFT substrate 101D includes the first source-CS connection portion SC1 and the second source-CS connection portion SC2 for each CS bus line. This embodiment is not limited to this. The TFT substrate of this embodiment may include a single source-CS connection portion for each CS bus line. As described above, the source-CS connection portion may not necessarily need to be provided for each CS bus line. The TFT substrate of this embodiment may include a single source-CS connection portion for a plurality of CS bus lines. In the illustrated example, the first source-CS connection portion SC1 and the second source-CS connection portion SC2 are provided outside the seal region Rs (on a side thereof on which the liquid crystal layer is not provided). This embodiment is not limited to this. The source-CS connection portion may be provided inside the seal region Rs (on a side thereof on which the liquid crystal layer is provided).

<Method for Manufacturing TFT Substrate 101D>

A method for manufacturing the TFT substrate 101D will be described with reference to FIGS. 32-35.

FIGS. 32(a) 32(e), 33(a)-33(c), 34(a)-34(c), and 35(a) and 35(b) are schematic cross-sectional views for describing a method for manufacturing the TFT substrate 101D. These figures show cross-sections corresponding to FIGS. 30(a), 30(b), 30(c), 31(a), and 31(d) (A-A', B-B', C-C', F-F', and H-H' cross-sections of the TFT substrate 101D). Note that cross-sections corresponding to FIGS. 30(d), 30(e), and 31(b) (D-D', E-E', and G-G' cross-sections the TFT substrate 101D) are not shown, and are formed using a method similar to that for the cross-section corresponding to FIG. 31(a) (an F-F' cross-section of the TFT substrate 101D). The material, thickness, formation method, etc., of each layer may be similar to those of the foregoing embodiments and may not be described.

As FIG. 32(a), initially, an underlying insulating layer 20, an intrinsic amorphous silicon film 5', and an n$^+$-type amorphous silicon film 6' are formed in that order on the dielectric substrate 1. In this example, as the underlying insulating layer 20, for example, a silicon nitride ($Si_xN_y$) film having a thickness of 200 nm is formed. Furthermore, the intrinsic amorphous silicon film 5' having a thickness of, for example, 120 nm and the n$^+$-type amorphous silicon film 6' having a thickness of, for example, 30 nm are formed.

Next, as shown in FIG. 32(b), the intrinsic amorphous silicon film 5' and the n$^+$-type amorphous silicon film 6' are patterned to obtain the island-shaped semiconductor layer 5 and the contact layer 6. Note that a semiconductor film used for the semiconductor layer 5 is not limited to an amorphous silicon film.

Next, as shown in FIG. 32(c), a source conductive film 7' is formed, on the underlying insulating layer 20 and the contact layer 6. In this example, as the source conductive film 7', a layered film (MoN/Al/MoN) is formed in which MoN (thickness: 50 nm, for example), Al (thickness: 150 nm, for example), and MoN (thickness: 100 nm, for example) are layered in that order. Alternatively, as the source conductive film 7', a layered, film (Ti/Al/Ti) may be formed in which Ti (thickness: 50 nm, for example), Al (thickness: 200 nm, for example), and Ti (thickness: 50 nm, for example) are layered in that order.

Next, as shown in FIG. 32(d), the source conductive film 7' is patterned to obtain the source metal layer 7. Specifically, the source electrode 7S and the drain electrode 7D, the storage capacitor electrode 7C connected to the drain electrode 7D, and the source bus line SL connected to the source electrode 7S are formed in the antenna element formation region. The lower connection portions 7g, 7s, 7c, and 7p2 are formed in the respective terminal portion formation regions. The lower interconnect 7sgG is formed in the source-gate connection portion formation region. The lower interconnects 7sc1 and 7sc2 are formed in the source-CS connection portion formation region. At that time, the contact layer 6 is also etched to form the source contact layer 6S and the drain contact layer 6D, which are separated from each other.

In the case where the source conductive film 7' is a layered film (MoN/Al/MoN) in which MoN, Al, and MoN are layered in that order, the source conductive film 7' is patterned by, for example, wet etching. The MoN film and the Al film are simultaneously patterned using, for example, an aqueous solution containing phosphoric acid, nitric acid, and acetic acid as an etchant. After the MoN film and the Al film are patterned by wet etching, the contact layer ($n^+$-type amorphous silicon layer) 6 may be patterned by dry etching.

In the case where the source conductive film 7' is a layered film (Ti/Al/Ti) in which Ti, Al, and Ti are layered in that order is formed, the source conductive film 7' is patterned by, for example, dry etching. For example, the Ti film, the Al film, and the contact layer ($n^+$-type amorphous silicon layer) 6 are patterned in a single patterning step by dry etching.

Next, as shown in FIG. 32(e), a gate insulating film 4' is formed so as to cover the source metal layer 7 and the underlying insulating layer 20. In this example, the gate insulating film 4' is disposed in contact with the channel region of the semiconductor layer 5. In this example, as the gate insulating film 4', for example, a silicon nitride ($Si_xN_y$) film having a thickness of 350 nm is formed.

Next, as shown in FIG. 33(a), a gate conductive film 3' is formed on the gate insulating film 4'. In this example, as the gate conductive film 3', a layered film (Cu/Ti) is formed in which a Ti film (thickness: 20 nm, for example) and a Cu film (thickness: 500 nm, for example) are stacked in that order.

Next, as shown in FIG. 33(b), the gate conductive film 3' is patterned to obtain the gate metal layer 3. Specifically, in the antenna element formation region, formed are the gate electrode 3G including a portion opposing the semiconductor layer 5 with the gate insulating film 4' interposed therebetween, the gate bus line GL connected to the gate electrode 3G, the storage capacitor counter electrode 3C including a portion opposing the storage capacitor electrode 7C with the gate insulating film 4' interposed therebetween, the CS bus line CL connected to the storage capacitor counter electrode 3C, the patch electrode 15, and the protruding portion 3h. In the first transfer terminal portion formation region, the lower connection portion 3p1 is formed. In the source-gate connection portion formation region, the gate bus line connection portion 3sgG is formed. In this example, the gate conductive film 3' is patterned by wet etching. Thus, the TFT 10 is obtained.

In this example, in the source-gate connection portion formation region, the gate lower interconnect 7sgG is formed such that not all the gate lower interconnect 7sgG overlaps with the gate bus line connection portion 3sgG. In the antenna element formation region, the drain electrode 7D or the portion extended from the drain electrode 7D is formed such that not all the drain electrode 7D or not all the portion extended from the drain electrode 7D overlaps with the gate metal layer 3. None of the terminal portion formation regions (excluding the first transfer terminal portion formation region), the first source-CS connection portion formation region, and the second source-CS connection portion formation region includes a conductive portion in the gate metal layer 3.

Next, as shown in FIG. 33(c), a first insulating film 11' is formed so as to cover the TFT 10 and the gate metal layer 3. In this example, as the first insulating film 11', for example, a silicon nitride ($Si_xN_y$) film having a thickness of 100 nm is formed.

Figure 34A:
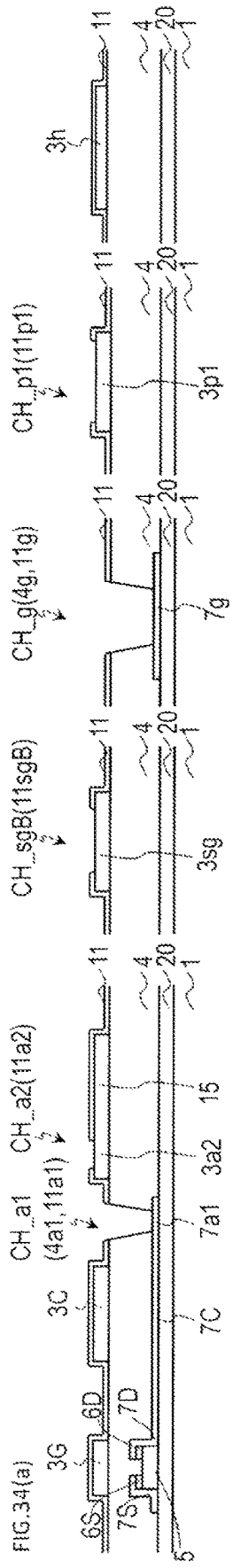
FIGS. 34(a)-34(c) are schematic cross-sectional views for describing a method for manufacturing the TFT substrate 101D.

Next, as shown in FIG. 34(a), the first insulating film 11' and the gate insulating film 4' are etched by a photolithographic process known in the art to obtain the first insulating layer 11 and the gate insulating layer 4. Specifically, in the antenna element formation region, formed are the contact hole CH_a1 that reaches the connection portion 7a1 extended from the drain electrode 7D, and the contact hole CH_a2 (the opening 11a2) that reaches the connection portion 3a2 extended from the patch electrode 15. In the gate terminal portion formation region, the contact hole CH_g that reaches the lower connection portion 7g is formed. In the source terminal portion formation region, the contact hole CH_s that reaches the lower connection portion 7s is formed. In the CS terminal portion formation region, the contact hole CH_c that reaches the lower connection portion 7c is formed. In the first transfer terminal portion formation region, the contact hole CH_p1 that reaches the lower connection portion 3p1 is formed. In the second transfer terminal portion formation region, the contact hole CH_p2 that reaches lower connection portion 7p2 is formed. In the source-gate connection portion formation region, formed are; the contact hole CH_sgA that reaches the lower interconnect 7sgG, and the contact hole CH_sgB (the opening 11sgB) that reaches the gate bus line connection portion 3sgG. In the first source-CS connection portion formation region, the contact hole CH_sc1 that reaches the lower interconnect 7sc1 is formed. In the second source-CS connection portion formation region, the contact hole CH_sc2 that reaches the lower interconnect 7sc1 is formed.

In this etching step, the first insulating film 11' and the gate insulating film 4' are etched using the gate metal layer 3 as an etch stop.

For example, in the antenna element formation region, the first insulating film 11' and the gate insulating film 4' are etched in a region where the contact hole CH_a1 is to be formed. In a region where the contact hole CH_a2 is to be formed, the connection portion 3a2 functions as an etch stop, and therefore, only the first insulating film 11' is etched. The contact hole CH_a1 includes the opening 4a1 that is formed in the gate insulating layer 4 and reaches the connection portion 7a1, and the opening 11a1 that is formed in the first insulating layer 11 and overlaps with the opening 4a1. In this example, the drain electrode 7D or the portion extended from the drain electrode 7D is formed such that not all the drain electrode 7D or not all the portion extended from the drain electrode 7D overlaps with the gate metal layer 3. Therefore, the contact hole CH_a1 reaches the drain electrode 7D or the portion extended from the drain electrode 7D. A side surface of the opening 4a1 and a side surface of the opening 11a1 may be aligned together on a side surface of the contact hole CH_a1.

The first insulating film 11' and the gate insulating film 4' are, for example, etched together in a single etching step using the same etchant. In this example, the first insulating film 11' and the gate insulating film 4' are etched by dry etching using a fluorine-based gas. The first insulating film 11' and the gate insulating film 4' may be etched using different etchants.

Thus, of the contact holes, in one that includes an opening formed in the first insulating layer 11 and an opening formed in the gate insulating layer 4, a side surface of the opening formed in the first insulating layer 11 and a side surface of the opening formed in the gate insulating layer 4 may be aligned together.

In the source-gate connection portion formation region, the first insulating film 11' and the gate insulating film 4' are etched together in a single etching step in a region where the contact hole CH_sgA is to be formed, and only the first insulating film 11' is etched in a region where the contact hole CH_sgB is to be formed, because the gate bus line connection portion 3sgG functions as an etch stop. As a result, the contact hole CH_sgA and the contact hole CH_sgB are obtained. The contact hole CH_sgA includes the opening 4sgA that is formed in the gate insulating layer 4 and reaches the gate lower interconnect 7sgG, and the opening 11sgA that is formed in the first insulating layer 11 and overlaps with the opening 4sgA. In this example, the gate lower interconnect 7sgG is formed such that not all the gate lower interconnect 7sgG overlaps with the gate bus line connection portion 3sgG, and therefore, the contact hole CH_sgA that reaches the gate lower interconnect 7sgG is formed. A side surface of the opening 4sgA and a side surface of the opening 11sgA may be aligned together on a side surface of the contact hole CH_sgA.

In each terminal portion formation region (excluding the first transfer terminal portion formation region), the gate metal layer 3 is not included (i.e., a conductive portion formed of the gate metal layer 3 is not provided), and therefore, the first insulating film 11' and the gate insulating film 4' are etched together in a single etching step.

In the gate terminal portion formation region, the gate metal layer 3 is not included (i.e., a conductive portion formed of the gate metal layer 3 is not provided), and therefore, the first insulating film 11' and the gate insulating film 4' are etched together in a single etching step to form the contact hole CH_g. The contact hole CH_g includes the opening 4g that is formed in the gate insulating layer 4 and reaches the lower connection portion 7g, and the opening 11g that is formed in the first insulating layer 11 and overlaps with the opening 4g. A side surface of the opening 4g and a side surface of the opening 11g may be aligned together on a side surface of the contact hole CH_g.

In the source terminal portion formation region, the gate metal layer 3 is not included (i.e., a conductive portion formed of the gate metal layer 3 is not provided), and therefore, the first insulating film 11' and the gate insulating film 4' are etched together in a single etching step to form the contact hole CH_s. The contact hole CH_s includes the opening 4s that is formed in the gate insulating layer 4 and reaches the lower connection portion 7s, and the opening 11s that is formed in the first insulating layer 11 and overlaps with the opening 4s. A side surface of the opening 4s and a side surface of the opening 11s may be aligned together on a side surface of the contact hole CH_s.

In the CS terminal portion formation region, the gate metal layer 3 is not included (i.e., a conductive portion, formed of the gate metal layer 3 is not provided), and therefore, the first insulating film 11' and the gate insulating film 4' are etched together in a single etching step to form, the contact hole CH_c. The contact hole CH_c includes the opening 4c that is formed in the gate insulating layer 4 and reaches the lower connection portion 7c, and the opening 11c that is formed in the first insulating layer 11 and overlaps with the opening 4c. A side surface of the opening 4c and a side surface of the opening 11c may be aligned together on a side surface of the contact hole CH_c.

In the second transfer terminal portion formation region, the gate metal layer 3 is not included (i.e., a conductive portion formed of the gate metal layer 3 is not provided), and therefore, the first insulating film 11' and the gate insulating film 4' are etched together in a single etching step to form the contact hole CH_p2. The contact hole CH_p2 includes the opening 4p2 that is formed in the gate insulating layer 4 and reaches the lower connection portion 7p2, and the opening 11p2 that is formed in the first insulating layer 11 and overlaps with the opening 4p2. A side surface of the opening 4p2 and a side surface of the opening 11p2 may be aligned together on a side surface of the contact hole CH_p2.

In the first transfer terminal portion formation region, only the first insulating film 11' is etched because the lower connection portion 3p1 included in the gate metal layer 3 functions as an etch stop. As a result, in the first insulating layer 11, the opening 11p1 (the contact hole; CH_p1) that reaches the lower connection portion 3p1 is formed.

In the first source-CS connection portion formation region, the gate metal layer 3 is not included (i.e., a conductive portion formed of the gate metal layer 3 is not provided), and therefore, the first insulating film 11' and the gate insulating film 4' are etched together in a single etching step to form the contact hole CH_sc1. The contact hole CH_sc1 includes the opening 4sc1 that is formed in the gate insulating layer 4 and reaches the lower interconnect 7sc1, and the opening 11sc1 that is formed in the first insulating layer 11 and overlaps with the opening 4sc1. A side surface of the opening 4sc1 and a side surface of the opening 11sc1 may be aligned together on a side surface of the contact hole CH_sc1.

In the second source-CS connection portion formation region, the gate metal layer 3 is not included (i.e., a conductive portion formed of the gate metal layer 3 is not provided), and therefore, the first insulating film 11' and the gate insulating film 4' are etched together in a single etching step to form the contact hole CH_sc2. The contact hole CH_sc2 includes the opening 4sc2 that is formed in the gate insulating layer 4 and reaches the lower interconnect 7sc2, and the opening 11sc2 that is formed in the first insulating layer 11 and overlaps with the opening 4sc2. A side surface of the opening 4sc2 and a side surface; of the opening 11sc2 may be aligned together on a side surface of the contact hole CH_sc2.

Figure 34B:
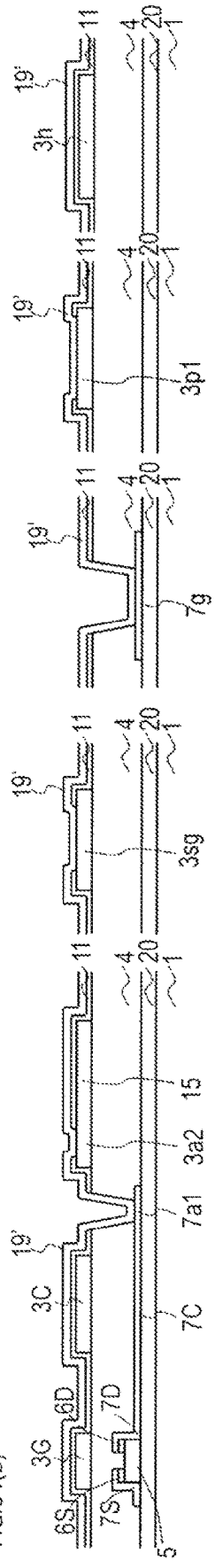
Figure 34C:
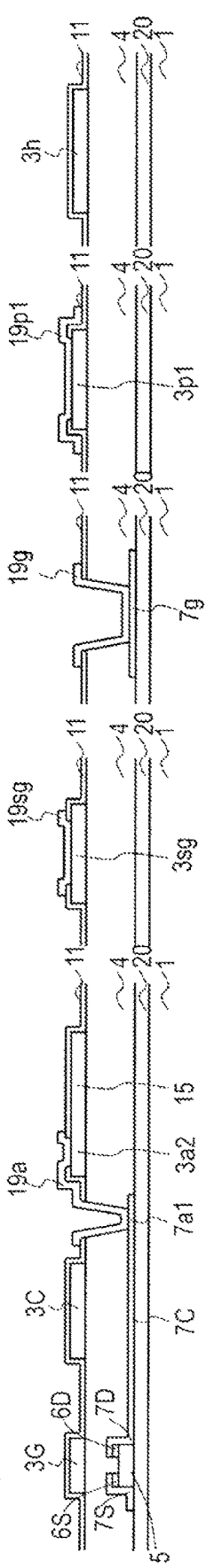

Next, as shown in FIG. 34(b), an upper conductive film 19' is formed on the first insulating layer 11 and in the contact holes CH_a1, CH_a2, CH_g, CH_s, CH_c, CH_p1, CH_p2, CH_sgA, CH_sgB, CH_sc1, and CH_sc2 by, for example, sputtering. The upper conductive film 19' includes, for example, a transparent conductive film. In this example, as the upper conductive film 19', for example, an ITO film having a thickness of 70 nm is used. Alternatively, as the upper conductive film 19', a layered film (ITO/Ti) in which Ti (thickness: 50 nm, for example) and ITO (thickness: 70 mm, for example) are layered in that order may be used. Next, as shown FIG. 34(c), the upper conductive film 19' is patterned to obtain the upper conductive layer 19.

Specifically, in the antenna element region U, the patch drain connection portion 19a is formed that is in contact with the connection portion 7a1 in the contact hole CH_a1 and in contact with the connection portion 3a2 in the contact hole CH_a2. In the gate terminal portion GT, the upper connection portion 19g is formed that is in contact with the lower connection portion 7g in the contact hole CH_g. In the source terminal portion ST, the upper connection portion 19s is formed that is in contact with the lower connection portion 7s in the contact hole CH_s. In the CS terminal portion CT, the upper connection portion 19c is formed that is in contact with the lower connection portion 7c in the contact hole CH_c. In the first transfer terminal portion PT1, the upper connection portion 19p1 is formed that is in contact with the lower connection portion 3p1 in the contact hole CH_p1. In the second transfer terminal portion PT2, the upper connection portion 19p2 is formed that is in contact with the lower connection portion 7p2 in the contact hole CH_p2. In the source-gate connection portion SG, the upper connection portion 19sg is formed that is in contact with the lower interconnect 7sgG in the contact hole CH_sgA, and in contact with the gate bus line connection portion 3sgG in the contact hole CH_sgB. In the first source-CS connection portion SC1, the upper connection portion 19sc1 is formed that is in contact with the lower interconnect 7sc1 in the contact hole CH_sc1. In the second source-CS connection portion SC2, the upper connection portion 19sc2 is formed that is in contact with the lower interconnect 7sc2 in the contact hole CH_sc2. In each terminal portion, the upper connection portion is preferably formed so as to cover a portion of the lower connection portion that is exposed through the contact hole. In the source-gate connection portion SG, the upper connection portion 19sg is preferably formed so as to cover a portion of the lower interconnect 7sgG that is exposed through the contact hole CH_sgA, and a portion of the gate bus line connection portion 3sgG that is exposed through the contact hole CH_sgB. In the first source-CS connection portion SC1 and the second source-CS connection portion SC2, the upper connection portion is preferably formed so as to cover a portion of the lower interconnect that is exposed through the contact hole.

Next, as shown in FIG. 35(a), a flattening film 21f' is formed substantially throughout the entire surface of the dielectric substrate 1. In this example, as the flattening film 21f', for example, an acrylic resin film having a thickness df (see FIG. 35(a)) of 1000 nm is formed. In this example, the flattening film 21f' is formed so as to have an upper surface higher than that of the patch electrode 15. The flattening film 21f' is formed so as to cover the first insulating layer 11 and the upper conductive layer 19.

Next, as shown in FIG. 35(b), the flattening film 21f' is patterned to form the flattening layer 21f. In this example, the flattening layer 21f is not formed in any of the terminal portion formation regions (the source terminal portion formation region, the gate terminal portion formation region, the CS terminal portion formation region, the first transfer terminal portion formation region, and the second transfer terminal portion formation region). In the antenna element formation region, the opening 21D overlapping with the patch electrode 15 and the opening 21Ds overlapping with the protruding portion 3h are formed. Because the opening 21D is provided, at least a portion of the patch electrode 15 does not overlap with the flattening layer 21f.

Thus, obtained are the antenna element region U, the gate terminal portion GT, the source terminal portion ST, the CS terminal portion CT, the first transfer terminal portion PT1, the second transfer terminal portion PT2, the source-gate connection portion SG, the first source-CS connection portion SC1, and the second source-CS connection portion SC2.

Thus, the TFT substrate 101D is manufactured.

(Example Arrangement Patterns of Antenna Elements, and Example Connections to Gate Bus Lines and Source Bus Lines)

In the scanned antenna of the embodiment of the present invention, the antenna elements are arranged in, for example, concentric circles.

In the case where the antenna elements are arranged in, for example, m concentric circles, a gate bus line is, for example, provided for each circle, i.e., a total of m gate bus lines are provided. In the case where the transmitting/receiving region R1 has an outer diameter of, for example, 800 mm, m is, for example, 200. When the gate bus lines are numbered with the innermost first, n (e.g., 30) antenna elements are connected to the first gate bus line, and nx (e.g., 620) antenna elements are connected to the $m^{th}$ gate bus line.

In such an arrangement pattern, different gate bus lines are connected to different numbers of antenna elements. Of the nx source bus lines connected to the nx antenna elements forming the outermost circle, the n source bus lines that are also connected to the antenna elements forming the innermost circle are each connected to m antenna elements. The other source bus lines are each connected to less than m antenna elements.

Thus, the arrangement pattern of antenna elements in a scanned antenna is different from that of pixels (dots) in an LCD panel, and therefore, different gate bus lines and/or source bus lines are connected to different numbers of antenna elements. Therefore, if all antenna elements have the same capacitance (liquid crystal capacitance+storage capacitance), different gate bus lines and/or source bus lines are connected to different electrical loads. In this case, a problem occurs that a written voltage varies from antenna element to antenna element.

To address this problem, it is, for example, preferable that the capacitance value of each storage capacitor, or the number of antenna elements connected to each gate bus line and/or source bus line, should be adjusted such that the gate bus lines and the source bus lines are connected to substantially the same electrical load.

The scanned antenna of the embodiment of the present invention is optionally housed in, for example, a plastic casing. The casing is preferably formed of a material having a small dielectric constant $\varepsilon_M$ that does not affect the transmission or reception of microwaves. A through-hole may be provided at a portion of the casing that corresponds to the transmitting/receiving region R1. A light-blocking structure may be provided in order to prevent or reduce the exposure of the liquid crystal material to light. For example, the light-blocking structure is provided so as to block light that would otherwise enter through a side surface of the dielectric substrate 1 of the TFT substrate 101A and/or a side surface of the dielectric substrate 51 of the slot substrate 201, transmit therethrough, and enter liquid crystal layer. Some liquid crystal materials that have a high dielectric anisotropy $\Delta\varepsilon_M$ are easily deteriorated by light, and therefore, it is preferable to block not only ultraviolet light but also blue light, which is a type of visible light having a short wavelength. The light-blocking structure can, for example, be easily provided, at a portion where light should be blocked, by utilizing a light-blocking tape, such as a black adhesive tape.

The embodiment of the present invention is useful for scanned antennas for satellite communication and satellite broadcasting that are mounted on, for example, mobile bodies (e.g., ships, aircrafts, and automobiles), and manufacture thereof.

This application is based on Japanese Patent Application No. 2017-186095 filed on Sep. 27, 2017, the entire contents of which are hereby incorporated by reference.

What is claimed is:

1. A TFT (thin film transistor) substrate comprising:
   a dielectric substrate;
   a plurality of antenna element regions provided on the dielectric substrate, each antenna element region including a TFT and a patch electrode electrically connected to a drain electrode of the TFT, the TFT including a gate electrode, a semiconductor layer, a gate insulating layer located between the gate electrode and the semiconductor layer, and a source electrode and the drain electrode electrically connected to the semiconductor layer; and a flattening layer provided over the dielectric substrate, located above a layer including the patch electrode, and formed of a resin, wherein the flattening layer does not overlap with at least a portion of the patch electrode as viewed in a direction normal to the dielectric substrate.

2. The TFT substrate of claim 1, wherein an upper surface of the flattening layer is lower than or as high as an upper surface of the patch electrode.

3. The TFT substrate of claim 1, wherein the flattening layer does not overlap with the patch electrode as viewed in a direction normal to the dielectric substrate.

4. The TFT substrate of claim 1, wherein the patch electrode has a thickness of 2000 nm or less.

5. The TFT substrate of claim 1, wherein an upper surface of the flattening layer is higher than an upper surface of the patch electrode.

6. The TFT substrate of claim 1, wherein the flattening layer has an opening in each of the plurality of antenna element regions, the opening overlapping with at least a portion of the patch electrode as viewed in a direction normal to the dielectric substrate.

7. The TFT substrate of claim 6, wherein the opening has a side surface having a taper angle of 70° or less.

8. The TFT substrate of claim 6, wherein the opening has a circular or elliptical shape as viewed from above.

9. A scanned antenna comprising:
the TFT substrate of claim 1;
a slot substrate disposed so as to oppose the TFT substrate;
a liquid crystal layer provided between the TFT substrate and the slot substrate; and
a reflective conductive plate disposed so as to oppose an opposite surface of the slot substrate from the liquid crystal layer with a dielectric layer interposed between the reflective conductive plate and the slot substrate,
wherein the TFT substrate includes a first alignment film that is in contact with the flattening layer and the liquid crystal layer,
the slot substrate includes an additional dielectric substrate, a slot electrode provided on a surface of the additional dielectric substrate closer to the liquid crystal layer, and a second alignment film that covers the slot electrode and is in contact with the liquid crystal layer, and
the slot electrode includes a plurality of slots, and each of the plurality of slots is disposed, corresponding to the patch electrode of the TFT substrate in the corresponding one of the plurality of antenna element regions.

10. The scanned antenna of claim 9, wherein a difference in height between an upper surface of the flattening layer and an upper surface of the patch electrode is 23% or less of a thickness of the liquid crystal layer between the patch electrode and the slot electrode.

11. The scanned antenna of claim 9, wherein the flattening layer does not overlap with the patch electrode or the plurality of slots as viewed in a direction normal to the dielectric substrate.

12. The scanned antenna of claim 9, wherein one of the TFT substrate or the slot substrate further includes a plurality of columnar spacers.

13. The scanned antenna of claim 12, wherein the flattening layer does not overlap with the plurality of columnar spacers as viewed in a direction normal to the dielectric substrate.

14. The scanned antenna of claim 12, wherein the flattening layer overlaps with the plurality of columnar spacers as viewed in a direction normal to the dielectric substrate.

15. The scanned antenna of claim 12, wherein the TFT substrate includes protruding portions overlapping with corresponding ones of the plurality of columnar spacers as viewed in a direction normal to the dielectric substrate.

16. The scanned antenna of claim 15, wherein the protruding portion includes a metal layer.

17. The scanned antenna of claim 15, wherein the protruding portion and the patch electrode are formed of the same layer.

18. A TFT (thin film transistor) substrate comprising:
a dielectric substrate;
a plurality of antenna element regions provided on the dielectric substrate, each antenna element region including a TFT and a patch electrode electrically connected to a drain electrode of the TFT; and
a flattening layer provided over the dielectric substrate, located above a layer including the patch electrode, and formed of a resin,
wherein a difference in height between an upper surface of the flattening layer and an upper surface of the patch electrode is 500 nm or less.

* * * * *